(12) United States Patent
Kurihara et al.

(10) Patent No.: US 7,741,559 B2
(45) Date of Patent: Jun. 22, 2010

(54) PHOTOELECTRIC CONVERSION ELEMENT

(75) Inventors: Masaaki Kurihara, Numazu (JP); Nobuhiro Okada, Fuji (JP)

(73) Assignee: Asahi Kasei Kabushiki Kaisha, Osaka-shi (JP)

( * ) Notice: Subject to any disclaimer, the term of this patent is extended or adjusted under 35 U.S.C. 154(b) by 862 days.

(21) Appl. No.: 10/556,339

(22) PCT Filed: May 13, 2004

(86) PCT No.: PCT/JP2004/006759

§ 371 (c)(1),
(2), (4) Date: Nov. 10, 2005

(87) PCT Pub. No.: WO2004/102724

PCT Pub. Date: Nov. 25, 2004

(65) Prior Publication Data

US 2006/0237059 A1 Oct. 26, 2006

(30) Foreign Application Priority Data

May 13, 2003 (JP) .............................. 2003-134923
May 13, 2003 (JP) .............................. 2003-134970

(51) Int. Cl.
*H01L 31/00* (2006.01)
(52) U.S. Cl. ...................................................... 136/263
(58) Field of Classification Search .................. 136/263
See application file for complete search history.

(56) References Cited

U.S. PATENT DOCUMENTS 6,245,988 B1 6/2001 Gratzel et al.

2002/0040728 A1 * 4/2002 Yoshikawa ................... 136/263
2003/0013008 A1 * 1/2003 Ono ............................. 429/111

FOREIGN PATENT DOCUMENTS

EP 1052661 A2 11/2000

(Continued)

OTHER PUBLICATIONS

Curtis et al. Solvent-Induced and Polyether-Ligand-Induced Redox Isomerization within an Asymmetrically Coordinated Mixed-Valence Ion: trans-(py)(NH3)4Ru(4-NCpy)Ru(2,2'-bpy)2Cl4+; American Chemical Society, 1991, pp. 3856-3860.*

(Continued)

*Primary Examiner*—Jennifer K Michener
*Assistant Examiner*—Dustin Q Dam
(74) *Attorney, Agent, or Firm*—Birch, Stewart, Kolasch & Birch, LLP

(57) ABSTRACT

A photoelectric conversion element having a composite dye and an n-type semiconductor, the composite dye having a plurality of component dyes which have different excitation levels and which are chemically bonded to each other to form a straight chain or branched structure for transferring an electron therethrough, wherein the straight chain or branched structure is, at one end thereof, secured to the n-type semiconductor and has, at least at one other end thereof, a free end, wherein, in the straight chain or branched structure, the plurality of component dyes are arranged in an order such that the excitation levels of the plurality of component dyes are decreased as viewed from the one end of the structure toward the at least one other end of the structure.

5 Claims, 18 Drawing Sheets

FOREIGN PATENT DOCUMENTS

| | | | |
|---|---|---|---|
| EP | 1052661 A2 | * | 11/2000 |
| JP | 2000-195569 A | | 7/2000 |
| JP | 2001-210857 A | | 8/2001 |
| JP | 2002-343455 A | | 11/2002 |

OTHER PUBLICATIONS

"CRC" CRC Handbook of Chemistry and Physics (88th edition, Section 8-20 to 8-29, Table 1).*
O'Regan et al., Nature, vol. 353, pp. 737-740, (1991).
Cumpston et al., Nature, vol. 398, pp. 51-54, (1999).
Albota et al., Science, vol. 281, pp. 1653-1656, (1998).
Renouard et al., Inorganic Chemistry, vol. 41, No. 2, pp. 367-378, (2002).
Hara et al., J. Phys. Chem. B, vol. 107, pp. 597-606, (2003).
He et al., Solar Energy Materials & Solar Cells, vol. 62, pp. 265-273, (2000).
Ma et al., Recent Advances in Research and Development for Dye-Sensitized Solar Cells, Chapter 15, pp. 169-175, (2001).
Takahashi et al., Recent Advances in Research and Development for Dye-Sensitized Solar Cells, Chapter 10, Section 3, pp. 112-119, (2001).
Takahashi et al., Chemical Society of Japan, Lecture No. 4 E7 30, p. 351, (2001).

* cited by examiner

PHOTOELECTRIC CONVERSION ELEMENT

BACKGROUND OF THE INVENTION

1. Field of the Invention

The present invention relates to a photoelectric conversion element. More particularly, the present invention is concerned with a photoelectric conversion element comprising a composite dye and an n-type semiconductor, the composite dye comprising a plurality of component dyes which have different excitation levels and which are chemically bonded to each other to form a straight chain or branched structure for transferring an electron therethrough, wherein the straight chain or branched structure is, at one end thereof, secured to the n-type semiconductor and has, at least at one other end thereof, a free end, and wherein the plurality of component dyes are arranged in an order such that the excitation levels of the plurality of component dyes are decreased as viewed from the one end of the structure toward the at least one other end of the structure. The photoelectric conversion element of the present invention exhibits excellent photoelectric conversion properties, especially high efficiency in converting solar energy to electric energy (i.e., high energy conversion efficiency), and a dye-sensitized solar battery can be easily produced therefrom. Therefore, the photoelectric conversion element of the present invention can be advantageously used for a dye-sensitized solar battery and the like.

The present invention is also concerned with a dye-sensitized solar battery using the photoelectric conversion element.

2. Prior Art

Consumption of energy is indispensable to civilized society. Most of the energy which is consumed by civilized society is derived from fossil fuels, in which sunray energy has been accumulated over many years. In recent years, the problem that the amount of fossil fuels available is being reduced and the problem that the burning of fossil fuels causes global warming have arisen, and there is an increasing fear that these problems will be obstacles to the sustainable development of human society.

For solving the above-mentioned problems, various studies have been made to directly utilize sunray energy. Among these studies, the studies on solar batteries have been vigorously made, because solar batteries exhibit high efficiency in converting solar energy to electric energy (i.e., high energy conversion efficiency). Among the solar batteries, special attention has been paid to a dye-sensitized solar battery, which uses a photosensitizer, such as a dye, and which is capable of efficiently taking out electrons from the photosensitizer by the irradiation of the photosensitizer with sunray. Specifically, since Michael Gratzel et al. reported a system which uses a dye-sensitized solar battery having an energy conversion efficiency of more than 7% (see Nature 1991, 353, 737), a dye-sensitized solar battery has drawn special attention as the next-generation solar battery which can be produced at a low cost without use of a complicated method.

In general, a dye-sensitized solar battery has the following structure. A substrate (electroconductive support) is laminated on a support made of glass, a polymer or the like, wherein the substrate has coated thereon an indium oxide membrane (e.g., an ITO (indium tin oxide) membrane) or fluorine-doped tin oxide (FTO) membrane having excellent conductivity and excellent transparency. On the substrate is laminated a porous titanium oxide membrane, as an n-type semiconductor, which is a cheap material and has a size of several tens of nanometers, thereby forming a laminate as a photo-anode. A thin layer of platinum is laminated on a substrate which is substantially the same as the above-mentioned substrate, thereby forming a laminate as a cathode. Between the photo-anode and the cathode is interposed an electrolytic solution containing a redox couple, such as iodine, thereby forming a structure in which a photo-anode and a cathode face each other through an electrolytic solution. In this structure, the photo-anode has carried thereon a dye (such as a complex dye) as a photosensitizer for the purpose of absorbing visible light from sunray to thereby generate excited electrons from the photosensitizer, so that the photo-anode functions as a photoelectric conversion element.

The excited electrons generated from the photosensitizer are transferred to the n-type semiconductor, and further transferred to the cathode through a conductor which connects the photo-anode and cathode. The excited electrons having been transferred to the cathode reduce the electrolytic solution and, in turn, the electrolytic solution reduces the photosensitizer having been oxidized by the emission of electrons from the photosensitizer. By repeating the above-mentioned series of operations, the dye-sensitized solar battery works.

A photosensitizer, such as a dye, can absorb light having wavelengths within a certain range. When the photosensitizer is irradiated with such light having wavelengths within the range, the photosensitizer receives the energy of photons. As a result, electrons in the ground state, contained in the photosensitizer, are excited and transferred to excited states. In general, excited electrons emit energy in the form of heat or light, such as fluorescence or phosphorescence, and return to the ground state. However, when electrons in the photosensitizer are excited, conversion of light energy to electric energy (i.e., photoelectric conversion) is done by taking out the excited electrons from the photosensitizer.

As seen from the above, a photosensitizer plays an important part in the conversion of light energy to electric energy. Therefore, studies on photosensitizers have been vigorously made.

When the function of a photosensitizer is discussed in terms of molecules, the photosensitizer generally receives one photon to excite one electron contained therein. The longer the wavelength of a light, the smaller the energy of the light. It follows from this that a photosensitizer which absorbs a long-wavelength light to excite electrons contained therein (i.e., make electrons contained therein transferred to excited states) can excite electrons contained therein by absorbing a low energy light. Therefore, the photosensitizer can absorb a wide range of light, which ranges from a long-wavelength light to a short-wavelength light, which has a large energy. In the application of a solar battery, for taking out a number of electrons (i.e., obtaining a high electric current), it is important to effectively utilize a wide range of light contained in sunray, which has a wide distribution of light wavelengths. In view of this, various attempts have been made to develop a photosensitizer capable of absorbing longer wavelength light from sunray.

For this purpose, i.e., for obtaining a photosensitizer capable of absorbing longer wavelength light from sunray, it is generally attempted to enlarge a conjugate structure. For example, Japanese Patent Application Prior-to-Examination Publication (Tokuhyo) No. 2002-512729 (corresponding to WO98/50393 and U.S. Pat. No. 6,245,988) discloses a technique in which a single nuclear complex dye having a tridentate ligand is used. On the other hand, Inorg. Chem. 2002, 41, 367 discloses a technique in which a single nuclear complex dye having a quadridentate ligand is used. Further, J. Phys. Chem. B 2003, 107, 597 discloses a technique in which an organic dye having a conjugate structure is used.

Moreover, for obtaining a photosensitizer capable of absorbing longer wavelength light from sunray, a technique using a multinuclear complex having a plurality of metals is disclosed in Unexamined Japanese Patent Application Laid-Open Specification No. 2000-323191 (corresponding to EP1052661). Also, for using a plurality of dyes in combination, a technique in which a plurality of dye layers are laminated is disclosed in Unexamined Japanese Patent Application Laid-Open Specification No. 2000-195569, and a technique in which a plurality of dyes are associated with each other is disclosed in Unexamined Japanese Patent Application Laid-Open Specification No. 2002-343455.

However, the above-mentioned techniques, i.e., the techniques in which a single dye is used for absorbing longer wavelength light from sunray, and the techniques in which a plurality of dyes are used in combination (wherein the dyes receive excited electrons having the same energy level from the electrolyte and transfer the excited electrons to the n-type semiconductor), have a theoretical limit on the energy conversion efficiency when electrons are taken out from sunray having a wide distribution of wavelengths. The reason for this is as follows. As a dye absorbs light having longer wavelengths from sunray, the number of electrons taken out from the dye is increased, so that a larger electric current can be obtained. However, light having a long wavelength has a small energy, so that the energy which can be used for transferring an electron to an excited state is inevitably small. Therefore, a high voltage cannot be obtained.

As mentioned above, in the case of a general photosensitizer, the energy of only one photon is used for exciting a single electron (one-photon absorption). However, in the case of a photosensitizer comprising a specific compound, the energies of two photons can be used for exciting a single electron (two-photon absorption) (see Science 1998, 281, 1653). In such case, it becomes possible to transfer an electron to a high energy level by using only low-energy light having long wavelengths and, hence, the above-mentioned theoretical limit can be overcome. The technique of the two-photon absorption is a technique in which an electron having been excited in a molecule is further excited in the molecule. An electron in an excited state returns to the ground state in a short period of time. Therefore, in the technique of the two-photon absorption, generally, the electron is transferred to a quasi-stable excited state (such as a triplet state) so that the life time of the excited electron (i.e., excitation lifetime) becomes longer, thereby assuring a time sufficient for causing a second excitation of the electron. However, even in the technique of the two-photon absorption, it is necessary for a single molecule to absorb light twice in a short period of time and, hence, the probability that the second excitation of the electron occurs is small, so that it is difficult to take out a number of electrons from the photosensitizer. Therefore, it is difficult to apply the two-photon absorption technique to fields (such as the field of solar batteries) in which it is necessary to take out a number of electrons. Thus, the fields to which it is attempted to apply the two-photon absorption technique are limited to the field of polymerization initiators (see Nature 1999, 398, 51) and the field of photosensors (see Unexamined Japanese Patent Application Laid-Open Specification No. 2001-210857).

In addition, as a technique for efficiently taking out solar energy, J. He et al. propose a technique in which two electrodes facing each other are respectively provided with n-type and p-type semiconductor layers, wherein the semiconductor layers are respectively sensitized by dyes having different excitation levels (see Solar Energy Materials & Solar Cells 2000, 62, 265). However, this technique has a problem in that each of the provision of a semiconductor layer and the adsorption of a dye must be performed a plurality of times, thereby rendering combersome the production of a system used in the technique.

SUMMARY OF THE INVENTION

In this situation, the present inventors have made extensive and intensive studies with a view toward developing a photoelectric conversion element which exhibits excellent photoelectric conversion properties, especially high efficiency in converting solar energy to electric energy (i.e., high energy conversion efficiency) and from which a dye-sensitized solar battery can be easily produced. As a result, it has unexpectedly been found that such a photoelectric conversion element is realized by a photoelectric conversion element comprising a composite dye and an n-type semiconductor, the composite dye comprising a plurality of component dyes which have different excitation levels and which are chemically bonded to each other to form a straight chain or branched structure for transferring an electron therethrough, wherein the straight chain or branched structure is, at one end thereof, secured to the n-type semiconductor and has, at least at one other end thereof, a free end, and wherein the plurality of component dyes are arranged in an order such that the excitation levels of the plurality of component dyes are decreased as viewed from the one end (secured to the n-type semiconductor) of the structure toward the at least one other end of the structure. Based on this finding, the present invention has been completed.

Accordingly, it is an object of the present invention to provide a photoelectric conversion element which exhibits high efficiency in converting solar energy to electric energy (i.e., high energy conversion efficiency) and from which a dye-sensitized solar battery can be easily produced.

It is another object of the present invention to provide a dye-sensitized solar battery using the photoelectric conversion element. In this solar battery, as the electrolyte, an electrolyte having an appropriate redox potential is used for adjusting the potential of the counter electrode, so that a very high voltage can be obtained.

The foregoing and other objects, features and advantages of the present invention will be apparent from the following detailed description taken in connection with the accompanying drawings and appended claims.

DETAILED DESCRIPTION OF THE INVENTION

Figure 1:
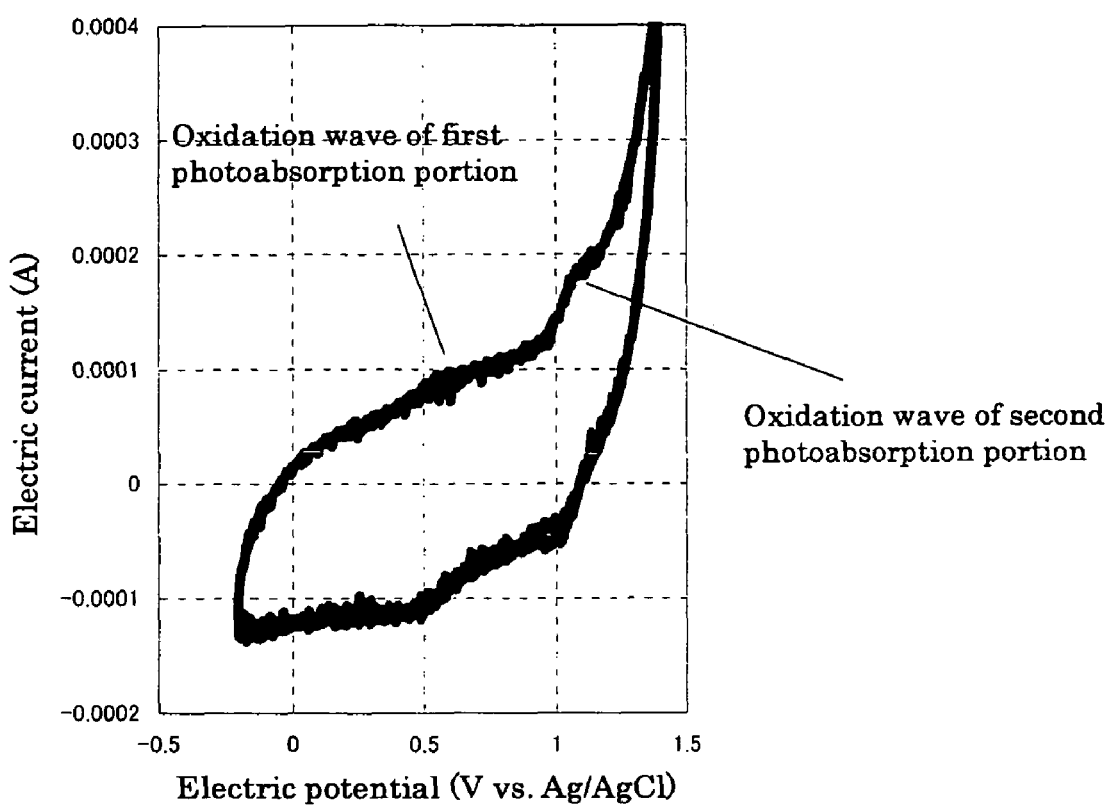
FIG. 1 shows an example of the results of the cyclic voltammetry performed with respect to a composite dye used in the present invention.

According to the present invention, there is provided a photoelectric conversion element comprising a composite dye and an n-type semiconductor, the composite dye comprising a plurality of component dyes which have different excitation levels and which are chemically bonded to each other to form a straight chain or branched structure for transferring an electron therethrough, wherein the straight chain or branched structure is, at one end thereof, secured to the n-type semiconductor and has, at least at one other end thereof, a free end, wherein, in the straight chain or branched structure, the plurality of component dyes are arranged in an order such that the excitation levels of the plurality of component dyes are decreased as viewed from the one end (secured to the n-type semiconductor) of the structure toward the at least one other end of the structure.

For easier understanding of the present invention, the essential features and various preferred embodiments of the present invention are enumerated below.

1. A photoelectric conversion element comprising a composite dye and an n-type semiconductor, the composite dye comprising a plurality of component dyes which have different excitation levels and which are chemically bonded to each other to form a straight chain or branched structure for transferring an electron therethrough, wherein the straight chain or branched structure is, at one end thereof, secured to the n-type semiconductor and has, at least at one other end thereof, a free end, wherein, in the straight chain or branched structure, the plurality of component dyes are arranged in an order such that the excitation levels of the plurality of component dyes are decreased as viewed from the one end of the structure toward the at least one other end of the structure.

2. The photoelectric conversion element according to item 1 above, wherein each component dye of the composite dye comprises a metal atom having a ligand coordinated thereto, so that the composite dye is comprised of a multinuclear complex comprising a plurality of metal atoms and a plurality of ligands including at least one bridging ligand, wherein the or each bridging ligand is positioned between mutually adjacent metal atoms in the multinuclear complex to thereby bridge the mutually adjacent metal atoms.

3. The photoelectric conversion element according to item 2 above, wherein the or each bridging ligand in the multinuclear complex has an asymmetric structure.

4. The photoelectric conversion element according to item 3 above, wherein the or each bridging ligand in the multinuclear complex comprises a heterocyclic segment having a conjugated double bond and, bonded to the heterocyclic segment, a non-heterocyclic segment, to thereby form the asymmetric structure, wherein the heterocyclic segment is positioned in the or each bridging ligand on a side thereof remote from the n-type semiconductor as compared to the non-heterocyclic segment, wherein a heteroatom in the heterocyclic segment is positioned on a side thereof remote from the n-type semiconductor.

5. A dye-sensitized solar battery comprising:

an electrode comprised of the photoelectric conversion element of any one of items 1 to 4 above, a counter electrode, and an electrolyte interposed between the photoelectric conversion element and the counter electrode, wherein the dye-sensitized solar battery becomes operable when the electrode comprised of the photoelectric conversion element and the counter electrode are connected to each other through an electroconductive material which is positioned outside of the electrolyte.

6. The dye-sensitized solar battery according to item 5 above, wherein the counter electrode exhibits a potential of −0.2 V or more relative to the redox potential of silver/silver ion.

Hereinbelow, the present invention is described in detail.

The photoelectric conversion element of the present invention comprises a composite dye and an n-type semiconductor.

The composite dye comprises a plurality of component dyes which have different excitation levels and which are chemically bonded to each other to form a straight chain or branched structure for transferring an electron therethrough, wherein the straight chain or branched structure is, at one end thereof, secured to the n-type semiconductor and has, at least at one other end thereof, a free end. In the straight chain or branched structure, the plurality of component dyes are arranged in an order such that the excitation levels of the plurality of component dyes are decreased as viewed from the one end of the structure toward the free end (i.e., the at least one other end) of the structure.

In the present invention, the term "excitation level" means the orbital level (of a ground state) at which the dye (component dye or composite dye) absorbs light having a wavelength equal to or higher than that of visible light to thereby get strongly excited. In general, the orbital level of such ground state is the highest occupied molecular orbital (HOMO). So long as the transition of an electron from the highest occupied molecular orbital can be observed, the highest occupied molecular orbital is regarded as the excitation level. In the present invention, in which a plurality of component dyes are chemically bonded to each other to form a composite dye, the excitation level of a component dye means the orbital level (of a ground state) at which the component dye absorbs light having a wavelength within the range equal to or higher than that of visible light to thereby get strongly excited when the component dye is present alone without forming a composite dye by the chemical bonding thereof to another component dye.

In the present invention, the expression "the component dyes have different excitation levels" means that the difference between the excitation levels of any two component dyes is 0.05 eV or more. It is preferred that the difference between the excitation levels of any two component dyes is 0.1 eV or more, more advantageously 0.2 eV or more, most advantageously 0.4 eV or more. With respect to the upper limit of the difference between the excitation levels of two component dyes, there is no particular limitation. However, when the difference between the excitation levels of two component dyes is large, it is impossible to introduce an excited electron to the n-type semiconductor by the use of visible light. Therefore, it is preferred that the difference between the excitation levels of any two component dyes is 3 eV or less, more advantageously 2.5 eV or less, most advantageously 2 eV or less.

In the present invention, the expression "the excitation level is low" means that the energy level is in a stable state, and that the value of the electric potential, as measured by the below-mentioned electrochemical method, is large.

In the present invention, the excitation levels of the component dyes are measured and the decreasing or increasing order thereof is found by electrochemical methods, such as cyclic voltammetry. With respect to cyclic voltammetry, reference is made to Allen J. Bard et al., "Electrochemical Methods: Fundamentals and Applications", John Wiley & Sons, 1980. Specifically, cyclic voltammetry is performed as follows. The oxidation potential of each component dye (photoabsorption portion) (or a derivative or precursor thereof) is individually measured by cyclic voltammetry. From the found value of the oxidation potential of the component dye (photoabsorption portion), the excitation level of the component dye (photoabsorption portion) is found, wherein the results of the cyclic voltammetry performed with respect to the composite dye are taken into consideration. In the measurements by cyclic voltammetry, the same electrode, the same solvent and the same voltage scanning rate are used. However, when it is impossible to use the same solvent in view of the solubility of the component dyes, the decreasing or increasing order of the excitation level of the component dyes can be determined as follows. A specific component dye (or a derivative or precursor thereof) is chosen, and the oxidation potential thereof is measured using various solvents. The oxidation potential of the component dye varies depending on the type of the solvent used. From the difference in the oxidation potential due to the type of the solvent, the oxidation potentials of the remainder of the component dyes can be calculated. In some cases, it is possible that the excitation level of a component dye in the composite dye is shifted as compared to the excitation level of the component dye prior to forming a chemical bond with another component dye. In such a case, the shift of the excitation level of the component dye can be found, based on the changes in the ultraviolet/visible spectra of component dyes (or derivatives or precursors thereof) and of the composite dye.

When it is difficult to determine the decreasing or increasing order of the excitation levels of the component dyes by cyclic voltammetry, the decreasing or increasing order of the excitation levels of the component dyes can be determined by calculating the highest occupied molecular orbital (HOMO) by a computational chemistry method based on a theory, such as the density functional theory (DFT). When this method is used, it is necessary to choose a technique in which, with respect to conventional compounds, the ionization potentials thereof and the decreasing or increasing order of the highest occupied molecular orbitals thereof can be correctly calculated. For example, when each of the component dyes (or derivatives or precursors thereof) or the composite dye is a complex, the calculation can be performed by effectively using a hybrid type functional, such as B3LYP or PBE1PBE.

When, for the determination of the decreasing or increasing order of the excitation levels of the component dyes, it is necessary to take into consideration the change of the wavelengths of light absorbed by the component dyes, it is preferred to use a computational chemistry method based on the time dependent density functional theory (TDDFT). Also in this case, it is necessary to choose a technique in which, with respect to conventional compounds, the wavelengths of light absorbed thereby or the decreasing or increasing order thereof can be correctly calculated.

In some cases, if desired, there can be chosen a method in which the decreasing or increasing order of the excitation levels of the component dyes is determined using an ionization potential measuring apparatus.

FIG. 1 shows an example of the results of cyclic voltammetry. Specifically, FIG. 1 shows the results of cyclic voltammetry performed with respect to the composite dye produced in Example 2. As seen from FIG. 1, oxidation waves are observed in different levels. This means that the component dyes in the composite dye produced in Example 2 have different excitation levels.

In the present invention, the term "component dye" means a compound which is dyed by the absorption of visible light. Examples of component dyes include organic dyes and complex dyes. Examples of organic dyes include compounds which can be obtained as commercially available dyes, such as a cyanine dye, a cumarin dye, a spiropyran dye, an azo dye and a xanthene dye, and derivatives of the compounds. The term "complex dye" means a compound comprised of at least one metal atom and at least one ligand, which is dyed by the absorption of visible light. In the present invention, a plurality of component dyes are chemically bonded to form a composite dye.

In the present invention, the expression "chemically bonded" means "bonded by a chemical bond, such as a covalent bond, an ionic bond or a coordinate bond". The presence of a chemical bond can be confirmed by, for example, a method in which a chemical bond is confirmed by any of the below-mentioned measurements, or a method in which the solvent for a component dye (a photoabsorption portion or component dye precursor) which is not chemically bonded to another component dye is used for washing the composite dye to confirm that the composite dye is not dissolved in the solvent.

As mentioned above, the composite dye forms a straight chain or branched structure for transferring an electron therethrough. The structure is, at one end thereof, secured to the n-type semiconductor and has, at least at one other end thereof, a free end.

With respect to the above-mentioned structure, the expression "secured to the n-type semiconductor" means that the structure is not detached from the n-type semiconductor and that the transfer of an electron from the structure to the n-type semiconductor is possible. Examples of modes in which the structure is secured to the n-type semiconductor include a mode in which the structure is, at one end thereof, physically adsorbed on the n-type semiconductor, a mode in which the structure is, at one end thereof, chemically adsorbed on the n-type semiconductor, and a mode in which the structure is, at one end thereof, chemically bonded to the n-type semiconductor. Examples of such chemical bonds include an ester linkage, a phosphoric ester linkage, a coordinate bond and an ionic bond.

In the photoelectric conversion element of the present invention, the component dyes are arranged in an order such that the excitation levels of the component dyes are decreased as viewed from the end secured to the n-type semiconductor toward the free end. By virtue of the arrangement of the component dyes in the above-mentioned order, high energy conversion efficiency can be achieved. The reason for this is as follows.

Figure 2:
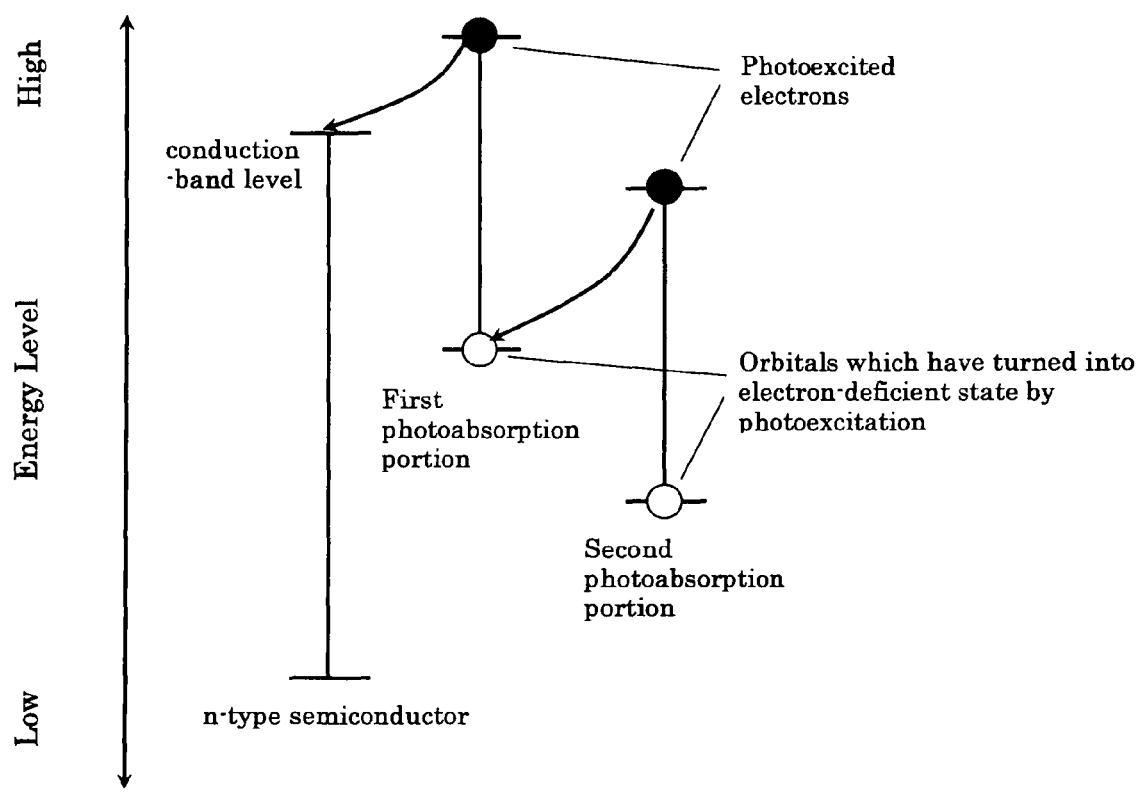
FIG. 2 shows a diagrammatic view explaining the electron transfer achieved by the use of the photoelectric conversion element of the present invention and the resulting shift of the electron-deficient orbital from a photoabsorption portion having a higher energy level to a photoabsorption portion having a lower energy level.
Figure 3:
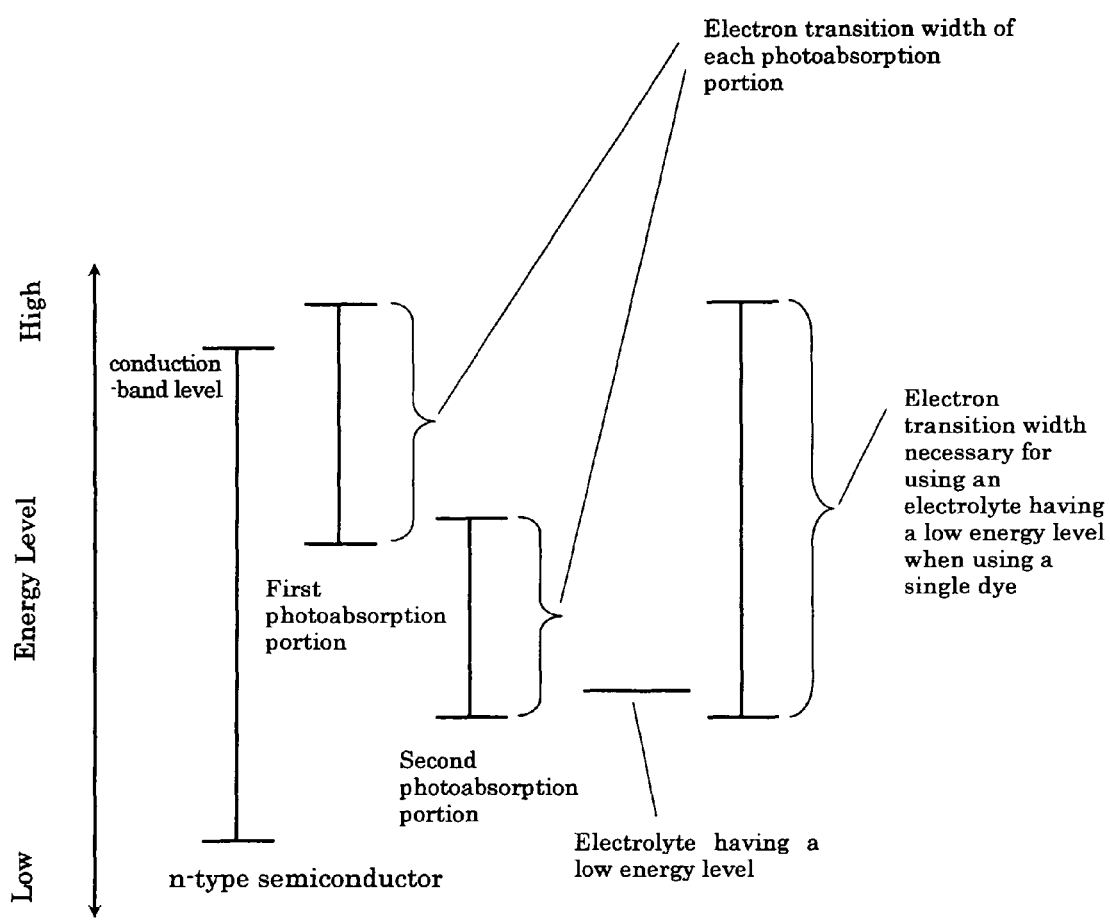
FIG. 3 shows a diagrammatic view explaining the compatibility of absorption of long-wavelength lights with high voltage, which is achieved by the use of the photoelectric conversion element or dye-sensitized solar battery of the present invention.

When the composite dye is irradiated with light rays, electrons in the composite dye are excited. The excited electron in the component dye which is secured to the n-type semiconductor (hereinafter, this component dye is frequently referred to as "first photoabsorption portion") can be easily transferred to the n-type semiconductor. As a result, the first photoabsorption portion turns into an electron-deficient state. When a component dye which is adjacently bonded to a component dye in an electron-deficient state gets excited, an electron in the excited component dye can be easily transferred to the electron-deficient orbital in the component dye in an electron-deficient state. Thus, the electron-deficient state shifts from the component dye secured to the n-type semiconductor (i.e., first photoabsorption portion) to a component dye which is chemically bonded to the component dye secured to the n-type semiconductor (hereinafter, the component dye which is adjacently bonded to the first photoabsorption portion is frequently referred to as "second photoabsorption portion", and the component dye which is adjacently bonded to the second photoabsorption portion is referred to as "third photoabsorption portion", and the component dye bonded to the third absorption portion is referred to as "fourth photoabsorption portion", and so on). The first photoabsorption portion has the highest excitation level, and the excitation level becomes lower in the order of the first photoabsorption portion, the second photoabsorption portion, the third photoabsorption portion, and so on (that is, the more distant from the n-type semiconductor the photoabsorption portion, the lower the excitation level thereof). Therefore, it becomes possible to successively shift the electron-deficient orbital from a photoabsorption portion having a higher energy level to a photoabsorption portion having a lower energy level (this is diagrammatically indicated in FIG. 2). In general, when the excitation level of a component dye is lowered without changing the energy level of the unoccupied orbital of the component dye, the electron transition width becomes broad, so that the component dye absorbs only light having a short wavelength. However, when the above-mentioned composite dye is used, by virtue of the above-mentioned mechanism, it becomes possible to absorb light having a long wavelength as well as light having a short wavelength, so that a broad electron transition range can be achieved. Therefore, by using a photoelectric conversion element comprised of the above-mentioned composite dye and an n-type semiconductor, there can be obtained a high performance dye-sensitized solar battery having the capability of absorbing light having a long wavelength and exhibiting a high voltage, wherein electricity can be generated by using an electrolyte having a low energy level, while maintaining the properties of absorbing visible light and, if desired, long-wavelength light, such as near-infrared light (this is diagrammatically indicated in FIG. 3). The composite dye used in the present invention comprises a plurality of component dyes which are chemically bonded to each other, so that the above-mentioned transfer of excited electrons occurs with a high probability. It is especially preferred that the composite dye has an asymmetric structure, so that excited electrons are easily transferred from the component dye at a free end of the composite dye to the component dye at the secured end of the composite dye. In such a case, the above-mentioned transfer of excited electrons occurs with a higher probability.

Figure 4:
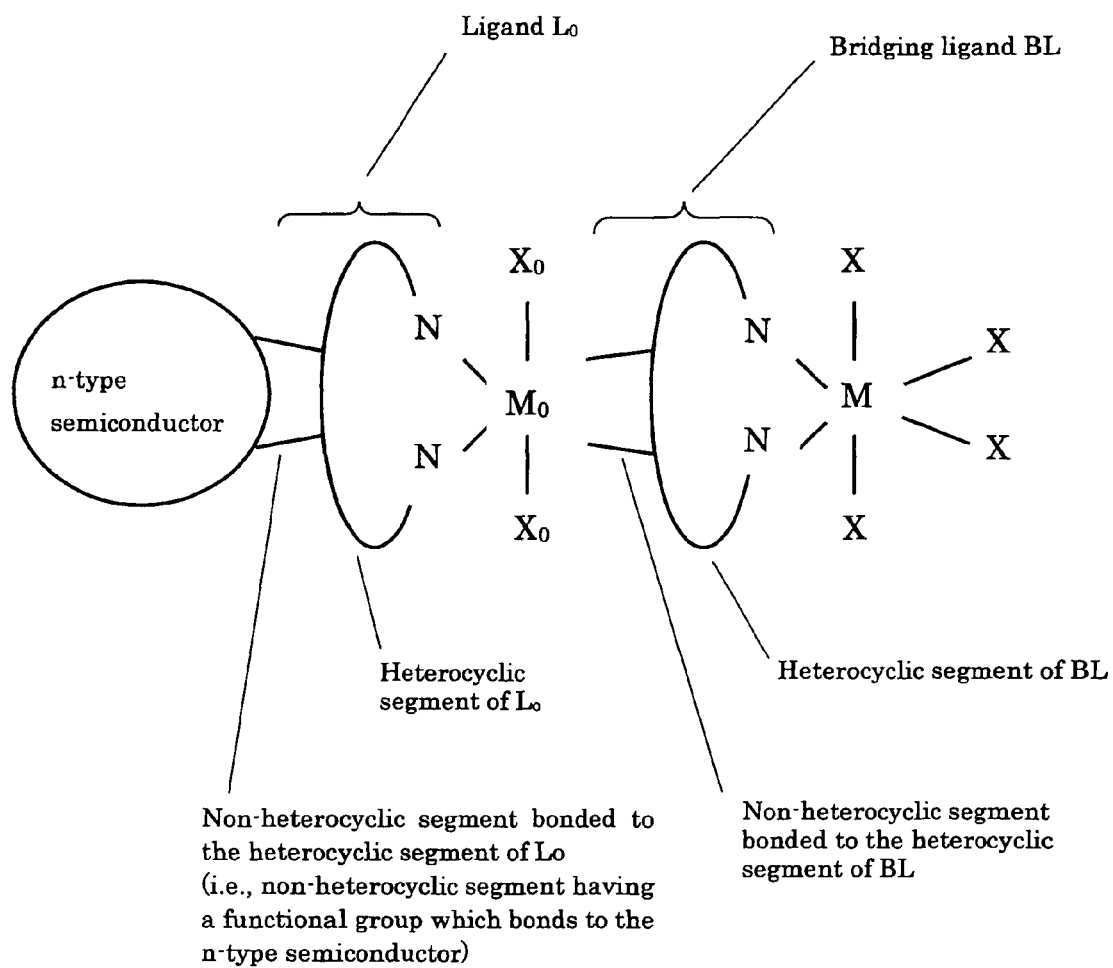
FIG. 4 shows a diagrammatic view explaining an example of the structure of a multinuclear complex used in the present invention.
Figure 5:
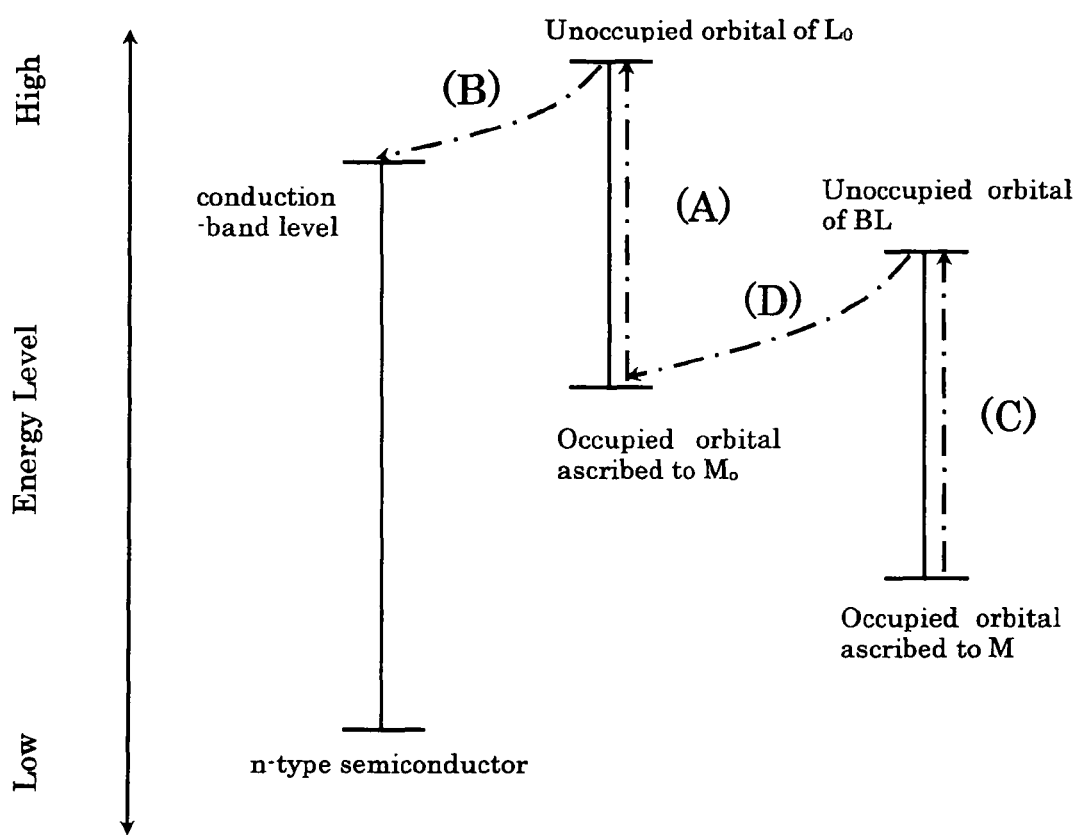
FIG. 5 shows a diagrammatic view explaining the concepts of the energy levels and electron orbitals with respect to the components of the multinuclear complex shown in FIG. 4.

FIG. 5 is a diagrammatic view explaining the concepts of the energy levels and electron orbitals with respect to each of the component dyes of the multinuclear complex shown in FIG. 4. When the multinuclear complex is irradiated with light rays, an electron transition occurs from the occupied electron orbital ascribed to metal atom $M_0$ to the unoccupied electron orbital ascribed to ligand $L_0$ (in FIG. 5, this electron transition is indicated by symbol "(A)"), and the excited electron is transferred from ligand $L_0$ to the n-type semiconductor (in FIG. 5, this electron transfer is indicated by symbol "(B)"). By the electron transition from the occupied electron orbital ascribed to metal atom $M_0$ to the unoccupied electron orbital ascribed to ligand $L_0$, the occupied electron orbital ascribed to metal $M_0$ turns into an electron-deficient state. Then, when an electron transition occurs from the occupied electron orbital ascribed to metal atom M to the unoccupied electron orbital ascribed to bridging ligand BL (in FIG. 5, this electron transition is indicated by symbol "(C)"), the excited electron is transferred from the electron orbital ascribed to bridging ligand BL to the electron-deficient orbital ascribed to metal atom $M_0$, wherein the electron orbital ascribed to bridging ligand BL is located adjacently to the electron-deficient orbital ascribed to metal atom $M_0$ and has an energy level approximate to the electron-deficient orbital ascribed to metal atom $M_0$ (in FIG. 5, this electron transfer is indicated by symbol "(D)"). As a result, the electron-deficient state shifts from the electron orbital ascribed to metal atom $M_0$, which has a higher energy level, to the electron orbital ascribed to metal atom M, which has a lower energy level. Therefore, when the multinuclear complex as a composite dye is used in a dye-sensitized solar battery, such an electron-deficient orbital ascribed to metal atom M can receive an electron from an electrolyte which has an energy level lower than that of the electron-deficient orbital ascribed to metal atom M.

By successively performing the above-mentioned operation in which an excited electron is transferred to an orbital having an electron emitted therefrom (i.e., electron-deficient orbital) to thereby successively shift the electron-deficient orbital to a lower energy level, it becomes possible to functionalize a stepwise multiphoton absorption process in which an electron transition from a ground state of each component dye in the composite dye is used. This multiphoton absorption process used in the present invention is advantageous as compared to a conventional multiphoton absorption process in which an excited electron is further excited. The reason for this is that, in the multiphoton absorption process used in the present invention, the stability of an excited electron (i.e., lifetime of an excited electron) does not influence the probability of the occurrence of a subsequent electron transition, so that it becomes easier to functionalize the multiphoton absorption process.

With respect to the number of the component dyes (photoabsorption portions) contained in the composite dye, there is no particular limitation. The larger the number of the component dyes, the higher the theoretical upper limit of the conversion efficiency of the multiphoton absorption process. However, when the number of the component dyes (photoabsorption portions) is 4 or more, the improvement in the theoretical upper limit of the conversion efficiency of the multiphoton absorption process, achieved by the increase in the number of the component dyes, becomes small. Therefore, from the viewpoint of the balance of the difficulty in the production of the composite dye and the theoretical conversion efficiency, it is preferred that the number of the component dyes (photoabsorption portions) which are to be chemically bonded is 3 or less, more advantageously 2.

Since the composite dye plays a part in the introduction of an electron into the n-type semiconductor, it is preferred that the first photoabsorption portion has a functional group which bonds to the n-type semiconductor or particles thereof. Specifically, it is preferred that the first photoabsorption portion has a functional group selected from the group consisting of a carboxylic acid group, a carboxylic acid salt group, a sulfonic acid group, a sulfonic acid salt group, a phosphoric acid group and a phosphoric acid salt group. Further, with respect to a functional group, such as a carboxylic ester group, a phosphoric ester group or a sulfonic ester group, the functional group can also be used if, when employed, the functional group has the capability of forming a linkage which is substantially the same as one of the above-mentioned linkages.

Examples of composite dyes include a composite dye comprised of a multinuclear complex, and a composite dye comprised of organic dyes which are bonded to each other, wherein each of the organic dyes has a π conjugate bond and, if desired, has bonded thereto a functional group. Among these composite dyes, a multinuclear complex is preferred.

With respect to a composite dye comprised of a multinuclear complex, explanation is given below. When a composite dye is comprised of a multinuclear complex, each component dye of the composite dye comprises a metal atom having a ligand coordinated thereto, so that the composite dye is comprised of a multinuclear complex comprising a plurality of metal atoms and a plurality of ligands including at least one bridging ligand, wherein the or each bridging ligand is positioned between mutually adjacent metal atoms in the multinuclear complex to thereby bridge the mutually adjacent metal atoms.

The reason why a composite dye comprised of a multinuclear complex is preferred is as follows. When the composite dye comprises a multinuclear complex, with respect to each component dye of the composite dye, the difference in the location of the electrons in the component dye between the ground state and an excited state thereof is distinguishable (for example, there is a case where, in the ground state, the electrons are present mainly in the metal atom, and, in the excited state, the electrons are present mainly in the ligand), differing from the case of an organic dye. Therefore, it becomes easy to clearly separate the function of bonding the component dyes from the function of introducing excited electrons to the component dyes. Further, when the composite dye is comprised of a multinuclear complex, the composite dye is in a stable state after it has released an electron, as compared to the case of an organic dye. Therefore, the composite dye can be preferably used in the present invention wherein it is intended to successively perform the transfer of electrons. When the complex dye is used in a photoelectric conversion element with an n-type semiconductor, the complex dye in the photoelectric conversion element is in a stable state after it has released an electron. Therefore, the use of the complex dye is especially preferred in the present invention in which the stepwise multiphoton absorption process is employed.

As mentioned below, in many cases, a multinuclear complex as a complex dye is produced by a ligand exchange reaction between a plurality of complex dyes as component dyes. During this ligand exchange reaction, a part of the complex dyes (component dyes) (i.e., ligands contained in the complex dyes) are detached therefrom. The multinuclear complex produced by such exchange reaction is regarded as a composite dye in which a plurality of component dyes are chemically bonded to each other, when, with respect to each component dye as a precursor, visible light absorption ascribed to an electron transition in a metal atom contained therein is observed in the multinuclear complex.

It is preferred that the or each bridging ligand (which corresponds to the ligand represented by "BL" in formula (1) below) in the multinuclear complex has an asymmetric structure. By virtue of the asymmetric structure, it becomes possible to orient the electron transfer in the multinuclear complex, thereby making it possible to efficiently take out an electron generated by an electron transition in a component dye (such as the second photoabsorption portion) positioned remote from the n-type semiconductor.

It is preferred that the asymmetric structure of the or each bridging ligand in the multinuclear complex comprises a heterocyclic segment having a conjugated double bond and, bonded to the heterocyclic segment, a non-heterocyclic segment, to thereby form the asymmetric structure, wherein the heterocyclic segment is positioned in the or each bridging ligand on a side thereof remote from the n-type semiconductor as compared to the non-heterocyclic segment, wherein a heteroatom (an atom other than a carbon atom) in the heterocyclic segment is positioned on a side thereof remote from the n-type semiconductor and is coordinated to a metal atom (hereinafter, a heterocyclic segment having a conjugated double bond is frequently referred to simply as "heterocyclic segment", and a heterocycle having a conjugated double bond is frequently referred to simply as "heterocycle"). The heterocyclic segment may be comprised only of a heterocycle or may be comprised of a heterocycle and, bonded thereto, a functional group. When the or each bridging ligand in the multinuclear complex has the above-mentioned asymmetric structure, it becomes possible to more efficiently take out an electron generated by an electron transition in a component dye positioned remote from the n-type semiconductor, since a heterocyclic segment has a high probability with respect to the "metal to ligand charge transfer" (MLCT).

Therefore, with respect to the photoelectric conversion element of the present invention, in which a plurality of component dyes having different excitation levels are chemically bonded to each other to form a composite dye, for the purpose of improving energy conversion efficiency, it is important that an excited electron obtained by light absorption of the component dyes be efficiently taken out as electric energy through the n-type semiconductor. For realizing this purpose, it is important to efficiently take out an electron generated by electron transition occurring in the component dye positioned remote from the n-type semiconductor. When the composite dye is comprised of a multinuclear complex dye, the probability of the electron transition from the metal on the far side of the n-type semiconductor to the bridging ligand is higher than the probability of the electron transition from the metal on the near side of the n-type semiconductor to the bridging ligand. Therefore, it is preferred to use such a composite dye comprised of a multinuclear dye.

As mentioned above, when the heterocyclic segment is coordinated to a metal atom through a heteroatom of the heterocyclic segment, the probability of an electron transition from the metal atom to the heterocyclic segment is high. Therefore, it is preferred that the heterocyclic segment is positioned in the or each bridging ligand on a side thereof remote from the n-type semiconductor as compared to the non-heterocyclic segment, wherein a heteroatom (an atom other than a carbon atom) in the heterocyclic segment is positioned on a side thereof remote from the n-type semiconductor.

It is preferred that the above-mentioned multinuclear complex has a structure represented by the following formula (1):

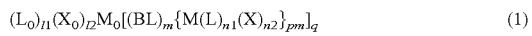

$$(L_0)_{l1}(X_0)_{l2}M_0[(BL)_m\{M(L)_{n1}(X)_{n2}\}_{pm}]_q \quad (1)$$

wherein each of $L_0$ and L independently represents a ligand having a heterocyclic segment which can be coordinated to a transition metal atom; each of $X_0$ and X independently represents a ligand which does not have a heterocyclic segment; each of $M_0$ and M independently represents a transition metal atom; BL represents a bridging ligand having a plurality of portions, each of which can be coordinated to a transition metal atom; l1 is an integer of from 1 to 7 and l2 is an integer of from 0 to 6, with the proviso that the sum of l1 and l2 is not more than 7; m is an integer of from 1 to 7, with the proviso that the sum of l1, l2 and m is not more than 8; n1 is an integer of from 0 to 6 and n2 is an integer of from 0 to 7, with the proviso that the sum of n1 and n2 is not more than 7; and each of p and q independently represents an integer of 1 or more, wherein when each of l1, l2, m, n1, n2, pm and q is an integer of 2 or more, the plurality of $L_0$ may be the same or different, the plurality of $X_0$ may be the same or different, the plurality of BL may be the same or different, the plurality of M may be the same or different, the plurality of L may be the same or different, and the plurality of X may be the same or different.

With respect to the above-mentioned electron transfer, explanation is given below with reference to FIGS. 4 and 5, taking as an example a case where there is used a multinuclear complex having a structure represented by formula (1). For the sake of simplicity, it is assumed that each of m, p and q in formula (1) is 1.

FIG. 4 is a diagrammatic view of a preferred example (described below) of the structure of a multinuclear complex represented by formula (1). $L_0$ is a ligand which comprises a heterocyclic segment and a non-heterocyclic segment (having a functional group which bonds to the n-type semiconductor). Ligand $L_0$ is coordinated to metal atom $M_0$ through a hetero atom in the heterocyclic segment. BL is a bridging ligand having an asymmetric structure, which comprises a heterocyclic segment and a non-heterocyclic segment. Bridging ligand BL is coordinated to metal atom M through a hetero atom in the heterocyclic segment, and is also coordinated to metal atom $M_0$ through an atom in the non-heterocyclic segment. As mentioned above, the probability of an electron transition from a metal atom to a heterocyclic segment (i.e., "metal to ligand charge transfer" (MLCT)) is high. Therefore, both of the electron transition from metal atom $M_0$ to ligand $L_0$ and the electron transition from metal atom M to bridging ligand BL occur with high probability.

By virtue of the asymmetric structure of bridging ligand BL, the flow of electrons in the multinuclear complex can be controlled in the direction indicated by symbol "(D)" in FIG. 5. Especially when the probability of electron transition from the occupied electron orbital ascribed to metal atom M to the unoccupied electron orbital ascribed to bridging ligand BL (i.e., probability of the electron transition indicated by symbol "(C)") is higher than the probability of electron transition from the occupied electron orbital ascribed to metal atom $M_0$ to the unoccupied electron orbital ascribed to bridging ligand BL (i.e., probability of an electron transition which occurs in the direction opposite to the direction of the electron transfer indicated by symbol "(D)"), the electron transitions and electron transfers indicated in FIG. 5 occur efficiently. For this reason, it is preferred that bridging ligand BL is coordinated to metal atom M through a heteroatom in the heterocyclic segment, as diagrammatically indicated in FIG. 4.

Hereinbelow, detailed explanation is given with respect to the preferred structure of the multinuclear complex represented by formula (1).

With respect to the multinuclear complex represented by formula (1), it is preferred that bridging ligand BL comprises a heterocyclic segment and a non-heterocyclic segment, wherein the non-heterocyclic segment is coordinated to metal atom $M_0$. Further, when q is an integer of 2 or more, it is preferred that the heterocyclic segment of BL is coordinated to the metal atom M which is close to metal atom $M_0$, and that a hetero atom in the heterocyclic segment is coordinated to at least one metal atom M. When the multinuclear complex represented by formula (1) has the above-mentioned structure, an excited electron from metal atom M is transferred through bridging ligand BL to metal atom $M_0$ and, hence, it becomes possible to efficiently transfer an electron excited from a low energy level to a component dye which has turned into an electron-deficient state by an electron excitation.

In the present invention, the term "non-heterocyclic segment" means a segment which does not have a heterocycle and which is bonded to a heterocyclic segment. Examples of non-heterocyclic segments include atoms (including those which are in the form of an ion, such as an oxoanion) and groups which do not have any heterocycles.

The structure of the multinuclear complex can be analyzed by any of various analysis methods described below, and the type of metal atom $M_0$ can be determined from the analysis. Specifically, the type of metal atom $M_0$ can be determined as follows. The structure of the multinuclear complex is analyzed, and the structure in which bridge ligand BL is coordinated to the transition metal atoms is determined from the analysis. Then, with respect to the transition metal atoms which are coordinated to bridging ligand BL, the type of the transition metal atom coordinated to the heterocyclic segment and the type of the transition metal atom coordinated to the non-heterocyclic segment are determined, and the transition metal atom coordinated to the non-heterocyclic segment is designated as $M_0$.

With respect to the terminal component dyes of the multinuclear complex represented by formula (1), when one of the terminal component dyes does not have a heterocyclic segment other than the heterocyclic segment of bridging ligand BL (i.e., when the terminal component dye(s) present on the right-hand side of formula (1) does not have ligand L), this terminal component dye is considered to be the component dye which is positioned remote from the n-type semiconductor. Alternatively, in the case where each of the terminal component dyes has a heterocyclic segment other than the heterocyclic segment of bridging ligand BL (i.e., the case where the terminal component dye(s) present on the right-hand side of formula (1) has ligand L), when the heterocyclic segment of one of the terminal component dyes has the below-mentioned functional group which bonds to an n-type semiconductor or very small particles thereof (i.e., when the heterocyclic segment of $L_0$ or L has the below-mentioned functional group), the terminal component dye having such heterocyclic segment is considered to be the component dye which is secured to the n-type semiconductor.

With respect to the multinuclear complex represented by formula (1), when q is an integer of 2 or more, there is a bridging ligand BL which is not directly coordinated to metal atom $M_0$, and such bridging ligand BL is coordinated through a non-heterocyclic segment to a metal atom M which is close to metal atom $M_0$. The "metal atom which is close to metal atom $M_0$" is determined by the order in which the transition metal atoms ($M_0$ and M) and the bridging ligands (BL) are bonded. For example, when q is 2 and m is 1, the order in which the transition metal atoms ($M_0$ and a plurality of M) and the bridging ligands (BL) are bonded is shown by the formula: $M_0(BL)(M)[BL][M]$. In this case, the metal atom M which is present on the left-hand side of the formula (i.e., the metal atom represented by symbol "(M)") is the "metal atom which is close to metal atom $M_0$" as compared to the metal atom M represented by the formula [M].

Hereinbelow, more detailed explanation is given with respect to the structure of the multinuclear complex represented by formula (1).

With respect to the multinuclear complex represented by formula (1), the heterocyclic segment of bridging ligand BL may be a monodentate segment or a multidentate segment having a dentate number of 2 or more. However, it is preferred that the heterocyclic segment of bridging ligand BL is a multidentate segment having a dentate number of 2 or more. When the heterocyclic segment of bridging ligand BL is a multidentate segment having a dentate number of 2 or more, the coordinate bond becomes strong. The upper limit of the dentate number of the heterocyclic segment of bridging ligand BL may be appropriately selected depending on the coordinate number of metal atom M; however, it is preferred that the dentate number is from 2 to 4.

Figure 6:
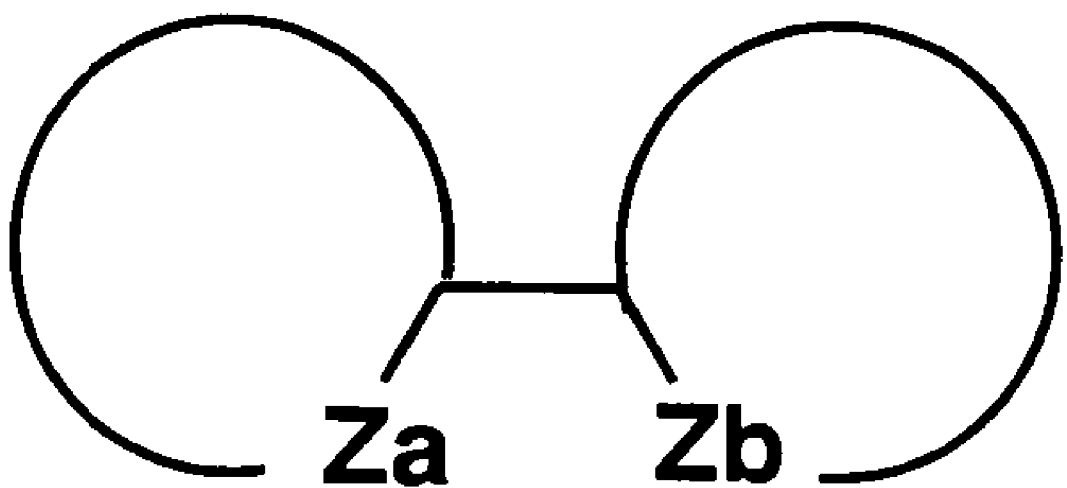
FIG. 6 shows a diagrammatic view explaining an example of the structure of a heterocycle having a conjugated double bond, wherein the heterocycle is contained in a multinuclear complex used in the present invention.

In the multinuclear complex represented by formula (1), the heterocyclic segment of bridging ligand BL coordinated to the metal atom M which is remote from the n-type semiconductor is a heterocyclic segment comprised of at least one 5-membered, 6-membered or 7-membered ring which has at least one heteroatom selected from the group consisting of a nitrogen atom, a sulfur atom and an oxygen atom. The heterocyclic segment of bridging ligand BL is coordinated through such a heteroatom to the metal atom M which is remote from the n-type semiconductor. It is preferred that the heterocyclic segment is comprised of two or more of 5-membered rings, 6-membered rings or 7-membered rings which are chemically bonded to each other because the energy level of the heterocyclic segment becomes low. Further, it is preferred that the two or more of 5-membered rings, 6-membered rings or 7-membered rings, each of which has at least one heteroatom selected from the group consisting of nitrogen atom, sulfur atom and oxygen atom, have a structure as shown in FIG. 6, wherein the position of the heteroatoms (indicated by symbols "Za" and "Zb") in the rings are diagrammatically shown. The reason for this is that, when the heterocyclic segment has such a structure, the bonding between the heterocyclic segment and metal atom M becomes stronger.

Examples of heterocyclic segments include 5-membered ring compounds, 6-membered ring compounds and 7-membered ring compounds, such as pyridine, pyrrole, pyran, furan, thiopyran, thiophene, pyrimidine, pyrazine, pyridazine, imidazole, triazole, pyrazole, thiazole, oxazole, caprolactum and caprolactone; and ring compounds in which the above-mentioned ring compounds are chemically bonded, such as bipyridine, terpyridine, phenanthroline and a quaternary pyridine.

Among the above-mentioned ring compounds, especially preferred are bipyridine, terpyridine, phenanthroline, quaternary pyridine, and derivatives of these compounds, which are obtained by bonding the below-mentioned functional groups to the compounds.

The heterocyclic segment of bridging ligand BL has bonded thereto a non-heterocyclic segment which is coordinated to metal atom $M_0$. The heterocyclic segment may have a functional group which can control the energy level of the heterocyclic segment and/or improve the solubility of the multinuclear complex in a solvent. Examples of such functional groups include a methyl group, an ethyl group, an n-propyl group, an isopropyl group, a t-butyl group, a phenyl group, a benzyl group, a carboxylic acid group, a sulfonic acid group, a phosphoric acid group, a hydroxyl group, a chloro group and a fluoro group. Further examples of such functional groups include a phenyl group having bonded thereto a carboxyl group or the like. These functional groups can be appropriately used individually or in combination, depending on various properties of the functional groups, such as the compatibility with a solvent, the electron-attracting property, and the electron-donating property. By adjusting the resonance ratio of such an electron-attracting group or electron-donating group to the heterocyclic segment, it becomes possible to adjust the energy level of bridging ligand BL, thereby rendering it possible to adjust the excitation levels of the component dyes which are chemically bonded to each other, and the energy levels of the component dyes in excited states. Especially, the energy level of bridging ligand BL in an excited state has great influence on the transition width (i.e., absorption wavelength) of an electron from metal atom M which is coordinated to bridging ligand BL on the side thereof remote from the n-type semiconductor. Therefore, such adjustment of the energy level of bridging ligand BL is important.

When bridging ligand BL has the above-mentioned functional group, it is preferred that the functional group is different from the below-mentioned functional group of ligand $L_0$. The reason for this is that, when the multinuclear complex is bonded to the n-type semiconductor through the functional group of ligand $L_0$, it becomes easy to control the portion at which the multinuclear complex is bonded to the n-type semiconductor.

In the multinuclear complex represented by formula (1), the "non-heterocyclic segment coordinated to the $M_0$" means a segment which does not have a heterocycle and which is bonded to a heterocyclic segment. The non-heterocyclic segment may be a functional group bonded to the heterocyclic segment, such as a hydroxyl group or an oxoanion ($O^-$) which is obtained by ionizing a hydroxyl group. Alternatively, the non-heterocyclic segment may comprise at least one atom bonded to the heterocyclic segment, and an atom or group bonded to the at least one atom. With respect to the type of the atom contained in the non-heterocyclic segment which is coordinated to $M_0$, there is no particular limitation; however, it is preferred that the atom is selected from the group consisting of a nitrogen atom, an oxygen atom, a sulfur atom and a hydrogen atom. Specific examples of non-heterocyclic segments include a carbonyl group, an amino group, a thiol group, a hydroxyl group and an oxoanion ($O^-$). As the non-heterocyclic segment, from the viewpoint of improving the strength of the linkage, preferred is a multidentate ligand having a dentate number of 2 or more, such as a β-diketonato group, which has 2 carbonyl groups. Further, an ionized diol which has 2 oxoanions ($O^-$) is also preferred from the viewpoint of the strength of linkage. Specifically, such an ionized diol can form an ionic bond with the metal to which the bridging ligand is coordinated, depending on the type of the metal and the type of the ligand (other than bridging ligand BL) which is coordinated to the metal, so that the linkage is strengthened.

Figure 7:
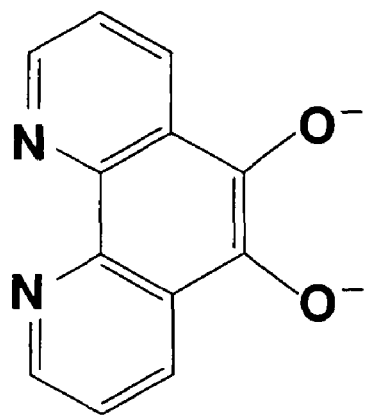
FIGS. 7(a), 7(b) and 7(c) show representative examples of bridging ligands contained in multinuclear complexes used in the present invention.
Figure 7:
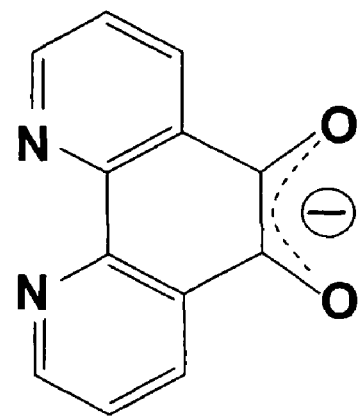
Figure 7:
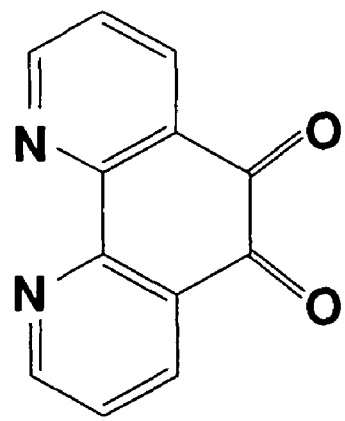

Next, explanation is given with respect to preferred structures of bridging ligand BL, referring to some specific examples. Each of FIG. 7(a) and FIG. 7(b) shows a bridging ligand which is derived from 1,10-phenanthroline-5,6-dione (FIG. 7(c); hereinafter referred to as "quinone form"). Depending on the reaction atmosphere, the structure of 1,10-phenanthroline-5,6-dione changes to a monovalent anion structure (hereinafter referred to as "semiquinone form") as shown in FIG. 7(b) or a divalent anion structure (hereinafter referred to as "catechol anion form") as shown in FIG. 7(a). Therefore, when 1,10-phenanthroline-5,6-dione is used as bridging ligand BL, the 1,10-phenanthroline-5,6-dione is often contained in the multinuclear complex in at least two forms selected from the group consisting of the quinone form, the semiquinone form and the catechol anion form. Further, with respect to this bridging ligand, in each of FIG. 7(a), FIG. 7(b) and FIG. 7(c), the heterocyclic segment is positioned on the left-hand side of the ligand, and the non-heterocyclic segment is positioned on the right-hand side of the ligand. In the catechol anion form, the non-heterocyclic segment has a structure comprising oxoanions ($O^-$).

Figure 8:
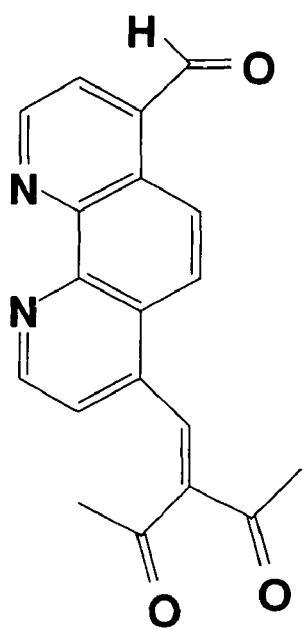
FIGS. 8(a) and 8(b) show other examples of bridging ligands contained in multinuclear complexes used in the present invention.
Figure 8:
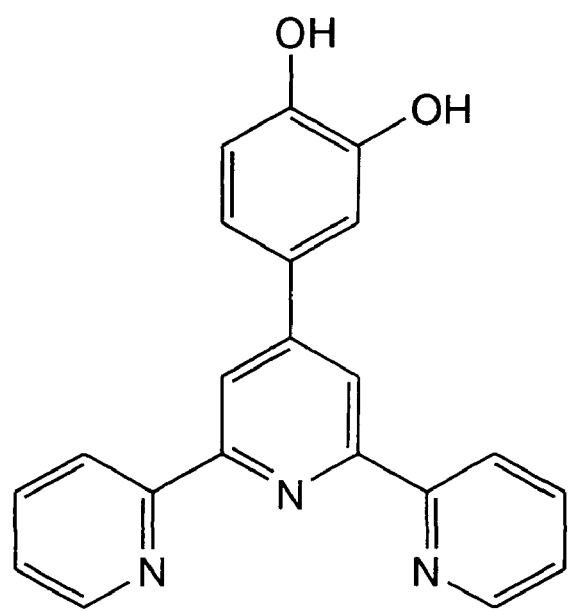

Each of FIG. 8(a) and FIG. 8(b) shows further examples of bridging ligand BL. FIG. 8(a) shows a compound obtained by modifying a phenanthroline ring at the fourth and seventh positions thereof, wherein a β-diketonato group is introduced as a non-heterocyclic segment through the methylene chain at the fourth position and an aldehyde group is introduced at the seventh position for the purpose of adjusting the energy level of the unoccupied orbital of bridging ligand BL. FIG. 8(b) shows an example of bridging ligand BL wherein a phenyl group having a catechol anion structure is introduced to the heterocyclic segment. With respect to each of the compounds shown in FIG. 8(a) and FIG. 8(b), the structure of the non-heterocyclic segment may be changed to a structure having an ion as explained above with reference to FIGS. 7(a), 7(b) and 7(c).

In formula (1), each of $M_0$ and M independently represents a transition metal atom. A transition metal is an element belonging to any of groups 3 to 11 of the Periodic Table. Each of $M_0$ and M may be appropriately selected depending on the desired use; however, preferred is a transition metal selected from the group consisting of Fe, Ru, Os, Co, Rh, Ir, Ni, Pd, Pt, Cr, Mn, Cu, Mo, W and Re, and more preferred is a transition metal selected from the group consisting of Fe, Ru, Os, Co, Rh, Ir, Ni, Pd and Pt.

With respect to $M_0$, the use of an element which is widely used is preferred for obtaining a complex which has a high probability of transition to a heterocyclic segment in the photoelectric conversion element or a dye-sensitized solar battery using the photoelectric conversion element. Specifically, as $M_0$, it is preferred to use a transition metal selected from the group consisting of Fe, Ru and Os, and it is most preferred to use Ru.

Further, it is preferred that $M_0$ is a hexacoordinate transition metal. The reason for this is as follows. As described below, in the field of dye-sensitized solar battery, from the viewpoint of stability and energy level, it is preferred to use, as ligand $L_0$, a multidentate heterocyclic complex having a dentate number of from 2 to 4, such as bipyridine, phenanthroline, terpyridine, quaternary pyridine and derivatives of these compounds. Therefore, a hexacoordinate transition metal which corresponds to such a multidentate compound can be preferably used as $M_0$.

On the other hand, it is preferred that M is a tetracoordinate or hexacoordinate transition metal. The coordinate number of M is determined taking into consideration the adjustment of the energy level of each of the component dyes; the number of the portions (i.e., L and/or X in formula (1)) to which electrons are introduced from an electrolyte when the multinuclear complex is used in a dye-sensitized solar battery; the stability of the structure of the multinuclear complex; and the ease in the production of the multinuclear complex. $M_0$ and M may be the same or different (a plurality of M may be present in the multinuclear complex represented by formula (1)); however, the oxidation potentials of $M_0$ and M are different. Specifically, the oxidation potential of $M_0$ is higher than the or each M (that is, the value of the oxidation of $M_0$ is smaller than that of the or each M), and, when a plurality of M are present, the plurality of M are arranged in an order such that the nearer (to $M_0$) the M, the higher the oxidation potential of the M. By arranging $M_0$ and M in the above-mentioned order, it becomes possible to more efficiently take out excited electrons from orbitals having low energy levels. The oxidation potentials of $M_0$ and M can be measured by an electrochemical method (e.g., cyclic voltammetry), wherein the measurement is performed with respect to $M_0$ and M coordinated to a ligand.

The probability of electron transition varies greatly depending on the types of $M_0$ and M, as well as the type of the ligand (i.e., $L_0$ in formula (1)) positioned on the n-type semiconductor side of $M_0$ and M and the type of the bridging ligand (i.e., BL in formula (1)). Therefore, as described above in connection with the composite dye, for transferring electrons in the composite dye in a desired direction, it is preferred to choose a combination of a transition metal and a ligand, which achieves a high probability of electron transition.

In formula (1), each of $L_0$ and L independently represents a ligand having a heterocyclic segment which can be coordinated to a transition metal atom. The heterocyclic segment of $L_0$ or L is comprised of at least one 5-membered ring, 6-membered ring or 7-membered ring which has at least one heteroatom selected from the group consisting of a nitrogen atom, a sulfur atom and an oxygen atom. $L_0$ or L is coordinated through the at least one heteroatom to metal atom $M_0$ or M which is remote from the n-type semiconductor. It is preferred that the heterocyclic segment is comprised of two or more 5-membered rings, 6-membered rings or 7-membered rings, because the energy level of the heterocyclic segment becomes lowered. Further, as in the case of the above-mentioned bridging ligand BL, it is preferred that each of the two or more of 5-membered rings, 6-membered rings or 7-membered rings which has at least one heteroatom selected from the group consisting of nitrogen atom, sulfur atom and oxygen atom has a structure as shown in FIG. 6, because the bonding between the heterocyclic segment and $M_0$ and the bonding between the heterocyclic segment and M become stronger.

Examples of such heterocyclic segments include 5-membered ring compounds, 6-membered ring compounds and 7-membered ring compounds, such as pyridine, pyrrole, pyran, furan, thiopyran, thiophene, pyrimidine, pyrazine, pyridazine, imidazole, triazole, pyrazole, thiazole, oxazole, caprolactam and caprolactone; and ring compounds in which the above-mentioned ring compounds are chemically bonded, such as bipyridine, terpyridine, phenanthroline and quaternary pyridine.

The above-mentioned heterocyclic segment may have a functional group. Examples of functional groups include a methyl group, an ethyl group, an n-propyl group, an isopropyl group, a t-butyl group, a phenyl group, a benzyl group, a carboxylic acid group, a sulfonic acid group, a phosphoric acid group, a hydroxyl group, a chloro group and a fluoro group. Further examples of functional groups include a phenyl group having a carboxyl group bonded thereto. The above-mentioned functional groups can be appropriately used individually or in combination, depending on various properties of the functional groups, such as chemical bonding property, electron-attracting property and electron-donating property.

It is preferred that $L_0$ is a bi- to quadridentate ligand. Specifically, as $L_0$, it is preferred to use a compound comprising a bi- to quadridentate ligand in which the above-mentioned 5-membered, 6-membered or 7-membered rings are chemically bonded. Examples of such ligands include bipyridine, terpyridine, phenanthroline and quaternary pyridine. Further, it is preferred that $L_0$ has a functional group which can bond to the n-type semiconductor or very small particles thereof. Specifically, it is preferred that $L_0$ has a functional group selected from the group consisting of a carboxylic acid group, a carboxylic acid salt group, a sulfonic acid group, a sulfonic acid salt group, a phosphoric acid group and a phosphoric acid salt group. Alternatively, $L_0$ may have a functional group which, when bonded to $L_0$, is capable of forming substantially the same bond as that of one of the above-exemplified functional groups. Examples of such functional groups include a carboxylic ester, a phosphoric ester and a sulfonic ester. Furthermore, when l1 is an integer of 2 or more, it is preferred that at least one $L_0$ has the above-mentioned functional group. In this case, when a plurality of $L_0$ have two or more of the above-mentioned functional groups, these functional groups may be the same or different.

As a more preferred example of $L_0$, there can be mentioned a ligand having a heterocycle, which is generally used as a sensitizer for a photoelectric conversion element. As such a ligand, there can be used a bi- to quadridentate ligand which is comprised of a conjugated heterocycle having a nitrogen atom and a functional group capable of bonding to the n-type semiconductor. Specific examples of such ligands include bipyridine, terpyridine, phenanthroline and quaternary pyridine, each of which has bonded thereto a carboxylic acid group, a carboxylic acid salt group, a phosphoric acid group or a phosphoric acid salt group.

On the other hand, it is preferred that L is a ligand having a mono- to tridentate heterocycle which can be coordinated to a transition metal atom.

L may or may not be used. L mainly has a function of adjusting the energy level of metal atom M in a ground state. When the multinuclear complex is used in a dye-sensitized solar battery, L also has a function of receiving an electron from an electrolyte. When L has a functional group, it is preferred that the functional group of L is different from that of $L_0$. The reason for this is that, when the multinuclear complex represented by formula (1) is bonded to the n-type semiconductor or very small particles thereof through the functional group of $L_0$, it becomes easy to control the portion at which the multinuclear complex is bonded to the n-type semiconductor or very small particles thereof.

In formula (1), each of $X_0$ and X independently represents a ligand which does not have a heterocycle. As each of $X_0$ and X, it is preferred to use an anionic or neutral ligand. Specific examples of $X_0$ and X include ligands in the form of ions or molecules, such as a fluoro ligand, a chloro ligand, a bromo ligand, a hydroxo ligand, a cyano ligand, a thiocyanato ligand, an isothiocyanato ligand, a nitro ligand, a carbonato ligand, a phosphato ligand, a sulfito ligand, a sulfato ligand, an acyloxy ligand, an acylthio ligand, an ammine ligand, ethylenediamine and derivatives thereof, triethylenetetramine and derivatives thereof, a carbonyl ligand and a phosphine ligand. Further examples of $X_0$ and X include aliphatic or aromatic compounds and derivatives thereof, which have bonded thereto any of the above-mentioned ligands (e.g., a carbonyl group, an amino group, a thiol group, a hydroxyl group and an ion thereof).

In formula (1) above, l1 is an integer of from 1 to 7 and l2 is an integer of from 0 to 6, with the proviso that the sum of l1 and l2 is not more than 7. l1 and l2 are determined depending on the coordination number of transition metal atom $M_0$ and the structure of the portion at which bridging ligand BL is coordinated to $M_0$. l1 is preferably an integer of from 1 to 3. As already mentioned above, it is preferred that $L_0$ is a bi- to quadridentate ligand; thus, l1 is appropriately determined in accordance with the coordination number of $M_0$. On the other hand, l2 is preferably an integer of from 0 to 2. The reason for this is that $X_0$ is used mainly as a supplementary ligand when the coordination number of $M_0$ is not fulfilled, depending on the coordination number of $M_0$ and the coordination structure of each of $L_0$ and the non-heterocyclic segment of BL.

Preferred examples of combinations of l1 and l2 include the following cases (A) to (D):

(A) a case where $M_0$ is a hexacoordinate metal atom, $L_0$ is a bidentate ligand (e.g., bipyridine or a derivative thereof, or phenanthroline or a derivative thereof), l1 is 2, the portion at which BL is coordinated to $M_0$ is bidentate (e.g., a β-diketonato group), and l2 is 0;

(B) a case where $M_0$ is a hexacoordinate metal atom, $L_0$ is a tridentate ligand (e.g., terpyridine or a derivative thereof), l1 is 1, the portion at which BL is coordinated to $M_0$ is tridentate, and l2 is 0;

(C) a case where $M_0$ is a hexacoordinate metal atom, $L_0$ is a tridentate ligand (e.g., terpyridine or a derivative thereof), l1 is 1, the portion at which BL is coordinated to $M_0$ is bidentate, and l2 is 1; and (D) a case where $M_0$ is a hexacoordinate metal atom, $L_0$ is a quadridentate ligand (e.g., quaternary pyridine or a derivative thereof), l1 is 1, the portion at which BL is coordinated to $M_0$ is bidentate, and l2 is 0.

As mentioned above, $M_0$ is preferably a hexacoordinate metal; thus, as exemplified above, it is more preferred that l1 is 1 or 2 and that l2 is 0 or 1.

In formula (1) above, m is an integer of from 1 to 7, with the proviso that the sum of l1, l2 and m is not more than 8. The number m is determined depending on the coordination number of $M_0$ and the coordination structures of $L_0$, $X_0$, and the portion at which BL is coordinated to $M_0$. When m is 2 or more, the multinuclear complex has a branched structure such that a plurality of portions each containing a bridging ligand BL branch out from $M_0$. For preventing the structure of the multinuclear complex from being so complicated, it is preferred that m is an integer of from 1 to 3, more advantageously 1 or 2, still more advantageously 1. Especially, when the non-heterocyclic segment of BL is bidentate, m is preferably 1.

As mentioned above, $M_0$ is preferably a hexacoordinate metal. When $M_0$ is a hexacoordinate metal, the sum of l1, l2 and m is 5 or less.

In formula (1) above, n1 is an integer of from 0 to 6 and n2 is an integer of from 1 to 7, with the proviso that the sum of n1 and n2 is not more than 7. The numbers n1 and n2 are determined depending on the coordination number of M and the structure of the portion at which bridging ligand BL is coordinated to M.

Preferred examples of combinations of n1 and n2 include the following cases a) to l):

a) a case where M is a tetracoordinate metal, BL is coordinated to M through a bidentate ligand (e.g., bipyridine or a derivative thereof, or phenanthroline or a derivative thereof) as the heterocyclic segment thereof, n1 is 0, X is a monodentate ligand, and n2 is 2;

b) a case where M is a tetracoordinate metal, BL is coordinated to M through a bidentate ligand (e.g., bipyridine or a derivative thereof, or phenanthroline or a derivative thereof) as the heterocyclic segment thereof, n1 is 0, X is a bidentate ligand, and n2 is 1;

c) a case where M is a tetracoordinate metal, BL is coordinated to M through a tridentate ligand (e.g., terpyridine or a derivative thereof) as the heterocyclic segment thereof, n1 is 0, X is a monodentate ligand, and n2 is 1;

d) a case where M is a hexacoordinate metal, BL is coordinated to M through a bidentate ligand (e.g., bipyridine or a derivative thereof, or phenanthroline or a derivative thereof) as the heterocyclic segment thereof, n1 is 0, X is a monodentate ligand, and n2 is 4;

e) a case where M is a hexacoordinate metal, BL is coordinated to M through a bidentate ligand (e.g., bipyridine or a derivative thereof, or phenanthroline or a derivative thereof) as the heterocyclic segment thereof, n1 is 0, X is a bidentate ligand, and n2 is 2;

f) a case where M is a hexacoordinate metal, BL is coordinated to M through a bidentate ligand (e.g., bipyridine or a derivative thereof, or phenanthroline or a derivative thereof) as the heterocyclic segment thereof, L is a bidentate ligand, n1 is 1, X is a monodentate ligand, and n2 is 2;

g) a case where M is a hexacoordinate metal, BL is coordinated to M through a bidentate ligand (e.g., bipyridine or a derivative thereof, or phenanthroline or a derivative thereof) as the heterocyclic segment thereof, L is a bidentate ligand, n1 is 1, X is a bidentate ligand, and n2 is 1;

h) a case where M is a hexacoordinate metal, BL is coordinated to M through a bidentate ligand (e.g., bipyridine or a derivative thereof, or phenanthroline or a derivative thereof) as the heterocyclic segment thereof, L is a bidentate ligand, n1 is 2, and n2 is 0;

i) a case where M is a hexacoordinate metal, BL is coordinated to M through a tridentate ligand (e.g., terpyridine or a derivative thereof) as the heterocyclic segment thereof, n1 is 0, X is a monodentate ligand, and n2 is 3;

j) a case where M is a hexacoordinate metal, BL is coordinated to M through a tridentate ligand (e.g., terpyridine or a derivative thereof) as the heterocyclic segment thereof, n1 is 0, X is a tridentate ligand and, n2 is 1;

k) a case where M is a hexacoordinate metal, BL is coordinated to M through a quadridentate ligand (e.g., quaternary pyridine or a derivative thereof) as the heterocyclic segment thereof, n1 is 0, X is a monodentate ligand, and n2 is 2; and l) a case where M is a hexacoordinate metal, BL is coordinated to M through a quadridentate ligand (e.g., quaternary pyridine or a derivative thereof) as the heterocyclic segment thereof, n1 is 0, X is a bidentate ligand, and n2 is 1.

In formula (1) above, p is an integer of 1 or more, and is determined depending on the coordinate structure of the heterocyclic segment through which BL is coordinated to M, and the number of ligands contained in the heterocyclic segment. For example, when the heterocyclic segment has one bidentate ligand (e.g., bipyridine or a derivative thereof, or phenanthroline or a derivative thereof) or one tridentate ligand (e.g., terpyridine or a derivative thereof), p is 1; when the heterocyclic segment has two bidentate ligands (wherein examples of such ligands include bipyridine, a derivative of bipyridine, phenanthroline and a derivative of phenanthroline), p is 1 or 2, preferably 2; and when the heterocyclic segment has three monodentate ligands (wherein examples of such ligands include quinoline and a derivative thereof), p is an integer of from 1 to 3, preferably 3. With respect to the upper limit of p, there is no particular limitation. However, when p becomes large, the structure of the multinuclear complex becomes so complicated that it becomes difficult to produce the multinuclear complex. Therefore, it is preferred that p is an integer of from 1 to 3, more advantageously 1 or 2. When p is 1, the structure of the multinuclear complex becomes most simple.

In formula (1) above, q is an integer of 1 or more, which represents the number of recurrence of $[(BL)_m\{M(L)_{n1}(X)_{n2}\}_{pm}]$ units. When q is 2 or more, the multinuclear complex becomes a complex having 3 or more nuclei. In such a case, a plurality of BL are directionally positioned on both sides of each of a plurality of M in a manner such that the non-heterocyclic segments thereof are located on the near side of $M_0$, so that the multinuclear complex contains a linear structure BL-M-BL.

With respect to the multinuclear complex represented by formula (1), as q becomes large, it becomes possible to absorb light ray having a wider light wavelength distribution, and to obtain a higher voltage by using an appropriate electrolyte (described below). However, when q is 3 or more, a disadvantage is caused wherein the structure of the multinuclear complex becomes complicated, so that it becomes difficult to produce such a multinuclear complex. This disadvantage cannot be counterbalanced by the above-mentioned advantage of absorbing light ray having a wider light wavelength distribution and obtaining a higher voltage. Therefore, it is preferred that q is 1 or 2. Further, from the viewpoint of ease in the production of the multinuclear complex, it is more preferred that q is 1.

When the multinuclear complex represented by formula (1) above has an electric charge, a counter ion may be used to neutralize the electric charge. Examples of counter ions include anions, such as a tetrafluoroboron ion, a tetrafluorophosphorus ion, a perchloric acid ion, a chloride ion, a bromine ion, an iodine ion, a nitric acid ion, a sulfuric acid ion, an isothiocyanic acid ion and a thiocyanic acid ion; a hydrogen ion; alkali metal ions and alkaline earth metal ions, such as a lithium ion, a sodium ion, a potassium ion, a cesium ion, a magnesium ion, a calcium ion, a strontium ion and a barium ion; an ammonium ion; organic ammonium ions, such as a tetramethylammonium ion, a tetraethylammonium ion, a monomethylammonium ion, a dimethylammonium ion, a trimethylammonium ion, a tetrabutylammonium ion and a triphenylammonium ion; and organic phosphonium ions, such as a tetraphenylphosphonium ion.

Next, explanation is given with respect to the method for synthesizing the above-mentioned multinuclear complex. The multinuclear complex can be synthesized by performing desired ligand exchange reactions in combination, taking into consideration the bonding ability of each ligand to each metal atom. Specifically, there can be mentioned the following methods:

(1) a method in which a complex represented by the formula $(L_0)_{l1}(X_0)_{l2}M_0$ and a complex represented by the formula $(BL)_m\{M(L)_{n1}(X)_{n2}\}_{pm}$ are separately synthesized, and $(BL)_m\{M(L)_{n1}(X)_{n2}\}_{pm}$ is bonded to $(L_0)_{l1}(X_0)_{l2}M_0$, wherein the reaction for forming this bonding may involve a ligand exchange reaction;

(2) a method in which a complex represented by the formula $(L_0)_{l1}(X_0)_{l2}M_0(BL)_m$ is synthesized, and $M(L)_{n1}(X)_{n2}$ is bonded thereto;

(3) a method in which a complex represented by the formula $(L_0)_{l1}(X_0)_{l2}M_0(BL)_m$ is synthesized, and a salt of M is bonded thereto, followed by bonding of $(L)_{n1}(X)_{n2}$; and (4) a method in which $(L_0)_{l1}(X_0)_{l2}M_0$, $M(L)_{n1}(X)_{n2}$ and BL are mixed and bonded to each other.

In the above-mentioned method (1), the complex represented by the formula $(L_0)_{l1}(X_0)_{l2}M_0$ can be synthesized, for example, by adding $L_0$ and a chloride salt of $M_0$ to a solvent, and heating the resultant mixture. In this case, the amount of $L_0$ to be added to the solvent is determined from the coordination numbers of $M_0$, $L_0$ and $X_0$ (wherein the chloride ion which derives from the chloride salt of $M_0$ corresponds to $X_0$ which is to be left in the produced complex represented by the formula $(L_0)_{l1}(X_0)_{l2}M_0$). For example, in the case where $L_0$ is a bidentate ligand (e.g., 4,4'-dicarboxy-2,2'-bipyridine) and $M_0$ is ruthenium (which is a hexacoordinate metal), when ruthenium chloride is used as a raw material and it is intended to leave two chloride ions in the produced complex (represented by the formula $(L_0)_{l1}(X_0)_{l2}M_0$) per molecule thereof, $L_0$ is used in an amount of two times the molar amount of $M_0$. The reaction for obtaining $(L_0)_{l1}(X_0)_{l2}M_0$ is preferably performed in a solvent (e.g., dimethylformamide) which can satisfactorily solve $L_0$ and the chloride salt of $M_0$. This reaction is generally performed at a stable reflux temperature for several hours. The compound obtained by this reaction contains chloride ion(s) as $X_0$ which is to be replaced by $(BL)_m\{M(L)_{n1}(X)_{n2}\}_{pm}$ in the subsequent ligand exchange reaction.

With respect to the complex represented by the formula $(BL)_m\{M(L)_{n1}(X)_{n2}\}_{pm}$, the method for synthesis thereof is described below, taking as an example a case where m=p=1 and, hence, $(BL)_m\{M(L)_{n1}(X)_{n2}\}_{pm}$ is $(BL)M(L)_{n1}(X)_{n2}$. Also in this case, it is preferred to use, as a raw material, a chloride salt or acetate salt of M which is susceptible to a ligand exchange reaction. Further, when it is difficult to coordinate BL or L directly to the chloride salt or acetate salt of M, it is preferred that a dimethylsulfoxide (DMSO) complex or the like is first produced as an intermediate, and the above-mentioned ligands (i.e., BL and L) are successively coordinated to M while heating and stirring. For example, when it is intended to synthesize diisothiocyanato-(1,10-phenanthroline-5,6-dione)platinum(II), the synthesis thereof can be performed as follows. Potassium tetrachloroplatinate(II) is dissolved in a solvent, such as water, and the resultant is mixed with DMSO in an amount of 2 to 4 times the molar amount of the potassium tetrachloroplatinate(II) to thereby form a DMSO complex of platinum chloride. Then, the DMSO complex is mixed with 1,10-phenanthroline-5,6-dione which has a coordination ability stronger than that of DMSO (wherein the amount of the 1,10-phenanthroline-5,6-dione is equimolar to the amount of the DMSO complex), to thereby replace DMSO by 1,10-phenanthroline-5,6-dione, so that 1,10-phenanthroline-5,6-dione is coordinated to platinum through the nitrogen atoms in the phenanthroline ring thereof. Finally, the chloride ions remaining on the platinum atom are replaced by isothiocyanate ions (an isothiocyanate ion has a coordination ability stronger than that of a chloride ion). Since a chloride ion can be easily replaced by another ion, it is preferred that chloride ions are left on M until the final ligand exchange reaction for obtaining the desired complex is performed.

After obtaining the complexes represented by the formulae $(L_0)_{l1}(X_0)_{l2}M_0$ and $(BL)_m\{M(L)_{n1}(X)_{n2}\}_{pm}$, a final ligand exchange reaction is performed for obtaining the multinuclear complex. In the above-mentioned case (in this case, $(BL)_m\{M(L)_{n1}(X)_{n2}\}_{pm}$ is $(BL)M(L)_{n1}(X)_{n2}$), $(BL)M(L)_{n1}(X)_{n2}$ is replaced by a part of or all of $X_0$ in $(L_0)_{l1}(X_0)_{l2}M_0$, so that $(BL)M(L)_{n1}(X)_{n2}$ is coordinated to $(L_0)_{l1}(X_0)_{l2}M_0$ through the dione portion of 1,10-phenanthroline-5,6-dione. The dione structure (i.e., the above-mentioned quinone form) sometimes lowers the reaction rate; therefore, it is preferred to perform the reaction while forming the above-mentioned catechol anion by using a solvent (e.g., dimethylformamide) or basic compound (e.g., potassium hydroxide) which can moderately reduce the dione structure to the catechol anion.

Further, although a DMSO complex is mentioned above as an example of the above-mentioned intermediate, a nitrile (e.g., acetonitrile or benzonitrile), a cyclooctadiene ring, triphenyl phosphine or an acetic ion can also be preferably used for forming such an intermediate.

In the above-mentioned method (2), firstly, the complex represented by the formula $(L_0)_{l1}(X_0)_{l2}M_0(BL)_m$ is synthesized. When BL has an asymmetric structure, which is preferred in the present invention, it is necessary that the direction in which BL is coordinated to $M_0$ be adjusted. For example, in the case where BL is 5,6-dihydroxy-1,10-phenanthroline, when it is intended to coordinate BL to $M_0$ through the oxoanion structure, a basic compound, such as sodium hydroxide or potassium hydroxide, is added to the solvent so as to perform the synthesis of $(L_0)_{l1}(X_0)_{l2}M_0(BL)_m$ under basic conditions. By performing the synthesis of $(L_0)_{l1}(X_0)_{l2}M_0(BL)_m$ under basic conditions, the coordination of the oxoanion can be caused to occur preferentially over the coordination of the nitrogen atoms on the phenanthroline ring, so that the direction in which BL is coordinated to $M_0$ can be adjusted.

The synthesis of $(L_0)_{l1}(X_0)_{l2}M_0(BL)_m$ also involves a ligand exchange reaction in which $X_0$ is replaced by BL, and it is preferred that $X_0$ is a chloride ion. For example, when it is intended to react (cis-dichloro-bis(2,2'-bipyridyl-4,4'-dicarboxylic acid))rurthenium(II) with 5,6-dihydroxy-1,10-phenanthroline while ionizing the hydroxyl group of the 5,6-dihydroxy-1,10-phenanthroline to an oxoanion, a mixed solvent of dimethylformamide and water (wherein the mixed solvent satisfactorily dissolves the solute) is used and potassium hydroxide is added thereto so that the reaction can be performed under basic conditions, and the reaction is performed, while heating, under reflux in an inert gas atmosphere (e.g., a nitrogen or argon atmosphere) for several hours. By this reaction, the chloride ions of (cis-dichloro-bis(2,2'-bipyridyl-4,4'-dicarboxylic acid))rurthenium(II) are replaced by ionized 5,6-dihydroxy-1,10-phenanthroline to thereby obtain $(L_O)_{l1}(X_O)_{l2}M_O(BL)_m$.

To the obtained $(L_O)_{l1}(X_O)_{l2}M_O(BL)_m$ is bonded $M(L)_{n1}(X)_{n2}$, which has been separately synthesized. $M(L)_{n1}(X)_{n2}$ can be synthesized in substantially the same manner as in the synthesis of $(L_O)_{l1}(X_O)_{l2}M_O$ in the above-mentioned method (1). As explained above in connection with method (1), when it is difficult to coordinate M to the heteroatom of the heterocycle of BL, which heterocycle has a conjugated double bond, the synthesis is performed after an intermediate, such as a DMSO complex, is produced. In the synthesis of a complex, strong coordination bond is sometimes preferentially formed. In such a case, after the desired compound has been formed, an undesirable ligand exchange reaction may occur, so that the structure of the desired compound is changed. In this case, it is preferred that the reaction time is not longer than required. For example, when the synthesis of a chloride salt of (bis(2,2'-bipyridyl-4,4'-dicarboxylic acid)(1,10-phenanthroline-5,6-diolate))rurthenium(II)-(bis(2,2'-bipyridyl))rurthenium(II) is performed in a mixed solvent of water and ethanol at a reflux temperature, the reaction time is preferably about 1 hour. Further, when the complexation constant can be calculated and the activation energy can be determined therefrom, the reaction temperature may be elevated or lowered so as to suppress the above-mentioned undesirable ligand exchange reaction.

In method (3), the complex represented by the formula $(L_O)_{l1}(X_O)_{l2}M_O(BL)_m$ is synthesized in substantially the same manner as in the above-mentioned method (2), and a chloride salt or acetate salt of M is bonded thereto, followed by bonding of $(L)_{n1}$ and/or $(X)_{n2}$. In this method, when the chloride salt or acetate salt of M is bonded to $(L_O)_{l1}(X_O)_{l2}M_O(BL)_m$, there is a possibility that the desired compound which has already been synthesized is bonded to M so as to form a symmetric dimer in which M is the center of symmetry. Therefore, it is preferred that the dimerization of the desired compound is suppressed by lowering the concentration of the raw materials and the reaction temperature, and that a purification is performed after the reaction to thereby recover the desired compound.

In method (4), it is preferred that BL has a symmetric structure, since the desired complex can be easily obtained. Further, even a BL having an asymmetric structure can also be used when the coordination ability of $M_O$ is different from that of M. Specifically, for example, in the case where BL is 5,6-dihydroxy-1,10-phenanthroline or a derivative thereof, when the coordination of oxoanion to $M_O$ occurs faster than the coordination of the nitrogen atoms of phenanthroline to $M_O$, and the coordination of the nitrogen atoms of phenanthroline to M occurs faster than the coordination of oxoanion to M, BL can be coordinated to $M_O$ and M in the desired direction.

Each of the components of the multinuclear complex is synthesized as follows.

Firstly, as mentioned above, the bonding abilities of the ligands to the metal atoms are compared with each other. This comparison is performed by reacting each ligand with a precursor of a salt of each metal, with reference to reaction rate and examples of synthesis of similar compounds which are described in the literature. It is preferred to perform the above-mentioned comparison prior to the synthesis of the multinuclear complex, because it becomes easy to determine the structure of the multinuclear complex by the below-mentioned analysis. Subsequently, the synthesis of the multinuclear complex is performed in a designed order. The synthesis is performed in a specific solvent (hereinafter referred to as "synthesis solvent") which can dissolve or suspend the starting material. Examples of synthesis solvent include an organic solvent and water. These solvents can be used individually or in combination. The synthesis solvent may contain an additive, such as an organic or inorganic salt. Depending on the type of the desired linkage, various properties (e.g., acidity or basicity and oxidizing property or reducing property) of the synthesis solvent may play an important role in the progress of the reaction and the stability of the product. Therefore, the additive is selected taking into consideration not only the solubility thereof in the synthesis solvent but also the above-mentioned properties.

The reaction temperature and reaction time for the synthesis reaction are determined, taking into consideration the boiling point of the organic solvent used (when an organic solvent is used) and the ease in performing the preliminary experiment mentioned above for determining the reaction order. It is preferred that the synthesis reaction is traced by various analysis methods described below to thereby determine the endpoint of the synthesis reaction.

The synthesis reaction is generally performed under atmospheric pressure. Further, in many cases, it is preferred that an inert gas (e.g., nitrogen or argon) is blown into the solvent during the synthesis reaction.

When the synthesis solvent is a poor solvent for the reaction product, the reaction product may precipitate in the synthesis solvent, so that the reaction product can be easily separated therefrom. Alternatively, the reaction product can also be obtained by a method in which a part of the synthesis solvent is removed by distillation to thereby precipitate the reaction product. In such a case, the reaction product is recovered from the synthesis solvent by a separation method, such as filtration using a filter, or centrifugal separation. Alternatively, if desired, the reaction product can be recovered by a method in which the synthesis solvent is completely distilled off to obtain a solid substance (i.e., a mixture comprising the desired compound and raw materials) and the obtained solid substance is washed with a poor solvent for the desired compound; or by a purification method, such as a recrystallization method, a reprecipitation method, a method in which liquids are separated according to their types, or a column purification method using an adsorbent (e.g., silica, alumina or an organic silica). The necessity of the purification and the type of the purification method are determined, taking into consideration the properties of the reaction product, and the facility and economical efficiency of the purification method.

The structure of the multinuclear complex is determined by infrared (IR) spectroscopy, nuclear magnetic resonance (NMR) spectroscopy, ultraviolet-visible (UV-vis) spectroscopy, mass spectroscopy (MS), ICP emission spectroscopy, fluorescent X-ray spectroscopy, a combination of various chemical, elemental analysis methods, or a method in which a single crystal is formed and the interatomic distance is determined by X-ray diffractometry.

As a composite dye, there can be mentioned a composite dye which is obtained by chemically bonding various organic dyes having a π-conjugate bond and optionally having a bonding group introduced thereinto. Examples of such organic dyes include a 9-phenylxanthene dye, a triphenylmethane dye, an acridine dye, a coumarin dye, an indigoid dye, a cyanin dye, a spiropyran dye, an azo dye and a xanthene dye. The synthesis for obtaining such a composite dye can be performed by any of the conventional organic synthesis methods which are mentioned above in connection with the synthesis of the multinuclear complex. Further, the analysis of such a composite dye can be performed by any of the analysis methods which are mentioned above in connection with the synthesis of the multinuclear complex. Specific examples of the above-mentioned organic dyes are described in "JOEM Handbook 2: Absorption Spectra of Dyes for Diode Lasers", written by Ken Matsuoka and published by Bun-Shin Shuppan, Japan (1990).

In the present invention, with respect to the composite dye comprising a plurality of component dyes which have different excitation levels and which are chemically bonded to each other, the wavelength ranges of light absorbed by the component dyes may be the same or different; however, it is preferred that the wavelength ranges are different. When the wavelength ranges of light absorbed by the component dyes are different, it becomes possible to use light ray (such as sunray) having a wide distribution of light wavelengths.

Hereinbelow, explanations are given with respect to the n-type semiconductor used in the photoelectric conversion element of the present invention. In the present invention, the n-type semiconductor works as follows. The n-type semiconductor receives an excited electron which is generated by the absorption of light ray by the composite dye, and transfers the excited electron to an electroconductive material used for collecting electrons.

Therefore, it is required that the conduction-band level of the n-type semiconductor be lower than the energy level of the component dye (secured to the n-type semiconductor) in an excited state. It is preferred that the conduction-band level of the n-type semiconductor is lower than the energy level of the lowest unoccupied molecular orbital (LUMO) of the component dye secured to the n-type semiconductor.

Specific examples of n-type semiconductors include various oxides, such as titanium oxide, tin oxide, zinc oxide, indium oxide, niobium oxide, tungsten oxide and vanadium oxide; various compound oxides, such as strontium titanate, calcium titanate, barium titanate and potassium niobate; cadmium sulfide; bismuth sulfide; cadmium selenide; cadmium telluride; gallium phosphide; and gallium arsenide. These semiconductors may be used individually or in combination. Of these semiconductors, titanium oxide is preferred since titanium oxide has a good balance of the capability for receiving excited electrons from the composite dye and the capability for transferring the received electrons to a transparent electroconductive membrane.

With respect to the shape of the n-type semiconductor, there is no particular limitation; however, it is preferred that the n-type semiconductor is used in a particulate form. The reason for the preference for a particulate n-type semiconductor is as follows. A particulate n-type semiconductor has an increased surface area for receiving excited electrons from the composite dye, so that a large amount of the composite dye can be efficiently used as a light absorber. Therefore, the photoelectric conversion efficiency can be improved.

The size of the n-type semiconductor particle varies depending on the intended use of the photoelectric conversion element, the intensity of the light ray irradiated to the composite dye, and the absorption capacity of the composite dye. It is preferred that the n-type semiconductor particle has a primary particle size of from 1 to 5,000 nm, more advantageously from 2 to 100 nm, most advantageously from 2 to 50 nm. When the primary particle size is more than 5,000 nm, a problem is likely to arise in that the light transmission properties of the n-type semiconductor as a membrane are lowered and, hence, the incident light cannot be fully utilized. On the other hand, when the primary particle size is less than 1 nm, a problem is likely to arise in that the electron conductivity of the particulate semiconductor is lowered and, hence, a great loss of electrons may occur during the transfer of excited electrons from the composite dye to the below-mentioned electroconductive support.

The particle size of the particulate n-type semiconductor can be measured by using, for example, a laser scattering particle size distribution analyzer or a dynamic light scattering spectrophotometer. Alternatively, the particle size of the particulate n-type semiconductor can also be measured by a method using a scanning electron microscope, in which a photomicrograph taken with respect to the photoelectric conversion element containing the n-type semiconductor is used to determine the particle size of the n-type semiconductor particle. In this method, the particle size is measured with respect to all particles shown in the photomicrograph and, then, the average value of the particle sizes is defined as the particle size of the n-type semiconductor particle. With respect to each particle, when the particle is spherical, the particle size means the diameter of the particle; and, when the particle is non-spherical, the particle size means the average value of the lengths of the longest and shortest sides of the particle.

The n-type semiconductor may have, in the surface thereof, a shell layer capable of adjusting the electron conductivity. By virtue of such a shell layer, in some case, it is possible to suppress the occurrence of a flowback of electrons to the composite dye having emitted excited electrons or to a material (e.g., electrolyte) other than the n-type semiconductor and the composite dye. In the present invention, when the flowback of excited electrons (transferred from the composite dye) to the composite dye does not easily occur, the above-mentioned stepwise multiphoton absorption process works more efficiently. Therefore, especially when the n-type semiconductor is made of a highly electroconductive material (e.g., tin oxide or zinc oxide), the shell layer may play an important role.

As a material for the shell layer, there can be mentioned a material used for the n-type semiconductor or an insulator. Specific examples of materials for the shell layer include various oxides, such as titanium oxide, tin oxide, zinc oxide, indium oxide, niobium oxide, tungsten oxide and vanadium oxide; various compound oxides, such as strontium titanate, calcium titanate, magnesium titanate, barium titanate and potassium niobate; inorganic n-type semiconductors, such as cadmium sulfide, bismuth sulfide, cadmium selenide, cadmium telluride, gallium phosphide and gallium arsenide; alkali metal carbonates, such as lithium carbonate, sodium carbonate and potassium carbonate; alkaline earth metal carbonates, such as magnesium carbonate, calcium carbonate, strontium carbonate and barium carbonate; transition metal carbonates, such as cobalt carbonate, nickel carbonate and manganese carbonate; metal carbonates, such as lanthanoid carbonates (e.g., lanthanum carbonate, ytterbium carbonate and cerium carbonate); alkali metal oxides, such as lithium oxide, sodium oxide and potassium oxide; alkaline earth metal oxides, such as magnesium oxide, calcium oxide, strontium oxide and barium oxide; transition metal oxides, such as cobalt oxide and manganese oxide; metal oxides, such as aluminum oxide, lanthanoid oxides (e.g., cerium oxide, gadolinium oxide, samarium oxide and ytterbium oxide); inorganic insulators, such as natural and synthetic silicates (e.g., silica); and low molecular weight and high molecular weight organic insulators. These materials can be used individually or in combination. Of these materials, from the viewpoint of the stability of the materials, preferred is an inorganic compound selected from the group consisting of an inorganic n-type semiconductor and an inorganic insulator, and more preferred is an inorganic compound containing an alkaline earth metal.

With respect to the thickness of the shell layer, there is a freedom of choice. However, from the viewpoint of assuring the probability that the transfer of excited electrons from the composite dye to the n-type semiconductor occurs, it is preferred that the thickness of the shell layer is less than 1 nm, more advantageously 0.8 nm or less, still more advantageously 0.6 nm or less, most advantageously 0.4 nm or less. With respect to the lower limit of the thickness of the shell layer, there is no particular limitation so long as there can be achieved an increase in the open-circuit voltage of a dye-sensitized solar battery using the photoelectric conversion element; however, it is preferred that the thickness of the shell layer is 0.1 nm or more.

The thickness of the shell layer can be measured by a visual observation using a transmission electron microscope (TEM). Alternatively, the thickness of the shell layer can be measured by the X-ray photoelectron spectroscopy in which the profiling depth is generally 5 nm or less. In the X-ray photoelectron spectroscopy, the thickness of the shell layer is calculated from the atomic ratio between a specific element of the n-type semiconductor (e.g., titanium when the n-type semiconductor is made of titanium oxide) and a specific element of the shell layer (e.g., calcium when the shell layer is made of calcium carbonate), and the specific gravity of the shell layer, which is known from the composition of the shell layer determined by the below-mentioned method. With respect to the specific elements used for calculating the atomic ratio, the elements are appropriately selected in view of the ease in the analysis. Specifically, the elements are such that there are few overlapping peaks and such that the intensity of the peaks is high. It is preferred to use elements which are contained in only one of the n-type semiconductor and the shell layer component.

Further, the thickness of the shell layer can also be measured by a method in which the compositions of the shell layer and the n-type semiconductor are determined using an instrument (e.g., a time-of-flight secondary ion mass spectrometer (TOM-SIMS)) while performing an etching of the shell layer. Specifically, etching of the shell layer is performed until the change of the composition is elicited, and the thickness of the shell layer is obtained as the depth of etching when the change of the composition is elicited. Moreover, the thickness of the shell layer can be more concisely determined by a calculation using the values of the specific gravity and amount of each of the materials used in the shell layer and/or the n-type semiconductor, and the average particle size of the n-type semiconductor (when the n-type semiconductor is particulate).

As explained hereinabove, the photoelectric conversion element of the present invention comprises a composite dye and an n-type semiconductor. The n-type semiconductor may be used in a form such that the n-type semiconductor is in contact with another material, e.g., an electroconductive material mentioned below. Specifically, when a particulate n-type semiconductor is used, from the viewpoint of facilitating the electron flow in the n-type semiconductor, it is preferred that the n-type semiconductor is present, in the form of a membrane having a porous structure, on the surface of the electroconductive material, wherein the n-type semiconductor particles are sintered. The term "porous structure" used herein is defined as follows. The surface area per weight of a portion of the semiconductor membrane is measured by, e.g., BET adsorption isotherm using a nitrogen gas as an adsorbent. When the thus measured surface area per weight is at least 5 times, preferably at least 10 times, more preferably at least 50 times, as large as a planar area per weight of the portion of the semiconductor (wherein the planar area is obtained by projecting the portion on a plane), it is defined that the semiconductor membrane has a porous structure. Such an n-type semiconductor in the form of a membrane having a porous structure can be used in combination with the above-mentioned n-type semiconductor having a shell layer.

The semiconductor membrane may further contain an additive in an amount such that the below-mentioned properties of the photoelectric conversion element are not deteriorated. Examples of additives include organic binders (e.g., acetylacetone), metal peroxides (e.g., titanium peroxide, tin peroxide and niobium peroxide), inorganic binders (e.g., metal alkoxides), inorganic compounds (e.g., nitric acid and sulfuric acid), polymeric compounds (e.g., polyethylene glycol, polypropylene glycol, cellulose and derivatives thereof), surfactants (e.g., nonionic surfactants, anionic surfactants, cationic surfactants and silicone surfactants) and chelating agents.

Examples of electroconductive materials to be in contact with the n-type semiconductor include metals (such as gold, silver, copper, platinum and palladium) and thin films thereof; and transparent electroconductive materials, such as indium oxide compounds (e.g., tin-doped indium oxide, i.e., indium tin oxide (ITO)), tin oxide compounds (e.g., fluorine-doped tin oxide (FTO)), zinc oxide compounds, and thin films thereof.

Instead of the composite dye comprising a plurality of component dyes which have different excitation levels and which are chemically bonded to each other, the photoelectric conversion element of the present invention may contain a dye selected from the group consisting of a complex dye and an organic dye, each of which has excitation levels comparable to those of the component dyes used in the present invention.

In the present invention, the amount (amount carried on the n-type semiconductor) of each of the composite dye and the above-mentioned complex dye and organic dye can be determined by an ultraviolet-visible spectroscopy in which the absorbance of the dye is measured and the found absorbance is converted into the amount of the dye. The measurement of the amount of the dye can be performed with respect to a battery containing the photoelectric conversion element. Alternatively, the measurement of the amount of the dye can be performed with respect to the dye which has been separated from the n-type semiconductor by using an aqueous alkali solution.

Hereinbelow, explanations are given with respect to the dye-sensitized solar battery of the present invention. The dye-sensitized solar battery of the present invention comprises an electrode (i.e., a photo-anode) comprised of the photoelectric conversion element of the present invention, a counter electrode, and an electrolyte interposed between the photoelectric conversion element and the counter electrode, wherein the dye-sensitized solar battery becomes operable when the electrode comprised of the photoelectric conversion element and the counter electrode are connected to each other through an electroconductive material which is positioned outside of the electrolyte.

In the dye-sensitized solar battery of the present invention, it is preferred that at least one of the two electrodes contains a transparent electroconductive support comprising a transparent substrate having supported thereon a transparent electroconductive material, wherein the transparent electroconductive material may be used in the form of a thin film. Specific examples of transparent electroconductive materials include indium oxide compounds (e.g., tin-doped indium oxide, i.e., indium tin oxide (ITO)), tin oxide compounds (e.g., fluorine-doped tin oxide (FTO)) and zinc oxide compounds.

In the dye-sensitized solar battery of the present invention, the two electrodes (i.e., the photo-anode and the counter electrode) and the electrolyte may be so arranged that the electrolyte is sandwiched between the two electrodes (hereinafter, such a dye-sensitized solar battery is referred to as "sandwich-type battery"). Alternatively, the two electrodes and the electrolyte may be so arranged that the two electrodes are immersed in the electrolyte (hereinafter, such a dye-sensitized solar battery is referred to as "immersion-type battery").

As mentioned above, the photoelectric conversion element of the present invention comprises a composite dye and an n-type semiconductor, wherein the composite dye is generally carried on the n-type semiconductor. The n-type semiconductor works as follows: the n-type semiconductor receives an excited electron which is generated by the absorption of light ray by the composite dye, and transfers the excited electron to an electroconductive material used for collecting electrons. Therefore, the n-type semiconductor is in contact with an electroconductive material. That is, a layer comprising the composite dye and the n-type semiconductor is formed on the surface of the electroconductive material, and the electroconductive material having on the surface thereof a layer comprising the composite dye and the n-type semiconductor functions as a photo-anode (i.e., photoelectric conversion electrode).

Figure 9:
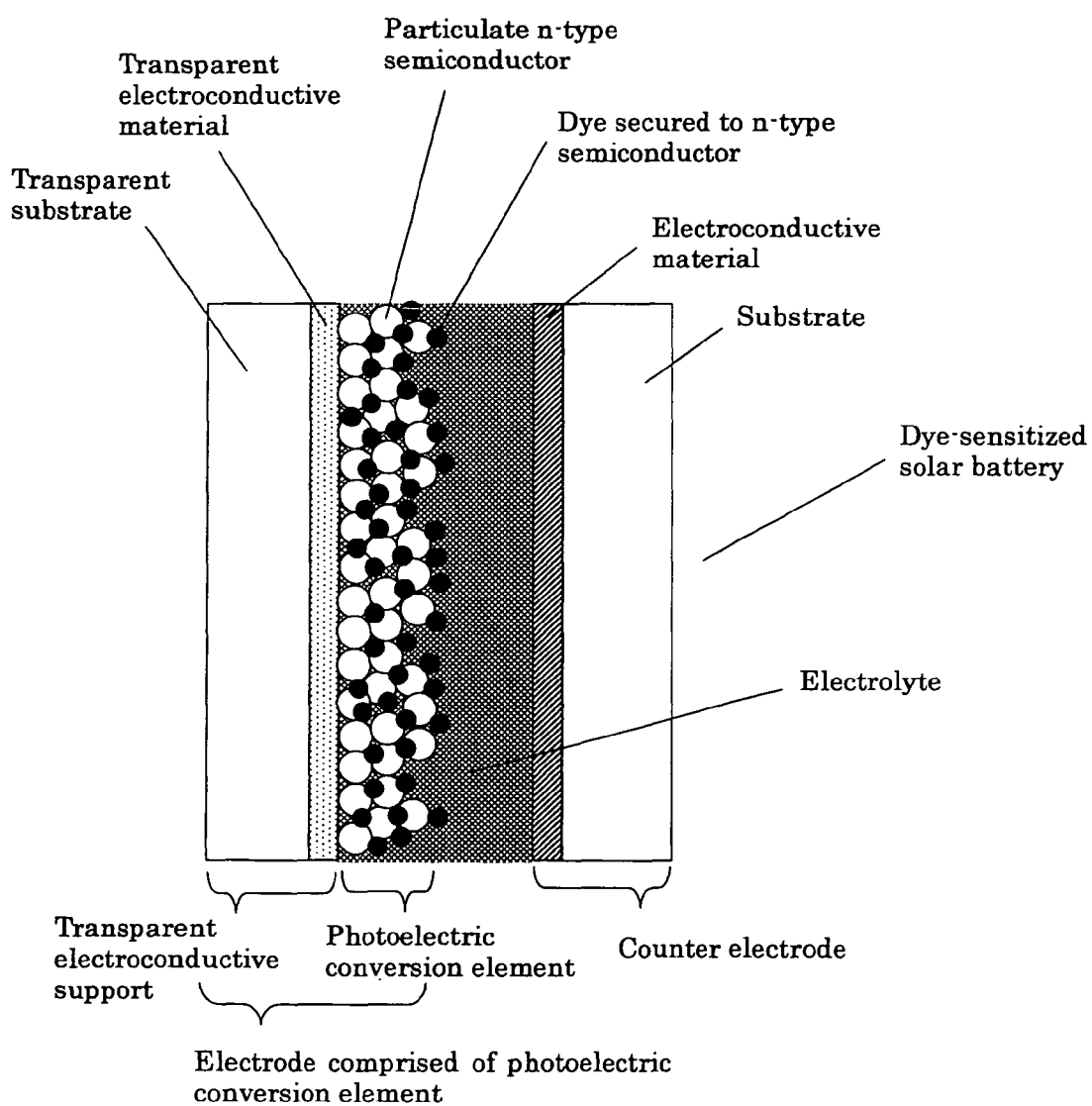
FIG. 9 shows an example of the structure of a dye-sensitized solar battery of the present invention.

In the present invention, it is preferred that the electroconductive material for the photo-anode is transparent. The reason for this is as follows. In the dye-sensitized solar battery of the present invention, a transparent electroconductive support is used for introducing light. Therefore, when the photoelectric conversion element is positioned in the light-introducing side, there is an advantage in that loss of the introduced light due to the absorption thereof by the electrolyte does not occur and, hence, the energy of the introduced light can be effectively utilized. An example of such preferred structure of the dye-sensitized solar battery of the present invention is diagrammatically shown in FIG. 9.

For preventing the occurrence of the leakage of electrons from the transparent electroconductive material to the electrolyte, the transparent electroconductive material may have, in the surface thereof, a layer for preventing a flowback of electrons, so long as the transfer of electrons from the n-type semiconductor to the transparent electroconductive material is not markedly disturbed. As a material for the layer for preventing a flowback of electrons, it is preferred to use a titanium oxide which has a low crystallinity or is amorphous. The layer for preventing a flowback of electrons can be formed by the sol-gel method or the sputtering method.

In the present invention, the term "transparent" means that the light transmission is 10% or more. With respect to a transparent material, the light transmission thereof is preferably 50% or more, more preferably 70% or more.

With respect to the material used as the transparent substrate, there is no particular limitation, and there can be used a glass and an organic substance each having the above-defined transparency. Specific examples of organic substances include transparent polymer films, such as polyethylene terephthalate (PET), polyethylene naphthalate (PEN), syndiotactic polystyrene (SPS), polyphenylene sulfide (PPS), polyarylate (PAr), polysulfone (PSF), polyethersulfone (PES), polyetherimide (PEI), polycarbonate (PC), tetraacetyl cellulose (TAC) and poly(methyl methacrylate) (PMMA).

In the dye-sensitized solar battery of the present invention, the electrolyte has a function of supplying electrons to the composite dye which has turned into an electron-deficient state after donating, to the n-type semiconductor, excited electrons generated by the irradiation of the composite dye with light ray. As the electrolyte, there is used an electrolyte which has a potential suitable for the redox potential of the composite dye. When the electrolyte has such a potential, electrons can be transferred from the electrolyte to the composite dye, whereby the dye-sensitized solar battery of the present invention works. The expression "a potential suitable for the redox potential of the composite dye" means an energy level higher than that of the component dye positioned most remote from the n-type semiconductor (i.e., the component dye having the lowest excitation level); in other words, the above expression means a potential value smaller than that of the component dye, wherein the potential value is measured by an electrochemical method. The use of the electrolyte having such an energy level is advantageous in that the transfer of electrons from the electrolyte to the composite dye is facilitated.

The suitability of the potential of the electrolyte can be determined by an electrochemical method, such as cyclic voltammetry.

In the present invention, the term "the potential of the counter electrode" (wherein the counter electrode is positioned opposite to the photo-anode comprised of the photoelectric conversion element) means the energy level of the counter electrode, at which electrons are transferred from the counter electrode to the electrolyte. At this energy level, the electrolyte in an oxidized form is reduced, and the resultant electrolyte in a reduced form can transfer electrons therefrom to the composite dye in the photoelectric conversion element. The potential of the counter electrode can be determined by the following photoelectrochemical method using a three-electrode type photoelectrochemical measurement and a two-electrode type photoelectrochemical measurement. In the three-electrode type photoelectrochemical measurement, there are used a photo-anode comprised of the photoelectric conversion element (i.e., photoelectric conversion electrode) as a working electrode, a counter electrode (e.g., platinum) and a reference electrode which is used as a reference potential. On the other hand, in the two-electrode type photoelectrochemical measurement, there are used only a working electrode (which is the same as above) and a counter electrode, and the voltage between the counter electrode and the working electrode is measured. From the two values of voltage obtained by the measurements, the potential of the counter electrode is obtained as the electric potential of the counter electrode relative to the redox potential of the reference electrode. Alternatively, the potential of the counter electrode can also be determined by a three-electrode type electrochemical measurement in which the current and voltage are measured without irradiation with light ray, under conditions wherein no oxidation wave or reduction wave can be detected (such conditions can be realized, for example, by satisfactorily lowering the voltage scanning rate or stirring the sample liquid containing the electrolyte. In this method, a current-voltage curve is obtained. The intersection point between the current-voltage curve and the voltage axis (generally, the x-axis), at which no oxidation current or reduction current can be detected, is determined as the potential of the counter electrode.

The voltage generated in the dye-sensitized solar battery of the present invention is determined by the potential difference between the photo-anode comprised of the photoelectric conversion element (i.e., photoelectric conversion electrode) as a working electrode, and the counter electrode. Therefore, from the viewpoint of yielding a high voltage of the dye-sensitized solar battery, it is preferred that the counter electrode has a low redox potential (that is, the counter electrode has a large redox potential value as measured by the electrochemical method).

In the present invention, with respect to the minimum potential of the counter electrode (i.e., the maximum redox potential as measured by the electrochemical method), there is no particular limitation so long as the minimum potential is higher than the energy level of the component dye positioned most remote from the n-type semiconductor (i.e., the component dye having the lowest excitation level) (in this case, the dye-sensitized solar battery of the present invention works). However, it is preferred that the minimum potential of the counter electrode is higher than the energy level of the component dye having the lowest excitation level by 0.05 V or more, more advantageously 0.1 V or more. On the other hand, with respect to the maximum potential of the counter electrode, there is no particular limitation so long as the maximum potential is lower than the conduction-band level of the n-type semiconductor (in this case, the dye-sensitized solar battery of the present invention works). However, from the viewpoint of yielding a high voltage of the dye-sensitized solar battery, it is preferred that the maximum potential of the counter electrode is in the range such that the difference between the energy level of the component dye having the lowest excitation level and the maximum potential is 1 V or less, more advantageously 0.8 V or less, still more advantageously 0.5 V or less, most advantageously 0.3 V or less.

The composite dye used in the present invention comprises a plurality of component dyes which have different excitation levels and which are chemically bonded to each other, wherein the plurality of component dyes are arranged in an order such that the excitation levels of the plurality of component dyes are decreased as viewed from the n-type semiconductor. It is preferred that the composite dye has a structure such that excited electrons in each component dye move directionally toward the n-type semiconductor. By making an advantage of the electron transfer from the component dye positioned most remote from the n-type semiconductor, it becomes possible to transfer electrons (which are taken from the electrolyte at a low energy level) step by step to the n-type semiconductor. By virtue of such mechanism, it becomes possible to achieve a potential difference between the photo-anode (comprised of the photoelectric conversion element) and the counter electrode, wherein the potential difference is larger than the potential difference corresponding to the electron transition width (corresponding to the absorption spectrum) of each component dye. Therefore, for achieving a potential difference between the photo-anode and the counter electrode by the above-mentioned mechanism, it is preferred that the counter electrode exhibits a potential as low as possible, so long as the potential is higher than the energy level of the component dye having the lowest excitation level. More specifically, it is preferred that the counter electrode exhibits a potential of −0.2 V or more, more advantageously 0 V or more, still more advantageously 0.3 V or more, most advantageously 0.5 V or more, relative to the redox potential of silver/silver ion as measured in accordance with the electrochemical method. Especially, when the counter electrode exhibits a potential lower than the excitation level of the component dye secured to the n-type semiconductor (i.e., first photoabsorption portion), there is an advantage in that the composite dye can receive, from the electrolyte, an electron having a low energy level which cannot be received by the first photoabsorption portion alone, thereby achieving a potential difference which is larger than that corresponding to the electron transition width in the first photoabsorption portion. By using such electrode and such counter electrode in combination under conditions wherein the counter electrode exhibits a potential larger than that corresponding to the electron transition width in the component dye secured to the n-type semiconductor (i.e., first photoabsorption portion), it becomes possible to operate a dye-sensitized solar battery having a high energy conversion efficiency, in which the above-mentioned theoretical limit of the one-photon absorption process is overcome.

Specific examples of redox couples include a combination of iodine and an iodide (e.g., lithium iodide, tetrabutyl ammonium iodide or tetrapropyl ammonium iodide); a combination of bromine and a bromide; a combination of chlorine and a chloride; a combination of an alkyl viologen and a reduced form thereof; a combination of quinone and hydroquinone; a combination of nonequivalent ions of a transition metal, such as a combination of iron(II) ion and iron(III) ion, a combination of copper(I) ion and copper(II) ion, a combination of manganese(II) ion and manganese(III) ion, and a combination of cobalt(II) ion and cobalt(III) ion; a combination of compounds containing complex ions, such as a combination of ferrocyanide and a ferricyanide, a combination of cobalt (II) tetrachloride and cobalt(III) tetrachloride, a combination of cobalt(II) tetrabromide and cobalt(III) tetrabromide, a combination of iridium(II) hexachloride and iridium(III) hexachloride, a combination of ruthenium(II) cyanide and ruthenium(III) cyanide, a combination of rhodium(II) hexachloride and rhodium(III) hexachloride, a combination of rhenium(III) hexachloride and rhenium(IV) hexachloride, a combination of rhenium(IV) hexachloride and rhenium(V) hexachloride, a combination of osmium(III) hexachloride and osmium(IV) hexachloride, and a combination of osmium (IV) hexachloride and osmium(V) hexachloride; a complex formed between a transition metal (such as cobalt, iron, ruthenium, manganese, nickel or rhenium) and a conjugated heterocyclic compound or a derivative thereof (such as bipyridine, a derivative of bipyridine, terpyridine, a derivative of terpyridine, phenanthroline, or a derivative of phenanthroline); a complex formed between a metal and a cyclopentadiene or a derivative thereof (such as a ferrocene/ferrocenium ion, cobaltocene/cobaltcenium ion, or a ruthenocene/ruthenoseum ion); and a porphyrin compound.

Of these redox couples, from the viewpoint of yielding a high voltage, preferred are those which enable the counter electrode to exhibit a potential in the above-mentioned preferred range.

The electrolyte used in the dye-sensitized solar battery of the present invention may be or may not be in the form of a solution thereof. When the electrolyte is used in the form of a solution thereof, the electrolyte solution may contain an oxidizing agent or a reducing agent for adjusting the potential of the counter electrode. The reason is as follows. Most electrolytes can have a plurality of valences. Therefore, by using an electrolyte solution containing an oxidizing agent or a reducing agent, there can be obtained a redox couple having a desired valence, which can be advantageously used for receiving and donating electrons in the dye-sensitized solar battery (i.e., for receiving electrons from the counter electrode and donating electrons to the composite dye which has turned into an electron-deficient state). Such a method for adjusting the potential of the counter electrode by the use of an oxidizing agent or a reducing agent is advantageous especially when the electrolyte contains a transition metal and, hence, is likely to have a plurality of valences.

The oxidizing agent and reducing agent can be appropriately selected, depending on the redox potential of the electrolyte. Representative examples of oxidizing agents include nitrosonium boron tetrafluoride. Representative examples of reducing agents include organic or inorganic sulfinic acids and salts thereof, and ascorbic acids and salts thereof.

When it is desired to enhance the electric conductivity of the electrolyte solution, the electrolyte solution may further contain a supporting electrolyte. Specific examples of supporting electrolytes include organic or inorganic perchlorates, such as lithium perchlorate, sodium perchlorate, ammonium perchlorate, tetramethylammonium perchlorate, tetraethylammonium perchlorate and tetrabutylammonium perchlorate; and organic or inorganic hexafluorophosphates, such as lithium hexafluorophosphate, sodium hexafluorophosphate, ammonium hexafluorophosphate, tetramethylammonium hexafluorophosphate, tetraethylammonium hexafluorophosphate and tetrabutylammonium hexafluorophosphate. With respect to these supporting electrolytes, it is preferred to use, as an organic solvent therefor, aprotic polar solvents. Specific examples of aprotic polar solvents include acetonitrile, methoxyacetonitrile, methoxypropionitrile, ethylene carbonate, propylene carbonate, dimethylformamide, dimethyl sulfoxide, 1,3-dimethylimidazolidinone and 3-methyloxazolidinone.

In the dye-sensitized solar battery of the present invention, the redox couple works as an electron carrier. Therefore, it is necessary that the redox couple be contained in the electrolyte with a certain level of concentration. Specifically, the concentration of the redox couple in the electrolyte is preferably 0.001 mol/l or more, more preferably 0.01 mol/l or more, still more preferably 0.3 mol/l or more. With respect to the upper limit of the concentration, there is no particular limitation. However, in the case where a colored electrolyte is used, there is a problem in that the composite dye is shielded from light ray by the colored electrolyte and, hence, the amount of light absorbed by the composite dye is likely to be decreased. In view of this, it is preferred that the concentration of the redox couple in the electrolyte is 3 mol/l or less. Further, when the concentration of the oxidant in the electrolyte is too high, a problem is likely to arise in that a flowback of electrons from the photoelectric conversion element to the electrolyte is caused to occur. Therefore, the concentration ratio between the reductant and oxidant in the electrolyte is appropriately selected by evaluating the photoelectric conversion performance of the dye-sensitized solar battery. In general, it is preferred that the concentration of the reductant is higher than that of the oxidant. Even when only one of an oxidant and a reductant is used as the electrolyte in the dye-sensitized solar battery, it is possible that the electrolyte receives electrons from the counter electrode or donates electrons to the composite dye which has turned into an electron-deficient state. As a result, either an oxidant or a reductant (whichever has not been used as the electrolyte) is generated, so that the electrolyte eventually contains both an oxidant and a reductant and, thus, the dye-sensitized solar battery works. For example, in the case where only a reductant is used as the electrolyte, when the dye-sensitized solar battery is irradiated with light rays, the composite dye is likely to emit electrons and the resultant composite dye in an electron-deficient state deprives the reductant of electrons, thereby causing the reductant to be converted into an oxidant. Thus, the resultant electrolyte eventually contains both an oxidant and a reductant, wherein the concentration ratio between the oxidant and the reductant generally falls within the above-mentioned preferred range such that the concentration of the reductant is higher than that of the oxidant.

The concentration of the electrolyte in the electrolyte solution varies depending on the chemical structure of the electrolyte and the type of the solvent used. When the above-mentioned electrolyte is used, it is preferred that the electrolyte is subjected, prior to use thereof, to a reaction to form an organic salt (e.g., an organic ammonium salt) thereof, or caused to have bonded thereto a functional group having a high affinity to the solvent.

As mentioned hereinabove, the electrolyte is generally used in the form of a solution thereof in an organic solvent. However, mainly for preventing the leakage of the electrolyte, the electrolyte can also be used either in the form of the so-called "gel electrolyte" comprising a polymer matrix impregnated with a solution of the electrolyte in an organic solvent, or in the form of a molten salt thereof. The polymer matrix may be prepared by a method in which a polymerization is performed in an organic solvent containing a redox couple, or may be used in the form of a sheet. Preferred examples of polymer matrixes in the form of a sheet include a polyolefin or cellulose microporous membrane used as a separator for a lithium ion battery or a condenser, a blood separation membrane and a moistening membrane. With respect to the thickness of the microporous membrane, it is preferred that the thickness is small. In general, a microporous membrane having a thickness of from 2 to 20 μm is used. With respect to the porosity of the microporous membrane, it is preferred that the microporous membrane has as many pores as possible, from the viewpoint of the diffusion efficiency of the redox couple. The preferred porosity of the microporous membrane also varies depending on the strength of the membrane. However, the porosity of the microporous membrane, in terms of % by volume of pores, based on the volume of the microporous membrane, is generally in the range of from 30 to 90%, preferably from 50 to 90%.

Further, the electrolyte can also be used in the form of an organic or inorganic solid electrolyte (i.e., a p-type semiconductor). Specific examples of solid electrolytes include organic polymers having a hole-transporting property; and p-type semiconductors such as CuI, CuSCN and NiO.

Hereinbelow, explanations are given with respect to the method for producing the photoelectric conversion element of the present invention and the method for producing the dye-sensitized solar battery of the present invention. With respect to these methods, there is no particular limitation, and any conventional methods can be employed.

A representative example of the method for producing the dye-sensitized solar battery is explained below. In this method, first, an electrode comprised of a photoelectric conversion element and an electroconductive support is produced by a process comprising the steps of: preparing a liquid dispersion of a particulate n-type semiconductor, applying the prepared liquid dispersion onto the surface of an electroconductive support, followed by sintering, to thereby form a semiconductor membrane on the surface of the electroconductive support, and causing the obtained semiconductor membrane to adsorb a photosensitizer containing a composite dye so that the photosensitizer is secured to (or carried on) the n-type semiconductor, thereby obtaining an electrode (i.e., photoelectric conversion electrode) comprised of a photoelectric conversion element and an electroconductive support. Then, another electrode (i.e., counter electrode) and a layer comprising an electrolyte are provided opposite to the photoelectric conversion electrode. Then, a layer comprising an electrolyte is interposed between the photoelectric conversion electrode and the counter electrode, or an electrolyte is introduced into the space between the two electrodes, to thereby obtain a dye-sensitized solar battery. If desired, the dye-sensitized solar battery can be sealed so as to prevent the leakage of the electrolyte.

With respect to the dispersion medium used in the liquid dispersion of the particulate n-type semiconductor, there is no particular limitation so long as the dispersion medium can maintain a liquid state at room temperature. Specific examples of dispersion mediums include water; alcohols, such as ethanol, methanol, propanol, butanol and isopropyl alcohol; hydrophilic organic solvents, such as acetone, acetonitrile, propionitrile, dimethyl sulfoxide and dimethyl formamide; hydrophobic organic solvents, such as dichloromethane, chloroform, carbon tetrachloride, ethyl acetate, diethyl ether, tetrahydrofuran and toluene; and a mixture thereof.

When it is desired to improve the dispersibility of n-type semiconductor particles in the dispersion medium or to adjust the viscosity of the dispersion, the dispersion may further contain an additive. Examples of additives include organic binders (e.g., acetylacetone); inorganic binders, such as metal peroxides (e.g., titanium peroxide, tin peroxide and niobium peroxide) and metal alkoxides; inorganic compounds, such as nitric acid and sulfuric acid; polymers, such as polyethylene glycol, polypropylene glycol, cellulose and derivatives thereof; surface surfactants, such as nonionic surface surfactants, anionic surface surfactants, cationic surface surfactants and silicone surface surfactants; and auxiliary chelating agents. Further, if desired, an acidic compound or basic compound may be added to the dispersion for improving the dispersibility of n-type semiconductor particles in the dispersion medium.

With respect to the concentration (in terms of weight percentage) of the solid content in the liquid dispersion, there is no particular limitation. The concentration of the solid content in the liquid dispersion can be appropriately selected, depending on the properties of the liquid dispersion with respect to, e.g., spreadability and fast-drying; however, it is preferred that the concentration is in the range of from 10 to 50%, more advantageously from 15 to 40%.

With respect to the conditions for dispersing the n-type semiconductor particles in the dispersion medium, there is no particular limitation. When it is desired to improve the uniformity of the liquid dispersion, it is advantageous to use a mixing-agitating type blender or an ultrasonic homogenizer, such as a paint shaker, a ball mill or a homogenizer. It is also useful to pulverize the n-type semiconductor particles by using a mortar or the like before the mixing thereof with the dispersion medium.

With respect to the method for applying the liquid dispersion of n-type semiconductor particles onto the surface of the electroconductive support, there is no particular limitation so long as a semiconductor membrane can be formed on the surface of the electroconductive support. For example, the liquid dispersion can be applied to the surface of the electroconductive support by a screen printing method, a spin coating method, a dip coating method, a doctor blade method, or a method using a wire bar. If desired, after the application of the liquid dispersion onto the surface of the electroconductive support, a step of drying at room temperature may be performed. In the case where the liquid dispersion is repeatedly applied to the surface of the electroconductive support, it is preferred that the above-mentioned drying step is performed after each application. The drying step can be omitted by performing the below-mentioned sintering step.

In the sintering step, the sintering temperature varies depending on the type of semiconductor used, the degree of sintering desired, the heat resistance of the electroconductive support used, and the like. Therefore, the sintering temperature can be appropriately selected in accordance with the desired effect. In general, it is preferred that the sintering is performed at a high temperature, since the particles can be welded to each other in a short period of time, thus increasing the conductivity between the particles. However, the use of a high temperature is inappropriate for substances which may cause a phase transition accompanied by a change of the crystallinity thereof, leading to a lowering of the photoelectric conversion performance of the photoelectric conversion element.

The type of the electroconductive support used is another significant factor for selecting the sintering temperature. It is because the electroconductive support is comprised of a transparent substrate and a transparent electroconductive membrane, each having a unique maximum tolerable temperature. For example, when an organic substance (e.g., a polymer film) having a low melting temperature or softening point is used as a transparent substrate and ITO (indium tin oxide) is used as a transparent electroconductive membrane, the sintering step can be performed at a temperature lower than the maximum tolerable temperature of the organic substance (e.g., a polymer film). Specifically, the sintering step is performed preferably at 250° C. or lower, more preferably at 200° C. or lower. On the other hand, when a glass is used as a transparent substrate and FTO (fluorine-doped tin oxide) is used as a transparent electroconductive membrane, the sintering step needs to be performed at a temperature lower than the maximum tolerable temperature of the glass. Specifically, the sintering step is performed preferably at 600° C. or less. The time for sintering is preferably from 10 minutes to 1 hour, more preferably from 20 minutes to 1 hour.

With respect to the atmosphere in which the sintering step is performed, there is no particular limitation, and the atmosphere can be appropriately selected in accordance with the desired effect. Specific examples of atmospheres include an inert gas atmosphere, such as a nitrogen gas atmosphere or an argon gas atmosphere; a reducing gas atmosphere, such as a hydrogen gas atmosphere; a mixed gas atmosphere, such as a nitrogen/oxygen mixed gas atmosphere; air; a carbon dioxide gas atmosphere; and an oxygen gas atmosphere.

With respect to the semiconductor membrane produced under the above-mentioned conditions, the thickness thereof is preferably in the range of from 0.5 to 50 μm, more preferably from 1.0 to 30 μm. When the thickness of the semiconductor membrane is less than 0.5 μm, there is a problem in that the membrane cannot adsorb a satisfactory amount of photosensitizer mentioned below and, hence, a high level of energy conversion efficiency is not likely to be attained. On the other hand, when the thickness of the semiconductor membrane is more than 50 μm, problems arise not only in that the semiconductor membrane has a poor mechanical strength and, hence, the membrane is likely to peel off from the electroconductive support, but also in that the light permeability of the semiconductor membrane is lowered and, hence, the photosensitizer which is adsorbed by the semiconductor membrane cannot receive a satisfactory amount of light. Further, a problem is also likely to arise in that the route of the electron transfer in the semiconductor membrane becomes prolonged, thus increasing the internal resistance, leading to a lowering of the energy conversion efficiency.

Hereinbelow, explanations are given with respect to the step of causing the semiconductor membrane to adsorb the photosensitizer comprising the composite dye. First, a solvent for the composite dye is selected. The solvent is selected in view of the solubility of the composite dye in the solvent. Specific examples of solvents include alcohols, such as methanol, ethanol, propanol and butanol; ketones, such as acetone and methyl ethyl ketone; esters, such as ethyl acetate and butyl acetate; sulfolane; tetrahydrofuran; dimethyl sulfoxide; dimethylformamide and mixtures thereof. The n-type semiconductor (in the form of a membrane) formed on the electroconductive support (wherein the n-type semiconductor and the electroconductive support forms a photo-anode precursor) is contacted with a solution of the photosensitizer comprising the composite dye in the above-mentioned solvent so that the composite dye is carried on the n-type semiconductor, thereby obtaining an electrode (i.e., a photo-anode). This step may be performed at room temperature for a period of several hours to several days; however, the step is preferably performed at a temperature at which the solvent is refluxed, or at a temperature in the range of from 50° C. to a temperature near the reflux temperature. When the step is performed under such temperature conditions, there are advantages not only in that the solubility of the composite dye in the solvent increases and, hence, the amount of composite dye carried on the n-type semiconductor increases, but also in that, when the composite dye is chemically bonded to the n-type semiconductor, the bonding between the composite dye and the n-type semiconductor is likely to become stronger. There is a further advantage in that the time necessary for the n-type semiconductor to adsorb the composite dye is reduced to as short as 10 minutes to several hours, which is preferred from the viewpoint of commercial productivity.

As described hereinabove, in the photoelectric conversion element of the present invention comprising a composite dye and an n-type semiconductor, the transfer of electrons between a plurality of component dyes bonded to each other is likely to occur with a high probability, so that it becomes possible to use light ray having a wide light wavelength distribution for taking out electrons from the composite dye. Such an excellent effect of the present invention is apparent from the comparison of the results between Example 1 and Comparative Example 1 and the comparison of the results between Example 2 and Comparative Example 2 (these Examples and Comparative Examples are described below in detail). Further, in the dye-sensitized solar battery of the present invention, it is possible to receive electrons from the electrolyte which has received electrons from the counter electrode having a low potential, so that the dye-sensitized solar battery can yield a high voltage. Such an excellent effect of the present invention is apparent from the comparison of the results between Examples 3 to 6 and Comparative Examples 3 to 4 (these Examples and Comparative Examples are described below in detail). Moreover, a comparison of the results between Examples 7 to 8 and Reference Example 1 shows that a two-photon absorption process works advantageously in the dye-sensitized solar battery of the present invention containing the photoelectric conversion element. Such stepwise multiphoton absorption process works more advantageously when strong light is used. Therefore, when the stepwise multiphoton absorption process is used in the application field of an optical memory, in which strong light is used to record information and weak light is used to read the recorded information, the deterioration of the recorded information can be effectively suppressed. Also, the stepwise multiphoton absorption process is different from the one-photon absorption process in the electron-generating properties relative to the intensity of light, and thus the dye-sensitized solar battery of the present invention can also be used in the fields of optical switching and optical sensors.

BEST MODE FOR CARRYING OUT THE INVENTION

Hereinbelow, the present invention will be described in more detail with reference to the following Examples, Comparative Examples and Reference Example, which should not be construed as limiting the scope of the present invention.

The measurements performed in the present invention are as follows.

(1) Ultraviolet-Visible Spectrophotometry (UV-vis)

Ultraviolet-visible spectrophotometry is performed with respect to a wavelength range of from 300 nm to 800 nm using an ultraviolet-visible spectrophotometer (trade name: UV-2500PC; manufactured and sold by Shimadzu Corporation, Japan) under conditions wherein the slit width is 5.0 nm and the scan speed is high. Further, the ultraviolet-visible spectrophotometry for the measurement, in each of Example 1 and Comparative Example 1, of the amount of a dye adsorbed is performed with respect to a wavelength range of from 300 nm to 800 nm using an ultraviolet-visible spectrophotometer (trade name: MPC2200; manufactured and sold by Shimadzu Corporation, Japan) under conditions wherein the slit width is 5.0 nm and the scan speed is high.

(2) Infrared Spectrophotometry (FT-IR) and Liquid Chromatography (LC)

Infrared spectrophotometry is performed as follows. With respect to Example 1, Comparative Example 1, Example 4 and Example 5, the measurement is performed with respect to a wavenumber range of from 400 to 4000 $cm^{-1}$ in accordance with the KBr method using an infrared spectrophotometer (trade name: SYSTEM 2000 COMPRISIN; manufactured and sold by Perkin Elmer, Inc., U.S.A.) under conditions wherein the resolution is 4 $cm^{-1}$. With respect to Examples other than Example 1, Comparative Example 1, Example 4 and Example 5, the measurement is performed with respect to a wavenumber range of from 400 to 4000 $cm^{-1}$ in accordance with transmission microscopy using an infrared spectrophotometer (trade name: IRµs; manufactured and sold by Spectra Tech, Inc., U.S.A.) under conditions wherein the resolution is 4 $cm^{-1}$.

Liquid chromatography is performed using a chromatograph (trade name: 1100 series; manufactured and sold by Agilent Inc., U.S.A.) and a column (2.1 mm I.D.×150 mm) (trade name: Inertsil ODS-3; manufactured and sold by GL sciences Inc., Japan) under conditions wherein the flow rate is 0.2 mL/min, water containing 0.1% by weight of trifluoroacetic acid (TFA) is used as solution A (mobile phase), $CH_3CN$ containing 0.1% by weight of trifluoroacetic acid (TFA) is used as solution B (mobile phase), and the amount of the sample is 3 µL. For the detection, the absorption of light respectively having wavelengths of 254 nm and 400 nm are used.

(3) Mass Spectrometry (MS)

Two types of mass spectrometry are used. Specifically, electrospray ionization mass spectrometry or matrix-assisted laser desorption ionization/time-of-flight mass spectrometry is employed depending on the properties of the sample.

Electrospray ionization mass spectrometry (ESI-MS) is performed in the positive mode with respect to a mass/charge ratio range of from 50 to 2000 using a mass spectrometer (trade name: LCQ; manufactured and sold by Thermoquest, U.S.A.). The ionization of the sample is performed by APCI. As the apparatus for the electrospray ionization, the above-mentioned apparatus "1100 series" (manufactured and sold by Agilent, U.S.A.) is used.

Matrix-assisted laser desorption ionization/time-of-flight mass spectrometry (MALDI-TOF-MS) is performed using a mass spectrometer (trade name: AXIMA CFR plus; manufactured and sold by Shimadzu Corporation, Japan). The ion detector is operated in the linear mode and in the positive ion detection mode, and the number of integration is 2000 times. The ionization of the sample is performed by irradiating a matrix having immersed therein the sample, with a nitrogen laser having a wavelength of 337 nm.

(4) ICP Emission Spectrometry (ICP-AES)

The sample is mixed with nitric acid having a weight 700 times as large as the weight of the sample. The resultant mixture is decomposed by microwaves using a microwave system (trade name: ETHOSPLUS; manufactured and sold by Milestone, Italy). The resultant decomposed mixture is diluted with pure water. With respect to the resultant diluted mixture, ICP emission spectrometry is performed using an ICP emission spectrometer (trade name: JY138; manufactured and sold by JOBIN YVON, France) provided with a cyclone chamber under conditions wherein the flow rate of the plasma gas (PL1) is 13 L/min, the flow rate of the sheath gas (G1) is 0.3 L/min, the nebulizer gas pressure is 3.0 bar, the flow rate of the nebulizer gas is 0.2 L/min and the high-frequency wave power is 1.4 kW.

(5) Fluorescent X-Ray Analysis

Fluorescent X-ray analysis is performed using a fluorescent X-ray analyzer (trade name: PW2400; manufactured and sold by Philips Analytical, Netherlands), wherein a rhodium X-ray tube is used.

(6) Cyclic Voltammetry

Cyclic voltammetry is performed using an electrochemical test system (trade name: Solartron 1280Z; manufactured and sold by SOLARTRON, U.K.). As an electrolytic cell, a glass cell (trade name: VC-3; manufactured and sold by Bioanalytical System (BAS), U.S.A.) is used; as a working electrode, glassy carbon or platinum (0.0706 $cm^2$; 3 mm$\phi$) (manufactured and sold by Bioanalytical System (BAS), U.S.A.) is used; as a counter electrode, a platinum wire is used; and, as a reference electrode, Ag/$Ag^+$ (trade name: RE-5; manufactured and sold by Bioanalytical System (BAS), U.S.A.) is used.

(7) Properties of a Dye-Sensitized Solar Battery

Properties of a dye-sensitized solar battery are measured as follows.

When the dye-sensitized solar battery is a sandwich type solar battery, the measurement is performed as follows. The sandwich type solar battery is irradiated with a quasi sunray (about 100 mW/$cm^2$) using a solar simulator (manufactured and sold by WACOM ELECTRIC CO., LTD., Japan), and the short-circuit current ($I_{sc}$) is measured using an I-V curve tracer (manufactured and sold by EKO INSTRUMENTS Co., Ltd., Japan), wherein the measured area is 1 $cm^2$.

On the other hand, when the dye-sensitized solar battery is an immersion type solar battery, the measurement is performed by the three-electrode type photoelectrochemical method and/or the two-electrode type photoelectrochemical method. Specifically, the measurement by the three-electrode type photoelectrochemical method is performed as follows. To a 100 ml beaker is fed an electrolytic solution having a volume of about 100 ml. Then, in the beaker containing the electrolytic solution are immersed an electrode comprising a photoelectric conversion element as a working electrode, and a platinum wire in the form of a coil as a counter electrode, thereby obtaining an immersion type solar battery. In the beaker containing the immersion type solar battery is immersed Ag/$Ag^+$ (trade name: RE-5; manufactured and sold by Bioanalytical System (BAS), U.S.A.) as a reference electrode. Then, while stirring the electrolytic solution, the measurement by the three-electrode type photoelectrochemical method is performed using an electrochemical test system (trade name: Solartron 1280Z; manufactured and sold by SOLARTRON, U.K.). As the source of light for use in the measurement of the electric current and voltage generated by the light ray irradiation of the solar battery, a halogen lamp (trade name: AT-100HG; manufactured and sold by Shimadzu Corporation, Japan) is employed, wherein the irradiation with the halogen lamp is performed using an apparatus (trade name: PS-150UE-DC; manufactured and sold by Shimadzu Corporation, Japan), and, if desired, the amount of the irradiation with the halogen lamp is controlled. The distance between the light source and the reference electrode is about 6 cm.

The measurement by the two-electrode type photoelectrochemical method is performed in substantially the same manner as in the measurement by the three-electrode type photochemical method, except that no reference electrode is used and a conductor line which, in the case of the three-electrode type photochemical method, would be connected to a reference electrode is connected to a counter electrode.

Example 1

(1) Synthesis of a Composite Dye (Synthesis of Component Dye Precursor A (Component Dye A) Corresponding to the First Photoabsorption Portion)

0.523 g of ruthenium chloride n-hydrate (reagent; manufactured and sold by Wako Pure Chemical Industries Ltd., Japan) and 50 ml of dimethylformamide were charged into a three-necked flask, followed by stirring in an atmosphere of nitrogen at room temperature for 15 minutes, to thereby obtain a mixture. To the obtained mixture were added 50 ml of dimethylformamide and 0.952 g of 4,4'-dicarboxy-2,2'-bipyridine (reagent; manufactured and sold by Tokyo Kasei Kogyo Co., Ltd., Japan). Then, the resultant mixture was refluxed under heating in an atmosphere of nitrogen for 3 hours under conditions wherein light was shielded, thereby obtaining a mixture. The obtained mixture was allowed to cool to room temperature, followed by a filtration using a filter paper (pore diameter: 5 μm) to obtain a filtrate. Subsequently, the obtained filtrate was dried by a rotary evaporator, thereby obtaining a solid having a dark purple color.

The above-obtained solid was washed with a mixed solvent comprised of diisopropyl ether and acetone (diisopropyl ether/acetone volume ratio=4/1). To the washed solid was added 2 N hydrochloric acid, followed by stirring at room temperature for 4 hours under conditions wherein light was shielded. The resultant mixture was subjected to a suction filtration using a filter paper (pore diameter: 1 μm), thereby obtaining component dye A in the form of a solid. Component dye A was analyzed by infrared spectrometry, ultraviolet-visible spectrometry and fluorescent X-ray analysis. As a result, it was confirmed that component dye A was a complex dye comprising cis-dichloro-bis(2,2'-bipyridyl-4,4'-dicarboxylate)rurthenium(II).

(Synthesis of Component Dye B Corresponding to the Second Photoabsorption Portion, which is Bonded to Component Dye A)

1.0 g of potassium tetrachloroplatinate(II) (reagent; manufactured and sold by Wako Pure Chemical Industries Ltd., Japan) was dissolved in 5 ml of purified water. To the resultant solution was added 0.55 ml of dimethyl sulfoxide, followed by stirring, thereby obtaining a mixture. The obtained mixture was allowed to stand still at room temperature for 1 hour, thereby obtaining a crystalline deposit having a light yellow color. The obtained crystalline deposit was subjected to a filtration using a filter paper (pore diameter: 5 µm), followed by washing with ethanol and air-drying.

0.602 g of the dried crystalline deposit was added to a solution obtained by dissolving 0.301 g of 1,10-phenanthroline-5,6-dione (reagent; manufactured and sold by Sigma-Aldrich Co., U.S.A.) in 60 ml of ethanol. Then, the resultant mixture was refluxed under heating in an atmosphere of air for 3 hours, thereby obtaining a mixture. The obtained mixture was allowed to cool to room temperature, and subjected to a suction filtration using a filter paper (pore diameter: 5 µm), thereby obtaining powders having a yellowish orange color. The obtained powders were analyzed by infrared spectrophotometry, liquid chromatography and ultraviolet-visible spectrophotometry. As a result, it was confirmed that the powders were comprised of dichloro-(1,10-phenanthroline-5,6-dione)platinate(II).

Subsequently, 0.303 g of the powders obtained above were suspended in 80 ml of dimethylformamide. To the suspension was added a solution obtained by dissolving 0.125 g of potassium isothiocyanate (reagent; manufactured and sold by Wako Pure Chemical Industries Ltd., Japan) in 20 ml of purified water, and the resultant mixture was refluxed under heating in an atmosphere of air for 2 hours, thereby obtaining a mixture. The obtained mixture was allowed to cool to room temperature, and subjected to a filtration using a filter paper (pore diameter: 5 µm) and the filtrate was dried using a rotary evaporator, thereby obtaining a solid having a dark moss color. The obtained solid was washed with a mixed solvent comprised of diisopropyl ether and acetone (diisopropyl ether/acetone volume ratio=4/1), followed by drying, thereby obtaining component dye B in the form of powders. The obtained component dye B was analyzed by infrared spectrophotometry, liquid chromatography and fluorescent X-ray analysis. As a result, it was confirmed that component dye B in the form of powders was a complex dye comprised of diisocyanate-(1,10-phenanthroline-5,6-dione)platinate(II).

(Synthesis of Composite Dye Z)

0.100 g of component dye B was dissolved in 30 ml of dimethylformamide, and a solution obtained by dissolving 0.135 g of component dye A in 70 ml of methanol was dropwise added thereto at room temperature while stirring. To the resultant solution was added a solution obtained by dissolving 0.070 g of potassium hexafluorophosphate (reagent; manufactured and sold by Tokyo Kasei Kogyo Co., Ltd., Japan) in 10 ml of purified water, followed by stirring at 100° C. for 5 hours. The resultant mixture was allowed to cool to room temperature, and subjected to a filtration using a filter paper (pore diameter: 5 µm), thereby obtaining a solid having a dark brown color. The obtained solid was washed with dimethylformamide and methanol which were, respectively, solvents for component dyes A and B, followed by drying, thereby obtaining composite dye Z having a dark brown color, in which the components were chemically bonded to each other.

Figure 10:
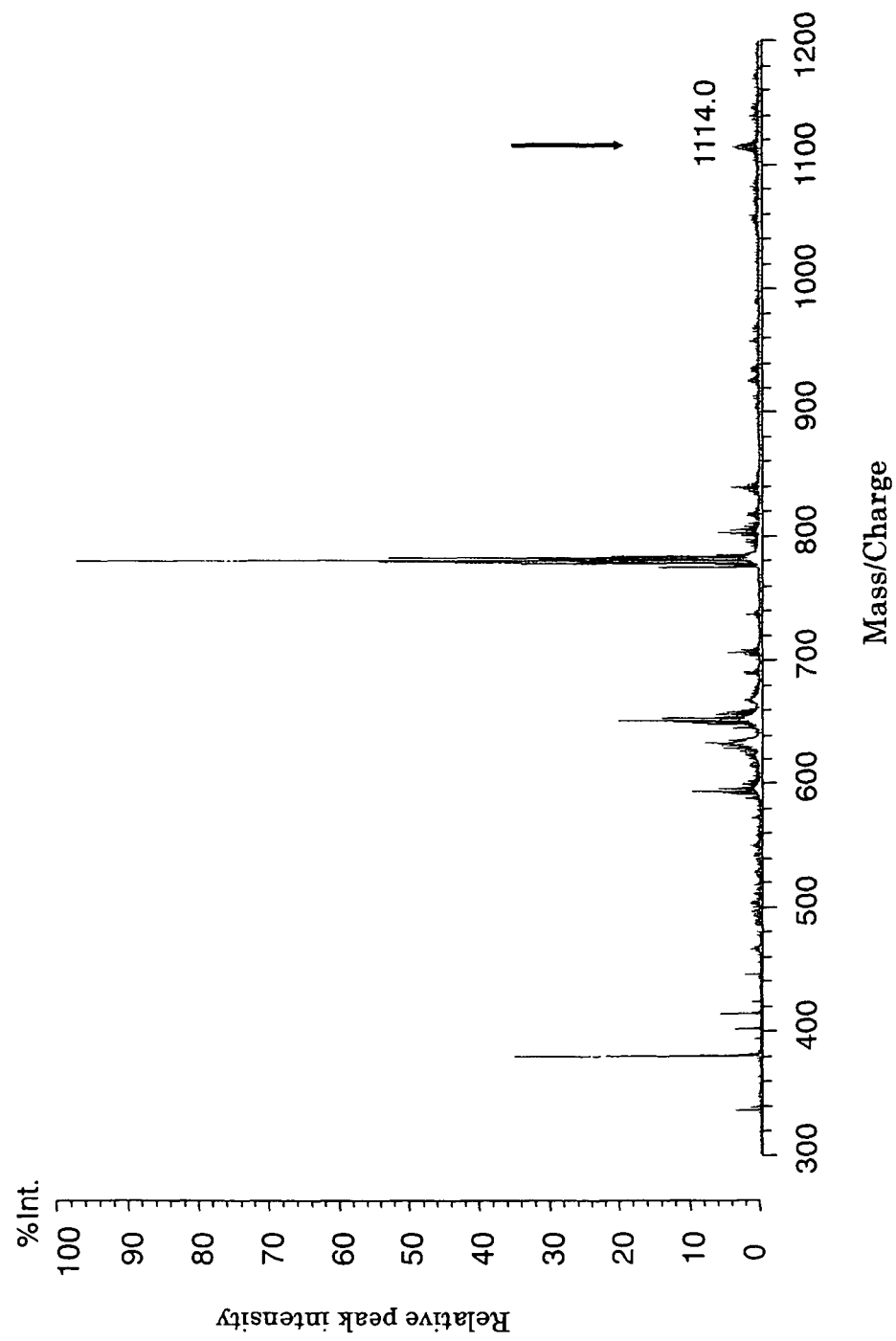
FIG. 10 shows the results of the measurement by matrix-assisted desorption ionization/time-of-flight mass spectrometry (MALDI-TOF-MS) performed with respect to the complex dye produced in Example 1.
Figure 11:
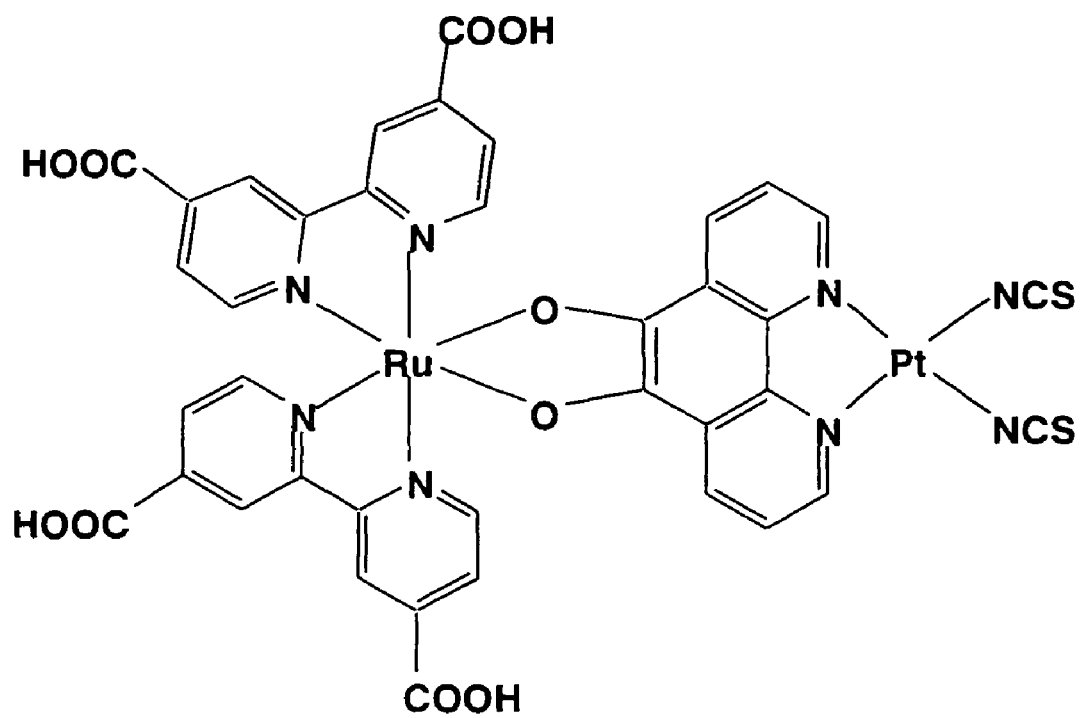
FIG. 11 shows the representative structure of the composite dye produced in Example 1.

Composite dye Z was analyzed by infrared spectrophotometry (IR), ultraviolet-visible spectrophotometry (UV-vis), liquid chromatography (LC), electrospray ionization mass spectrometry (ESI-MS), ICP emission spectrometry (ICP-AES) and matrix-assisted laser desorption ionization/time-of-flight mass spectrometry (MALDI-TOF-MS). As a result of the liquid chromatography (LC), it was confirmed that a reaction between component dye A and component dye B proceeded; as a result of the IR, it was confirmed that 2,2'-bipyridyl-4,4'-dicarboxylate, a derivative of 1,10-phenanthroline-5,6-dione and an isothiocyanate group were present; as a result of the ICP-AES, it was confirmed that ruthenium and platinum were present; and, as a result of the ESI-MS and MALDI-TOF-MS in which α-cyano-4-hydroxycinnamic acid was used as a matrix, it was confirmed that a compound having the molecular weight of the desired compound was present. The results of the MALDI-TOF-MS analysis are shown in FIG. 10. The chart in FIG. 10 contains a peak appearing at 1,114 m/z and ascribed to a compound having the desired molecular weight, together with a peak ascribed to a compound produced by a decomposition (such as ionization) of the compound having the molecular weight of the desired compound during the measurement, a peak ascribed to a compound produced by addition of the above-mentioned matrix to the compound produced by the decomposition, and a peak appearing near the peak ascribed to the compound having the molecular weight of the desired compound, wherein the peak appearing near the peak ascribed to the desired compound was ascribed to a compound in which at least one of the atoms constituting the desired compound was replaced by an isotope thereof. In FIG. 10, the ordinate shows the percentage of intensity of a peak, based on the highest peak intensity observed in the measurement which was performed in the range shown in FIG. 10 (the percentage is referred to as the "relative peak intensity"). In addition, the results of the ultraviolet-visible spectrophotometry performed with respect to composite dye Z were compared with the above-obtained results of the ultraviolet-visible spectrophotometry performed with respect to component dye A and the above-obtained results of the ultraviolet-visible spectrophotometry performed with respect to component dye B. As a result, it was confirmed that composite dye Z was a composite dye comprised of a multinuclear complex in which component dye A and component dye B are bonded to each other, and that the absorbances ascribed to component dyes A and B were observed in different wavelength ranges in the chart showing the spectra of composite dye Z. From the above, it was confirmed that composite dye Z in the form of powders was a multinuclear complex containing a ruthenium atom and a platinum atom and having a structure in which the chloride ions in component dye A are replaced by a derivative of 1,10-phenanthroline-5,6-dione (which is obtained by converting the dione portion of 1,10-phenanthroline-5,6-dione to oxoanions (O⁻)), so that the derivative is coordinated to component dye A through the oxoanions (O⁻) of the derivative. The representative structure of the multinuclear complex is shown in FIG. 11. As shown in FIG. 11, the multinuclear complex had a structure represented by formula (1) above. Specifically, the multinuclear complex had a structure comprising: bipyridyl rings (each corresponding to $L_0$ in formula (1)) each having carboxyl groups as a binding functional group (wherein a part of the carboxyl groups may be converted to a potassium-containing group represented by the formula: COOK); a ruthenium atom (corresponding to $M_0$ in formula (1)) coordinated to the bipyridyl rings; a 1,10-phenanthroline-5,6-dione derivative (corresponding to BL in formula (1)) as a bridging ligand coordinated to the ruthenium atom, wherein the dione portion as a non-heterocyclic segment is converted to oxoanion (O⁻); a platinum atom (corresponding to M in formula (1)) coordinated to the heterocyclic segment of the derivative; and isothiocyanate groups (anionic ligands) (each corresponding to X in formula (1)) coordinated to the platinum atom. Therefore, it was confirmed that component dye A and component dye B as complex dyes had been chemically bonded to each other. Thus, it was confirmed that the dye produced in this Example 1 was a composite dye wherein a plurality of component dyes are chemically bonded to each other.

0.0035 g of composite dye Z (i.e., a multinuclear complex comprised of component dye A and component dye B) was dissolved in 25 ml of dimethylformamide, followed by a filtration using a filter paper (pore diameter: 1 μm). The resultant filtrate was subjected to cyclic voltammetry under conditions wherein 0.975 g of tetra-t-butylammonium hexafluorophosphate was used as a supporting electrolyte, an electrolytic cell was purged with nitrogen gas, the voltage scanning rate was 20 mV/sec and a glassy carbon electrode was used as a working electrode. As a result, it was found that an oxidation wave derived from ruthenium was observed at 0.75 V (relative to the electric potential of the reference electrode) and that an oxidation wave derived from platinum was observed at 1.0 V (relative to the electric potential of the reference electrode). Thus, it was confirmed that a portion derived from component dye A corresponding to the first photoabsorption portion had a high excitation level. The determination of the substances from which the oxidation waves were derived was performed, taking into consideration the results of the cyclic voltammetry performed with respect to component dyes A and B. From the above, it was confirmed that composite dye Z had different excitation levels.

(2) Preparation of a Photoelectric Conversion Element (Preparation of N-Type Semiconductor Dispersion)

6 g of small particles of crystalline titanium oxide (P-25; manufactured and sold by NIPPON AEROSIL CO., LTD., Japan), 120 g of water and 1.49 g of nitric acid were mixed together, followed by heating at 80° C. for about 8 hours. The resultant mixture was allowed to cool to room temperature, and subjected to a distillation using an evaporator to remove water from the mixture, thereby obtaining powders. The obtained powders were pulverized using a mortar, thereby obtaining crystalline titanium oxide in the form of small particles. 1 g of the obtained crystalline titanium oxide and 3.68 g of water were mixed together using an ultrasonic homogenizer for about 10 minutes. To the resultant dispersion were gradually added 1 g of a 1.7% by weight aqueous titanium peroxide solution (PTA; manufactured and sold by TANAKA TENSHA CO., LTD., Japan) as a sintering additive and 0.06 g of Triton X-100 (surfactant; manufactured and sold by Sigma-Aldrich Co., U.S.A.) while stirring, thereby preparing an n-type semiconductor dispersion.

(Preparation of a Photoelectric Conversion Element)

Using a wire bar (length of wired portion: 300 m/m; core diameter: 12.5 m/m; wire diameter: 0.20 m/m), the above-obtained dispersion was applied to the electroconductive side-surface of a transparent electroconductive glass (manufactured and sold by Nippon Sheet Glass Co., Ltd., Japan) wherein a layer of fluorine-doped tin oxide (FTO, resistance of sheet: about 8Ω/□) was provided on a glass substrate, followed by air-drying at room temperature for 1 hour, thereby forming an n-type semiconductor membrane on the transparent electroconductive glass. The transparent electroconductive glass having carried thereon the semiconductor membrane obtained above was sintered at 500° C. for about 30 minutes using an electric furnace. The resultant, sintered membrane had a thickness of about 1.7 μm.

Subsequently, into dimethyl sulfoxide was charged composite dye Z in an amount such that when composite dye Z was completely dissolved in the dimethyl sulfoxide, the concentration of composite dye Z in the dimethyl sulfoxide became $3.7 \times 10^{-4}$ mol/l, thereby obtaining a mixture in which a part of composite dye Z was dissolved in dimethyl sulfoxide. The obtained mixture was refluxed under heating for about 45 minutes together with the semiconductor membrane above, thereby obtaining a photoelectric conversion element in which composite dye Z was carried (adsorbed) on the semiconductor membrane. The obtained photoelectric conversion element was in the form of an electrode (i.e., photoelectric conversion electrode) comprising the photoelectric conversion element and the transparent electroconductive substrate. Then, the electrode was roughly washed with acetonitrile. The amount of composite dye Z carried on the semiconductor membrane was $0.90 \times 10^{-8}$ mol/cm$^2$. Even when the electrode was washed with dimethyl sulfoxide as a solvent for composite dye Z, composite dye Z carried on the semiconductor membrane was not detached from the semiconductor. The electrode was analyzed by IR. As a result, it was confirmed that composite dye Z was chemically bonded to the n-type semiconductor.

(3) Preparation of a Dye-Sensitized Solar Battery and Evaluations thereof

A platinum membrane having a thickness of about 0.1 μm was formed on a slide glass by a sputtering method, thereby obtaining a platinum electrode comprising a slide glass and a platinum membrane. The obtained platinum electrode was used as a counter electrode. On the other hand, an electrolytic solution was prepared as follows. To methoxypropionitrile as a solvent were added iodine (reagent; manufactured and sold by Wako Pure Chemical Industries, Ltd., Japan), lithium iodide (reagent; manufactured and sold by Wako Pure Chemical Industries, Ltd., Japan), dimethylpropyl imidazolium iodide (DMPII; manufactured and sold by SOLARONIX, Switzerland) and tert-butyl pyridine (reagent; manufactured and sold by Tokyo Kasei Kogyo Co., Ltd., Japan) (wherein iodine, lithium iodide and dimethylpropyl imidazolium iodide were used as electrolytes and tert-butyl pyridine was used as an additive), thereby preparing an electrolytic solution. The concentrations of iodine, lithium iodide, dimethylpropyl imidazolium iodide and tert-butyl pyridine in the electrolytic solution were 0.05 mol/l, 0.1 mol/l, 0.6 mol/l and 0.5 mol/l, respectively.

The thus prepared electrolytic solution was dropwise applied to the photoelectric conversion electrode, and the photoelectric conversion electrode, the counter electrode and the electrolytic solution were so arranged that the electrolytic solution was sandwiched between the platinum surface of the counter electrode and the photoelectric conversion element, thereby preparing a dye-sensitized solar battery (a sandwich type).

(Evaluation of Photoelectric Conversion Properties)

The prepared dye-sensitized solar battery was connected to a measuring instrument, and photoelectric conversion properties of the solar battery were measured while irradiating the solar battery with a quasi sunray having a light intensity of about 100 mW/cm$^2$. As a result, it was confirmed that the electric current per molar amount of the dye adsorbed was $2.2 \times 10^8$ mA/mol. When a part of the sunray was shut out by using a UV cut filter (L41 Super PRO WIDE; manufactured and sold by Kenko Co., Ltd., Japan), the electric current per molar amount of the dye adsorbed was $1.3 \times 10^8$ mA/mol. These data were compared with the data obtained in Comparative Example 1 mentioned below. As a result, it was confirmed that about 30% of the electric current was obtained from a portion derived from component dye B and, hence, the transfer of electrons occurred between the two photoabsorption portions forming composite dye Z (multinuclear complex).

Example 2

(1) Synthesis of a Component Dye (Synthesis of a Bridging Ligand)

1 g of 1,10-phenanthroline-5,6-dione (reagent; manufactured and sold by Sigma-Aldrich Co., U.S.A.) and 0.691 g of dithioxamide (reagent; manufactured and sold by Tokyo Kasei Kogyo Co., Ltd., Japan) were added to 40 ml of ethanol, and the resultant mixture was refluxed under heating in an atmosphere of air for 13 hours. The resultant reaction mixture was allowed to cool to room temperature, and subjected to a suction filtration using a filter paper (pore diameter: 1 μm), thereby obtaining powders. For removing substances remaining unreacted in the obtained powders, the powders were washed with 100 ml of chloroform at room temperature while stirring, followed by a suction filtration using a filter paper (pore diameter: 1 μm), thereby obtaining 0.759 g of 5,6-dihydroxy-1,10-phenanthroline in the form of powders.

(Synthesis of Multinuclear Complex Precursor C (Bonding of a Bridging Ligand to the First Photoabsorption Portion))

0.111 g of (cis-dichloro-bis(2,2'-bipyridyl-4,4'-dicarboxylate)rurthenium(II) (manufactured and sold by Kojima Chemicals Co., LTD., Japan) (which was used as a precursor for the first photoabsorption portion), 0.04 g of the above-synthesized 5,6-dihydroxy-1,10-phenanthroline and 0.055 g of potassium hydroxide (reagent; manufactured and sold by Wako Pure Chemical Industries, Ltd., Japan) were added to a mixed solvent comprised of 14 ml of dimethylformamide and 7 ml of purified water. Then, the resultant mixture was refluxed under heating in an atmosphere of nitrogen for 3 hours. The resultant mixture was allowed to cool to room temperature, and dried using a rotary evaporator, thereby obtaining a solid having a brown color.

Figure 12:
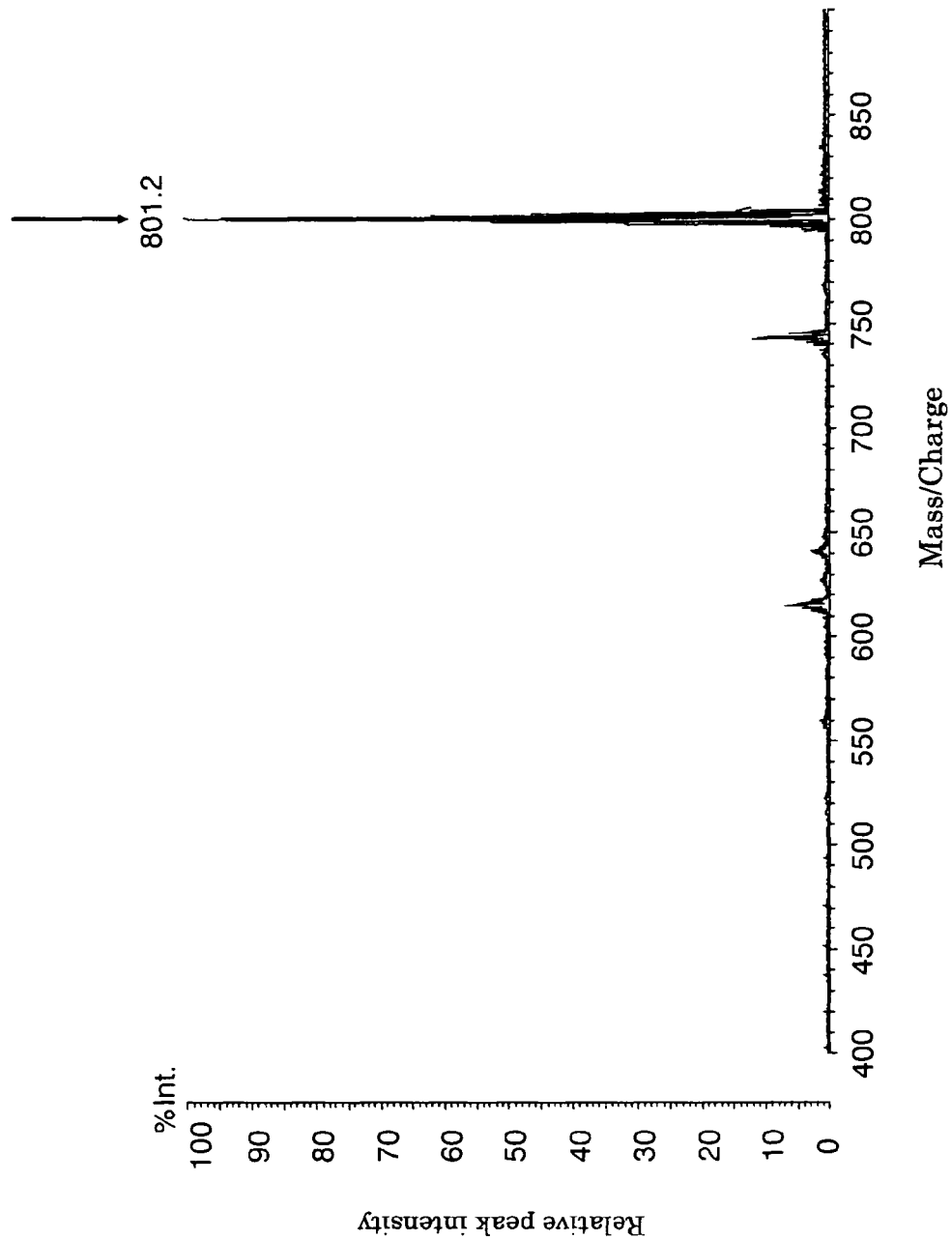
FIG. 12 shows the results of the measurement by matrix-assisted desorption ionization/time-of-flight mass spectrometry (MALDI-TOF-MS) performed with respect to the complex dye precursor produced in Example 2.
Figure 13:
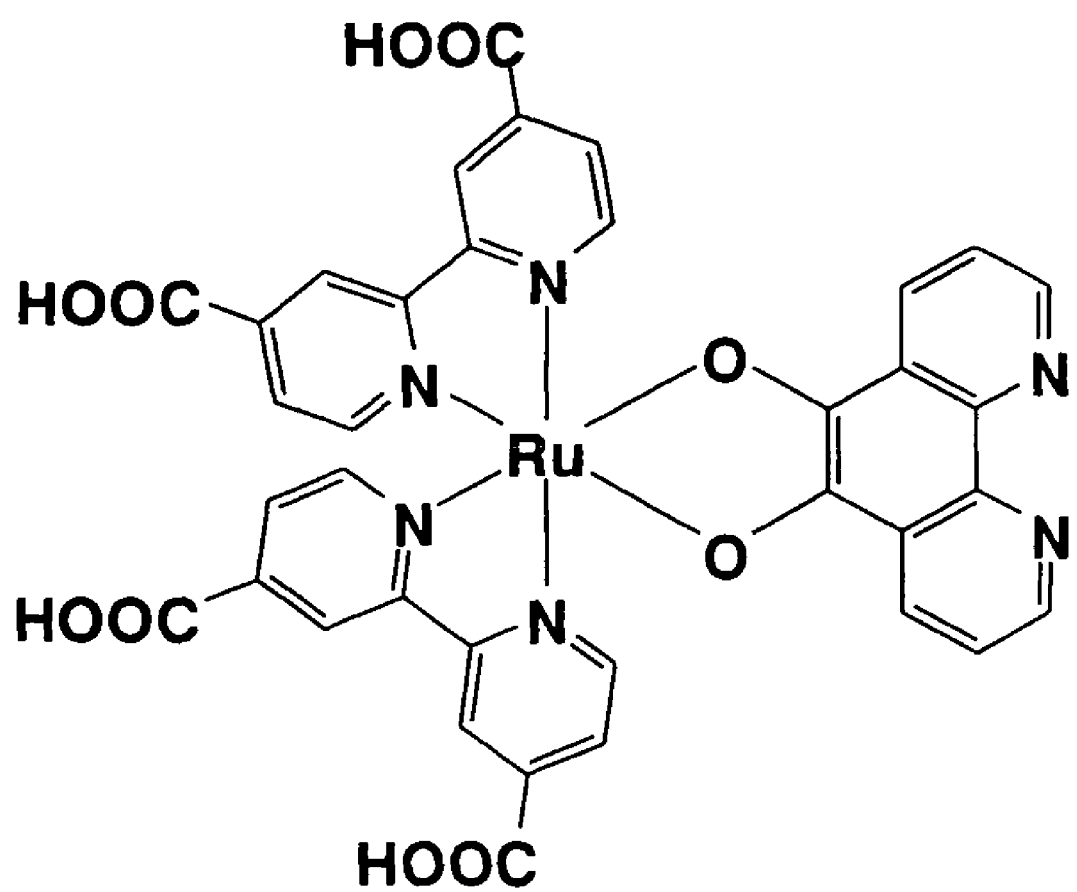
FIG. 13 shows the representative structure of the composite dye precursor produced in Example 2.

The obtained solid was dissolved in 8 ml of purified water, followed by addition of 3 ml of 0.1 N hydrochloric acid, thereby obtaining a liquid having deposited therein powders having a dark brown color. The liquid containing the powders was subjected to a centrifugation using a centrifugal separator at 12,000 r/m for 5 minutes, thereby recovering powders. The recovered powders were washed with 20 ml of ethanol, followed by vacuum drying, thereby obtaining purified powders. The obtained purified powders were analyzed by infrared spectrophotometry, ultraviolet-visible spectrophotometry, and matrix-assisted laser desorption ionization/time-of-flight mass spectrometry (MALDI-TOF-MS) using α-cyano-4-hydroxycynnamic acid as a matrix. As a result, it was confirmed that the powders were a multinuclear complex precursor comprised of (bis(2,2'-bipyridyl-4,4'-dicarboxylate)-(1,10-phenanthroline-5,6-diolate))rurthenium(II), wherein a part of the carboxylic acid portions thereof might be converted to a potassium-containing group represented by the formula: COOK (hereinafter, this multinuclear complex precursor is referred to as "multinuclear complex precursor C"). The results of the MALDI-TOF-MS analysis are shown in FIG. 12. The chart in FIG. 12 contains a peak appearing at 801 m/z and ascribed to a compound having the desired molecular weight, together with a peak ascribed to a compound produced by a decomposition (such as ionization) of the compound having the molecular weight of the desired compound during the measurement, a peak ascribed to a compound produced by addition of the above-mentioned matrix to the compound produced by the decomposition, and a peak appearing near the peak ascribed to the compound having the molecular weight of the desired compound, wherein the peak appearing near the peak ascribed to the desired compound was ascribed to a compound in which at least one of the atoms constituting the desired compound was replaced by an isotope thereof. In FIG. 12, the ordinate shows the percentage of intensity of a peak, based on the highest peak intensity observed in the measurement which was performed in the range shown in FIG. 12 (the percentage is referred to as the "relative peak intensity"). The representative structure of multinuclear complex precursor C is shown in FIG. 13. As shown in FIG. 13, multinuclear complex precursor C had a structure comprising: bipyridyl rings (corresponding to $L_0$ in formula (1) above) each having carboxyl groups as a binding functional group (wherein a part of the carboxyl groups may be converted to a potassium-containing group represented by the formula: COOK); a ruthenium atom (corresponding to $M_0$ in formula (1)) coordinated to the bipyridyl rings; and a bridging ligand (corresponding to BL in formula (1)) comprised of a heterocyclic segment and a non-heterocyclic segment, wherein the bridging ligand was coordinated to the ruthenium atom through the non-heterocyclic segment.

(Synthesis of Composite Dye Y)

0.05 g of multinuclear complex precursor C was added to 200 ml of a mixed solvent comprised of 100 ml of ethanol (which had been subjected to nitrogen bubbling) and 100 ml of purified water, followed by stirring under heating, thereby obtaining a solution. Separately, 0.029 g of (cis-dichloro-bis(2,2'-bipyridyl))rurthenium(II) dihydrate (reagent; manufactured and sold by Sigma-Aldrich Co., U.S.A.) as a precursor for the second photoabsorption portion was added to 200 ml of a mixed solvent comprised of 100 ml of ethanol (which had been subjected to nitrogen bubbling) and 100 ml of purified water, followed by stirring at room temperature, thereby obtaining another solution. The thus obtained two types of solutions were mixed together. The resultant mixture was refluxed under heating in an atmosphere of nitrogen for 1 hour. The resultant mixture was allowed to cool to room temperature, and subjected to a filtration using a filter paper (pore diameter: 5 μm). The resultant filtrate was dried using a rotary evaporator, thereby obtaining powders having a brown color.

Figure 14:
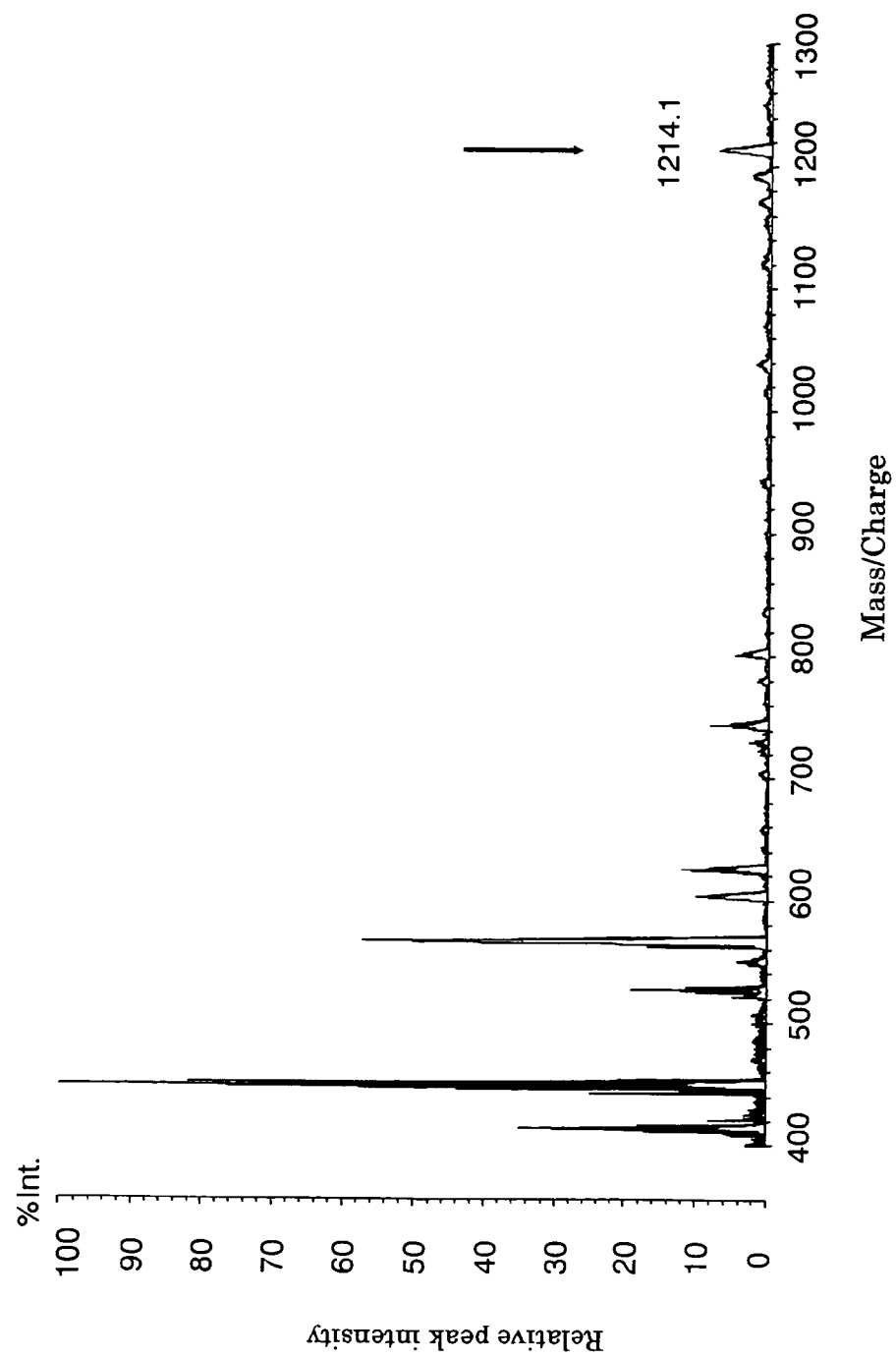
FIG. 14 shows the results of the measurement by matrix-assisted desorption ionization/time-of-flight mass spectrometry (MALDI-TOF-MS) performed with respect to the complex dye produced in Example 2.

The brown powders were analyzed by infrared spectrophotometry (IR), ultraviolet-visible spectrophotometry (UV-vis) and matrix-assisted laser desorption ionization/time-of-flight mass spectrometry (MALDI-TOF-MS). As a result of the IR, it was confirmed that 2,2'-bipyridyl-4,4'-dicarboxylic acid and a potassium salt thereof, 1,10-phenanthroline-5,6-diolate, and 2,2'-bipyridyl were present, and that the bonding between ruthenium and the diolate portion of 1,10-phenanthroline-5,6-diolate was present. In addition, the results of the ultraviolet-visible spectrophotometry performed with respect to the brown powders were compared with the results of the ultraviolet-visible spectrophotometry which had been separately performed with respect to multinuclear complex precursor C and the results of the ultraviolet-visible spectrophotometry which had been separately performed with respect to the (cis-dichloro-bis(2,2'-bipyridyl))rurthenium(II) dihydrate. As a result, it was confirmed that the brown powders were a multinuclear complex dye (i.e., a composite dye) obtained by bonding multinuclear complex precursor C and (cis-dichloro-bis(2,2'-bipyridyl))rurthenium(II) dehydrate, and that the absorbances ascribed to multinuclear complex precursor C and (cis-dichloro-bis(2,2'-bipyridyl))rurthenium(II) dihydrate were observed in different wavelength ranges in the chart showing the spectra of the brown powders. Further, by MALDI-TOF-MS analysis using 2,5-dihydroxy benzoic acid as a matrix, it was confirmed that a compound having the molecular weight of the desired compound was present. The results of the MALDI-TOF-MS analysis are shown in FIG. 14. The chart in FIG. 14 contains a peak appearing at 1,214 m/z and ascribed to a compound having the desired molecular weight, together with a peak ascribed to a compound produced by a decomposition (such as ionization) of the compound having the molecular weight of the desired compound during the measurement, a peak ascribed to a compound produced by addition of the above-mentioned matrix to the compound produced by the decomposition, and a peak appearing near the peak ascribed to the compound having the molecular weight of the desired compound, wherein the peak appearing near the peak ascribed to the desired compound was ascribed to a compound in which at least one of the atoms constituting the desired compound was replaced by an isotope thereof. In FIG. 14, the ordinate shows the percentage of intensity of a peak, based on the highest peak intensity observed in the measurement which was performed in the range shown in FIG. 14 (the percentage is referred to as the "relative peak intensity"). From the above, it was confirmed that the powders were a chloride salt of a multinuclear complex containing two ruthenium atoms (i.e., (bis(2,2'-bipyridyl-4,4'-dicarboxylate)-(1,10-phenanthroline-5,6-diolate))rurthenium(II)-(bis-(2,2'-bipyridyl))rurthenium(II)).

Figure 15:
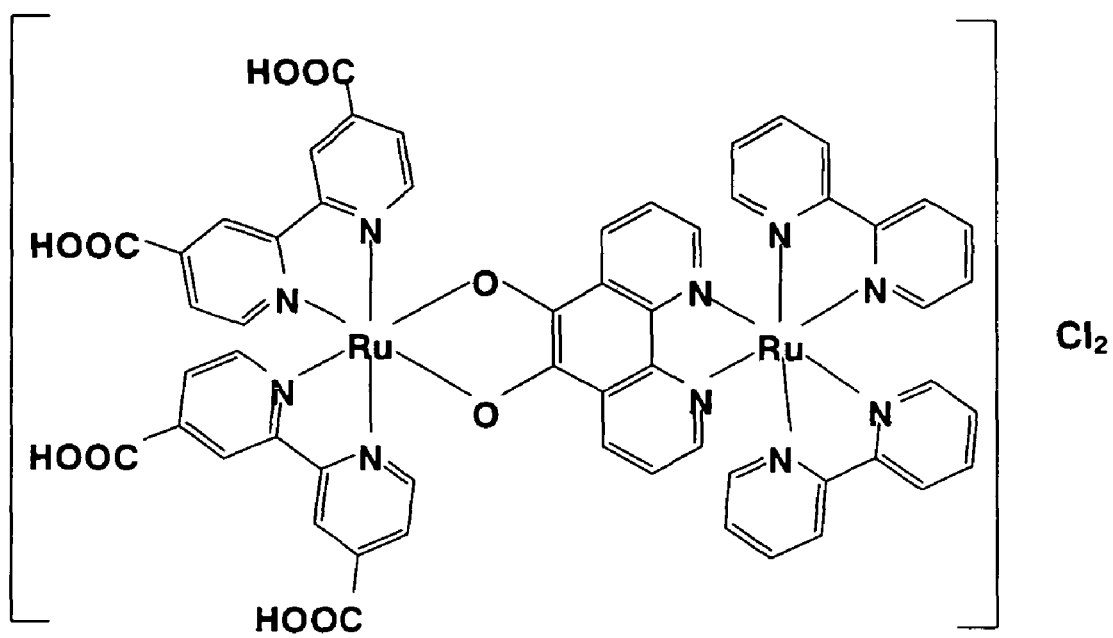
FIG. 15 shows the representative structure of the composite dye produced in Example 2.

Specifically, the multinuclear complex had a structure in which the chloride ions of (cis-dichloro-bis(2,2'-bipyridyl))rurthenium(II) dehydrate are replaced by 1,10-phenanthroline-5,6-diolate (which is derived from multinuclear complex precursor C), so that 1,10-phenanthroline-5,6-diolate is coordinated to (cis-dichloro-bis(2,2'-bipyridyl))rurthenium(II) dihydrate through the phenanthroline portion of 1,10-phenanthroline-5,6-diolate (wherein a part of the carboxylic acid portions thereof may be converted to a potassium-containing group represented by formula: COOK) (hereinafter, this multinuclear complex is referred to as "multinuclear complex (composite dye) Y"). The representative structure of the multinuclear complex is shown in FIG. 15. As shown in FIG. 15, composite dye Y had a structure represented by the formula (1) above. Specifically, composite dye Y had a structure comprising: bipyridyl rings (each corresponding to $L_0$ in formula (1)) having carboxyl groups as a binding functional group (wherein a part of the carboxyl groups may be converted to a potassium-containing group represented by the formula: COOK); a first ruthenium atom (corresponding to $M_0$ in formula (1)) coordinated to the bipyridyl groups; 1,10-phenanthroline-5,6-diolate (corresponding to BL in formula (1)) as a bridging ligand comprised of a heterocyclic segment and a non-heterocyclic segment (the diolate portion of 1,10-phenanthroline-5,6-diolate), wherein the bridging ligand was coordinated to the first ruthenium atom through the diolate portion as the non-heterocyclic segment thereof; a second ruthenium atom (corresponding to M in formula (1)) coordinated to the heterocyclic segment of the bridging ligand; and bipyridyl rings (each corresponding to L in formula (1)) as a heterocyclic ring coordinated to the second ruthenium atom. Thus, it was confirmed that the brown powders were a composite dye comprising a plurality of component dyes which were chemically bonded to each other.

0.006 g of multinuclear complex Y was dissolved in 10 ml of acetonitrile to thereby obtain a solution. The obtained solution was subjected to cyclic voltammetry under conditions wherein 0.342 g of tetra-n-butylammonium perchlorate was used as a supporting electrolyte, an electrolytic cell was purged with nitrogen gas, the voltage scanning rate was 20 mV/sec and a platinum electrode was used as a working electrode. As a result, it was found that an oxidation wave derived from ruthenium contained in multinuclear complex precursor C corresponding to the first photoabsorption portion was observed at 0.59 V (relative to the electric potential of the reference electrode) and that an oxidation wave derived from the portion (of (cis-dichloro-bis(2,2'-bipyridyl))rurthenium(II) dihydrate corresponding to the second photoabsorption portion) having chloride ions detached therefrom and bonded to the first photoabsorption portion was observed at 1.1 V (relative to the electric potential of the reference electrode). Thus, it was confirmed that the photoabsorption portion positioned on the side of the n-type semiconductor had a higher excitation level. The determination of the substances from which the oxidation waves were derived was performed, taking into consideration the results of the cyclic voltammetry which was performed with respect to (cis-dichloro-bis(2,2'-bipyridyl-4,4'-dicarboxylate)rurthenium(II) (wherein the cyclic voltammetry was performed in substantially the same manner as mentioned above, except that dimethylformamide was used instead of acetonitrile) and the results of the cyclic voltammetry which was performed with respect to (1,10-phenanthroline-5,6-dione)-(bis(2,2'-bipyridyl))rurthenium (II) (wherein the cyclic voltammetry was performed in the same manner as mentioned above (i.e., in a manner such that acetonitrile was used), or in substantially the same manner as mentioned above, except that dimethylformamide was used instead of acetonitrile). From the above, it was confirmed that composite dye Y had different excitation levels.

(2) Preparation of a Photoelectric Conversion Element, and Preparation and Evaluation of a Dye-Sensitized Solar Battery An n-type semiconductor in the form of a membrane was formed on a transparent electroconductive glass in substantially the same manner as in Example 1, except that the wire diameter of the wire bar was changed to 1.0 m/m (therefore, the preparation of an n-type semiconductor dispersion, the application of the dispersion to the transparent electroconductive glass, the drying of the resultant, and the sintering were performed in the same manner as in Example 1). The thickness of the sintered membrane was about 8 µm. Subsequently, a dye-sensitized solar battery (a sandwich type) was prepared in substantially the same manner as in Example 1, except that dimethyl sulfoxide was changed to ethanol and that composite dye Z was changed to composite dye Y, wherein the amount of composite dye Y was such that when composite dye Y was completely dissolved in ethanol, the concentration of composite dye Y in ethanol became $3.0 \times 10^{-4}$ mol/l. Even when the electrode was washed with ethanol as a solvent for composite dye Y, composite dye Y carried on the semiconductor membrane was not detached from the semiconductor membrane and, hence, it was confirmed that composite dye Y was secured to the n-type semiconductor. The photoelectric conversion properties of the dye-sensitized solar battery were evaluated in substantially the same manner as in Example 1. As a result, it was found that the electric current was 0.48 mA/cm$^2$. The data obtained by the evaluation were compared with the data obtained in Comparative Example 2 mentioned below. As a result, it was confirmed that a part of the electric current was obtained from a portion derived from (cis-dichloro-bis(2,2'-bipyridyl))rurthenium(II) dehydrate, which corresponded to the second photoabsorption portion and was positioned on a side remote from the n-type semiconductor and, hence, the transfer of electrons occurred between the two photoabsorption portions of the multinuclear complex.

Example 3

(1) Production of a Photoelectric Conversion Element

An n-type semiconductor dispersion was prepared in substantially the same manner as in Example 1. The prepared dispersion was applied to the electroconductive side-surface of a transparent electroconductive glass (manufactured and sold by Nippon Sheet Glass Co., Ltd., Japan) in which an FTO layer (2.5 cm×5 cm) was provided on a glass substrate, wherein the application of the dispersion was performed in substantially the same manner as in Example 1, except that the wire diameter of the wire bar was changed to 1.0 m/m. Subsequently, the resultant was subjected to drying and sintering in substantially the same manner as in Example 1, followed by adsorption of multinuclear complex Y in substantially the same manner as in Example 2, to thereby obtain a photoelectric conversion electrode (photoelectric conversion element).

(2) Preparation of an Electrolytic Solution and Photoelectrochemical Measurement Tetra-n-butylammonium chloride (reagent; manufactured and sold by Tokyo Kasei Kogyo Co., Ltd., Japan) as an electrolyte was dissolved in acetonitrile in a concentration of 0.1 mol/l, thereby obtaining an electrolytic solution. The above-obtained photoelectric conversion electrode as a working electrode and a platinum wire as a counter electrode were immersed in the electrolytic solution, thereby obtaining an immersion type solar battery. With respect to the obtained immersion type solar battery, the photoelectric conversion properties thereof were measured by the two-electrode type photoelectrochemical method and the three-electrode type photoelectrochemical method under conditions wherein the voltage applied to the source of light was 12 V and the voltage scanning rate was 20 mV/sec. As a result, generation of electric current by the light ray irradiation was observed. It was found that the voltage generated by the light ray irradiation was 1.2 V and that the counter electrode exhibited a potential of +0.1 V, relative to the potential of the reference electrode.

Example 4

(1) Synthesis of an Electrolyte 3.59 g of cobalt(II) chloride hexahydrate and 5.01 g of tetraethylammonium chloride (both manufactured and sold by Wako Pure Chemical Industries, Ltd., Japan) were individually dissolved in 15 ml of ethanol which had been dehydrated using a molecular sieve, thereby obtaining two ethanol solutions. The obtained two ethanol solutions were mixed together, and the resultant mixture was refluxed under heating for about 10 minutes to effect a reaction. The resultant reaction mixture was allowed to cool to room temperature to thereby deposit powders having a blue color. The reaction mixture was subjected to filtration to recover the blue powders, followed by drying, thereby obtaining dried powders. The dried powders obtained were analyzed by IR and XRF. As a result, it was confirmed that the dried powders were tetrachlorocobalt(II)-bis(tetraethylammonium) $((Et_4N)_2[CoCl_4])$.

(2) Production of a Photoelectric Conversion Electrode, Preparation of an Electrolytic Solution, and Photoelectrochemical Measurement The production of a photoelectric conversion electrode, the preparation of an electrolytic solution, and the photoelectrochemcial measurement were performed in substantially the same manner as in Example 3, except that the electrolytic solution was changed to a 0.05 mol/l acetonitrile solution of the above-obtained tetrachlorocobalt(II)-bis(tetraethylammonium). As a result, generation of electric current by the light ray irradiation was observed. It was found that the voltage generated by the light ray irradiation was 0.8 V and that the counter electrode exhibited a potential of 0 V, relative to the potential of the reference electrode.

Example 5

The production of a photoelectric conversion electrode was performed in substantially the same manner as in Example 4, except that, instead of composite dye Y, composite dye Z produced in Example 1 was added to and partially dissolved in dimethyl sulfoxide (wherein the amount of composite dye Z was such that when composite dye Z was completely dissolved in the dimethyl sulfoxide, the concentration of composite dye Z in the resultant solution became $3.0 \times 10^{-4}$ mol/l) and the resultant mixture was refluxed under heating for about 1 hour together with the semiconductor membrane, thereby obtaining a photoelectric conversion electrode. On the other hand, the preparation of an electrolytic solution and the photoelectrochemical measurement were performed in substantially the same manner as in Example 4, except that, in the preparation of the electrolytic solution, nitrosonium boron tetrafluoride (reagent; manufactured and sold by Sigma-Aldrich Corporation, U.S.A.) was further used in an amount such that the concentration of nitrosonium boron tetrafluoride in the electrolytic solution was 0.5 mmol/l. As a result, generation of electric current by the light ray irradiation was observed. It was found that the voltage generated by the light ray irradiation was 0.8 V and that the counter electrode exhibited a potential of +0.4 V, relative to the potential of the reference electrode.

Example 6

(1) Synthesis of an Electrolyte 0.6 g of potassium hexachlororhenate(IV) (reagent; manufactured and sold by Wako Pure Chemical Industries Ltd., Japan) was dissolved in 50 ml of 0.1 N hydrochloric acid. To the resultant solution was added 6.54 g of a 10% by weight aqueous solution of tetra-n-butylammonium hydroxide (reagent; manufactured and sold by Tokyo Kasei Kogyo Co., Ltd., Japan) while stirring, thereby effecting a reaction to form a precipitate. The precipitate was recovered by filtration, followed by washing with a purified water and drying, thereby obtaining a dried precipitate. The dried precipitate obtained was analyzed by IR and XRF. As a result, it was confirmed that the dried precipitate was tetra-n-butylammonium hexachlororhenate(IV) $((n-Bu_4N)_2[ReCl_6])$.

(2) Production of a Photoelectric Conversion Electrode, Preparation of an Electrolytic Solution, and Photoelectrochemical Measurement An electrolytic solution was prepared in substantially the same manner as in Example 3, except that, as the electrolytic solution, there was used a 0.01 mol/l acetonitrile solution of the above-obtained tetra-n-butylammonium hexachlororhenate(IV), wherein the solution further contained, as an additive, nitrosonium boron tetrafluoride (reagent; manufactured and sold by Sigma-Aldrich Corporation, U.S.A.) in a concentration of 0.2 mmol/l. On the other hand, a photoelectric conversion electrode was produced in substantially the same manner as in Example 3, except that a titanium oxide layer having a thickness of about 0.2 µm was formed on the FTO layer of the transparent electroconductive glass used in Example 3 by a sputtering method using a titanium oxide target and the n-type semiconductor was applied to the titanium oxide layer. Further, the photoelectrochemical measurement was performed under conditions wherein a UV filter (trade name: L42; manufactured and sold by Kenko Co., Ltd., Japan) was provided between the source of light and the working electrode (i.e., photoelectric conversion electrode). As a result, generation of electric current by the light ray irradiation was observed. It was found that the voltage generated by the light ray irradiation was 1.1 V and that the counter electrode exhibited a potential of +0.7 V, relative to the potential of the reference electrode.

Example 7

A photoelectric conversion electrode (hereinafter referred to as "photoelectric conversion electrode S") was produced in substantially the same manner as in Example 3. Another photoelectric conversion electrode (hereinafter referred to as "photoelectric conversion electrode T") was produced in substantially the same manner as in Example 3, except that, instead of composite dye Y, cis-bis(isothiocyanato)bis(2,2'-bipyridyl-4,4'-dicarboxylato)-ruthenium(II) bis-tetrabutylammonium (trade name: Ruthehium 535-bis TBA; manufactured and sold by Solaronix SA, Switzerland) was used as a composite dye.

Figure 16:
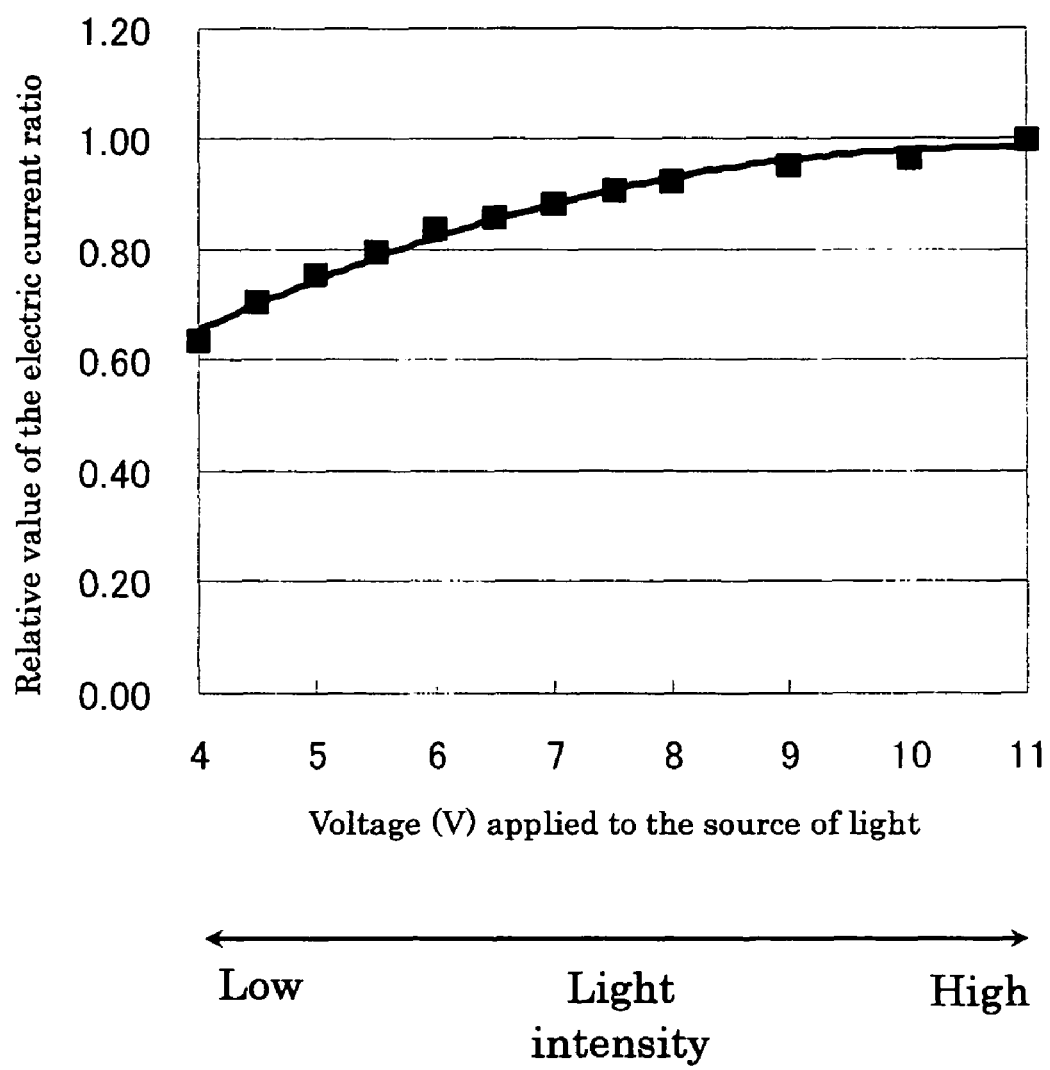
FIG. 16 shows the results of the measurement, performed in Example 7, of the change (with the change of the intensity of light ray) in the ratio of the electric current generated in a dye-sensitized solar battery containing a composite dye (wherein the electric current is generated by irradiating the solar battery with the light ray) to the electric current generated in a dye-sensitized solar battery containing a single dye (wherein the electric current is generated by irradiating the solar battery with the light ray)

Subsequently, an electrolytic solution was prepared by dissolving lithium iodide (reagent; manufactured and sold by Wako Pure Chemical Industries Ltd., Japan) as an electrolyte in acetonitrile in a concentration of 0.1 mol/l (two batches of the solution were prepared). The above-obtained photoelectric conversion electrodes S and T were respectively immersed in the two batches of the solution prepared above, thereby obtaining two types of immersion type solar batteries. With respect to each of the immersion type solar batteries, the electric currents obtained by the solar battery were measured by the three-electrode type photoelectrochemical method under conditions wherein an electric potential of –0.2 V was applied to the working electrode (i.e., photoelectric conversion electrode) and the light ray irradiation of the solar battery was performed while increasing the voltage applied to the source of light from 4 V to 11 V so as to vary the intensity of light, wherein the applied voltage was increased at first by 0.5 V from 4 V to 8 V, then by 1 V from 8 V to 11 V. Then, the ratios of the electric current obtained by the solar battery using photoelectric conversion electrode S to the electric current obtained by the solar battery using photoelectric conversion electrode T (wherein the electric currents were generated by the light ray irradiation of the solar batteries when the voltages applied to the source of light were the above-mentioned values) were calculated. As a result, the following ratios were obtained, wherein the ratios are expressed in terms of relative values such that the relative value was 1 when the voltage applied to the source of light was 11 V (i.e., when the intensity of light was high) and arranged in the order of voltage increase from 4 V (wherein the intensity of light is low): 0.64, 0.71, 0.75, 0.80, 0.84, 0.86, 0.88, 0.91, 0.93, 0.95, 0.97 and 1. These results are shown in FIG. 16. Specifically, in FIG. 16, the abscissa shows the voltages applied to the source of light, and the ordinate shows the above-mentioned relative values such that the relative value was 1 when the voltage applied to the source of light was 11 V (this relative value is hereinafter referred to as "relative value of the electric current ratio"). It was observed that the electric current was small when the irradiated light had a low intensity. Such a phenomenon is characteristic to the two-photon absorption process, which is apparent from the comparison between the results of this Example 7 and the below-mentioned Reference Example 1.

Example 8

Figure 17:
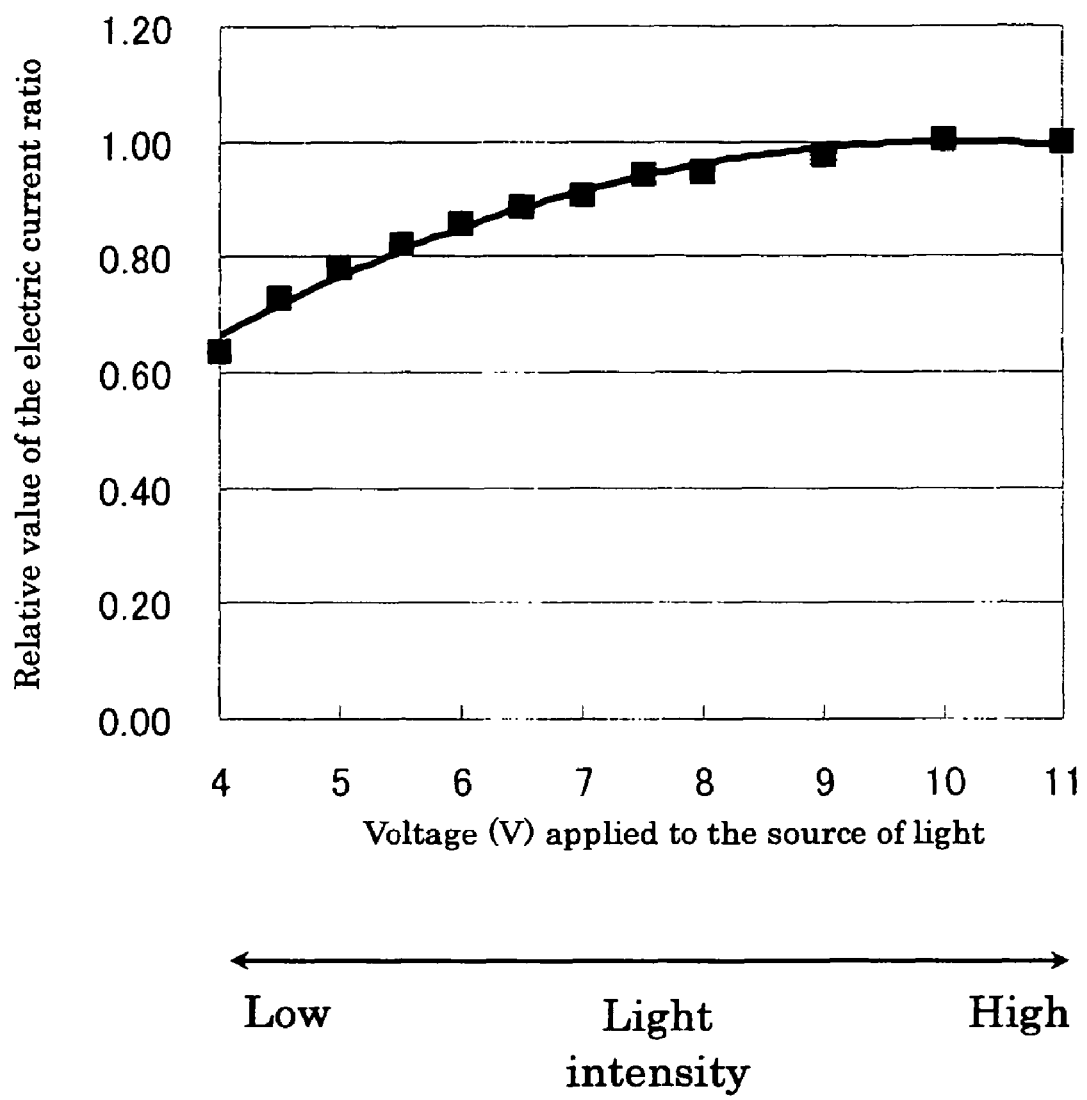
FIG. 17 shows the results of the measurement, performed in Example 8, of the change (with the change of the intensity of light ray) in the ratio of the electric current generated in a dye-sensitized solar battery containing a composite dye (wherein the electric current is generated by irradiating the solar battery with the light ray) to the electric current generated in a dye-sensitized solar battery containing a single dye (wherein the electric current is generated by irradiating the solar battery with the light ray)

The production of photoelectric conversion electrodes, and the preparation of an electrolytic solution were performed in substantially the same manner as in Example 7, except that, in the production of photoelectric conversion electrode T, instead of composite dye Y, composite dye Z produced in Example 1 was added to and partially dissolved in dimethyl sulfoxide (wherein the amount of composite dye Z was such that when composite dye Z was completely dissolved in the dimethyl sulfoxide, the concentration of composite dye Z in the resultant solution became $3.0 \times 10^{-4}$ mol/l) and the resultant mixture was refluxed under heating for about 1 hour together with the semiconductor membrane, thereby obtaining a photoelectric conversion electrode (this photoelectric conversion electrode is hereinafter referred to as "photoelectric conversion electrode U"). The ratios of the electric current obtained by the immersion type solar battery using photoelectric conversion electrode U to the electric current obtained by the immersion type solar battery using photoelectric conversion electrode T were measured by the three-electrode type photoelectrochemical method in substantially the same manner as in Example 7. As a result, the following ratios were obtained, wherein the ratios are expressed in terms of relative values such that the relative value was 1 when the voltage applied to the source of light was 11 V (i.e., when the intensity of light was high) and arranged in the order of voltage increase from 4 V (wherein the intensity of light is low): 0.64, 0.73, 0.78, 0.82, 0.86, 0.89, 0.91, 0.94, 0.95, 0.97, 1.00 and 1. These results are shown in FIG. 17. Specifically, in FIG. 17, the abscissa shows the voltages applied to the source of light, and the ordinate shows the above-mentioned relative values such that the relative value was 1 when the voltage applied to the source of light was 11 V (this relative value is hereinafter referred to as "relative value of the electric current ratio").

Comparative Example 1

A dye-sensitized solar battery (a sandwich type solar battery) was produced in substantially the same manner as in Example 1, except that, in the production of a photoelectric conversion electrode, instead of composite dye Z, an ethanol solution of a photosensitizer comprised of cis-bis(isothiocyanato)bis(2,2'-bipyridyl-4,4'-dicarboxylato)-ruthenium(II) bis-tetrabutylammonium (trade name: Ruthehium 535-bis TBA; manufactured and sold by Solaronix SA, Switzerland) (wherein the concentration of the sensitizer was $3 \times 10^{-4}$ mol/l) was used as a dye. The amount of the above-mentioned photosensitizer (i.e., dye) adsorbed was $3.2 \times 10^{-8}$ mol/cm$^2$.

With respect to the above-mentioned solar battery, the photoelectric conversion properties thereof were measured in substantially the same manner as in Example 1. As a result, it was found that the amount of electric current per molar amount of the dye adsorbed was $1.2 \times 10^8$ mA/mol. It was also found that, when a UV filter was provided between the source of light and the working electrode (i.e., photoelectric conversion electrode), the electric current per molar amount of the dye adsorbed was $1.0 \times 10^8$ mA/mol.

Comparative Example 2

A dye-sensitized solar battery (a sandwich type solar battery) was produced in substantially the same manner as in Example 2, except that, in the production of a photoelectric conversion electrode, instead of composite dye Y, multinuclear complex precursor C was used as a dye. With respect to the above-mentioned solar battery, the photoelectric conversion properties thereof were measured in substantially the same manner as in Example 2. As a result, it was found that the short-circuit current ($I_{sc}$) was 0.12 mA/cm$^2$. Further, the amount of the dye adsorbed was measured by a method in which the dye (i.e., multinuclear complex precursor C) is separated from the semiconductor using a 0.1 mol/l aqueous solution of KOH. As a result, it was found that the amount of the dye adsorbed was 75 mol % per unit area, based on the molar amount of composite dye Y adsorbed in Example 2.

Comparative Example 3

The production of a photoelectric conversion electrode, the preparation of an electrolytic solution, and the photoelectrochemical measurement were performed in substantially the same manner as in Example 3, except that, in the production of the photoelectric conversion electrode, instead of composite dye Y, a complex dye comprised of cis-bis(isothiocyanato) bis(2,2'-bipyridyl-4,4'-dicarboxylato)-ruthenium(II) bis-tetrabutylammonium (trade name: Ruthehium 535-bis TBA; manufactured and sold by Solaronix SA, Switzerland) was used as a dye, and that the electrolytic solution was prepared using lithium iodide as an electrolyte (reagent; manufactured and sold by Wako Pure Chemical Industries, Ltd., Japan). As a result, generation of electric current by the light ray irradiation was observed. It was found that the voltage generated by the light ray irradiation was 0.7 V and that the counter electrode exhibited a potential of –0.3 V, relative to the potential of the reference electrode.

Comparative Example 4

The production of a photoelectric conversion electrode, the preparation of an electrolytic solution, and the photoelectrochemcial measurement were performed in substantially the same manner as in Example 6, except that, in the production of the photoelectric conversion electrode, instead of composite dye Y, a complex dye comprised of cis-bis(isothiocyanato) bis(2,2'-bipyridyl-4,4'-dicarboxylato)-ruthenium(II) bis-tetrabutylammonium (trade name: Ruthehium 535-bis TBA; manufactured and sold by Solaronix SA, Switzerland) was used as a dye. As a result, it was found that generation of electric current by the light ray irradiation was not observed.

Reference Example 1

Figure 18:
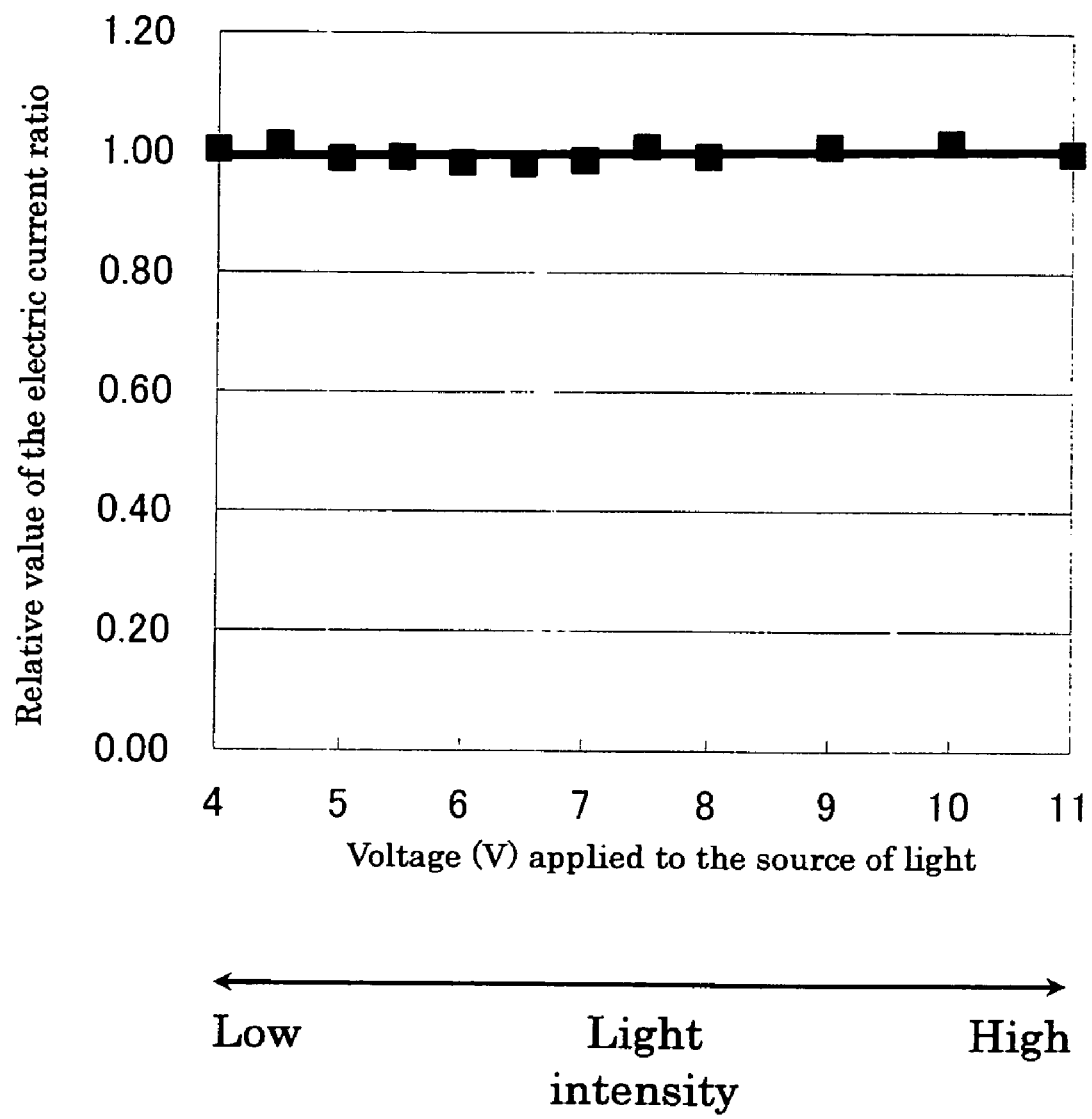
FIG. 18 shows the results of the measurement, performed in Reference Example 1, of the change (with the change of the intensity of light ray) in the ratio of the electric current generated in a dye-sensitized solar battery containing a single dye (wherein the electric current is generated by irradiating the solar battery with the light ray) to the electric current generated in a dye-sensitized solar battery containing another single dye (wherein the electric current is generated by irradiating the solar battery with the light ray).

Two of photoelectric conversion electrode T produced in Example 7 were provided (these electrodes are hereinafter referred to as "photoelectric conversion electrode T1" and "photoelectric conversion electrode T2", respectively). The ratios of the electric current obtained by the immersion type solar battery using photoelectric conversion electrode T1 to the electric current obtained by the immersion type solar battery using photoelectric conversion electrode T2 were measured by the three-electrode type photoelectrochemical method in substantially the same manner as in Example 7. As a result, the following ratios were obtained, wherein the ratios are expressed in terms of relative values such that the relative value was 1 when the voltage applied to the source of light was 11 V (i.e., when the intensity of light was high) and arranged in the order of voltage increase from 4 V (wherein the intensity of light is low): 1.00, 1.01, 0.99, 0.99, 0.98, 0.98, 0.99, 1.01, 0.99, 1.01, 1.02 and 1. These results are shown in FIG. 18. Specifically, in FIG. 18, the abscissa shows the voltages applied to the source of light, and the ordinate shows the above-mentioned relative values such that the relative value was 1 when the voltage applied to the source of light was 11 V (the relative value is hereinafter referred to as "relative value of the electric current ratio").

INDUSTRIAL APPLICABILITY

The photoelectric conversion element of the present invention exhibits excellent photoelectric conversion properties, especially high efficiency in converting solar energy to electric energy (i.e., high energy conversion efficiency), and a dye-sensitized solar battery can be easily produced therefrom. Therefore, the photoelectric conversion element of the present invention can be advantageously used for a dye-sensitized solar battery and the like.

The invention claimed is:

1. A photoelectric conversion element comprising a composite dye and an n-type semiconductor,
    said composite dye comprising a plurality of component dyes which have different excitation levels and which are chemically bonded to each other to form a straight chain or branched structure for transferring an excited electron therethrough, wherein said straight chain or branched structure is, at one end thereof, secured to said n-type semiconductor and has, at least at one other end thereof, a free end,
    wherein, in said straight chain or branched structure, said plurality of component dyes are arranged in an order such that the excitation levels of said plurality of component dyes are decreased as viewed from said one end of said structure toward said at least one other end of said structure,
    wherein each component dye of said composite dye comprises a metal atom having a ligand coordinated thereto, so that said composite dye is comprised of a multinuclear complex comprising a plurality of metal atoms and a plurality of ligands including at least one bridging ligand, wherein the or each bridging ligand is positioned between mutually adjacent metal atoms in said multinuclear complex to thereby bridge the mutually adjacent metal atoms,
    wherein the or each bridging ligand in said multinuclear complex comprises a heterocyclic segment having a conjugated double bond and, bonded to said heterocyclic segment, a non-heterocyclic segment, to thereby form an asymmetric structure,
    wherein the heterocyclic segment is positioned in the or each bridging ligand on a side thereof remote from said n-type semiconductor as compared to the non-heterocyclic segment, wherein a heteroatom in the heterocyclic segment is positioned on a side thereof remote from said n-type semiconductor.

2. A dye-sensitized solar battery comprising:
    an electrode comprised of the photoelectric conversion element of claim 1, a counter electrode, and an electrolyte interposed between said photoelectric conversion element and said counter electrode, wherein said dye-sensitized solar battery becomes operable when said electrode comprised of said photoelectric conversion element and said counter electrode are connected to each other through an electroconductive material which is positioned outside of said electrolyte.

3. The dye-sensitized solar battery according to claim 2, wherein the potential of said counter electrode is −0.2 V or more relative to the redox potential of silver/silver ion.

4. A photoelectric conversion element comprising a composite dye and an n-type semiconductor, said composite dye comprising a plurality of component dyes which have different excitation levels and which are chemically bonded to each other to form a straight chain or branched structure for transferring an excited electron therethrough, wherein said straight chain or branched structure is, at one end thereof, secured to said n-type semiconductor and has, at least at one other end thereof, a free end, wherein, in said straight chain or branched structure, said plurality of component dyes are arranged in an order such that the excitation levels of said plurality of component dyes are decreased as viewed from said one end of said structure toward said at least one other end of said structure, wherein each component dye of said composite dye comprises a metal atom having a ligand coordinated thereto, so that said composite dye is comprised of a multinuclear complex comprising a plurality of metal atoms and a plurality of ligands including at least one bridging ligand, wherein the or each bridging ligand is positioned between mutually adjacent metal atoms in said multinuclear complex to thereby bridge the mutually adjacent metal atoms, wherein the or each bridging ligand in said multinuclear complex comprises a heterocyclic segment having a conjugated double bond and, bonded to said heterocyclic segment, a non-heterocyclic segment, to thereby form an asymmetric structure, wherein the heterocyclic segment is positioned in the or each bridging ligand on a side thereof remote from said n-type semiconductor as compared to the non-heterocyclic segment, wherein a heteroatom in the heterocyclic segment is positioned on a side thereof remote from said n-type semiconductor, and wherein, when said multinuclear complex is irradiated with light rays, an electron-deficient state shifts from an electron orbital ascribed to a metal atom having a higher energy level to an electron orbital ascribed to another metal atom having a lower energy level.

5. A photoelectric conversion element comprising a composite dye and an n-type semiconductor, said composite dye comprising a plurality of component dyes which have different excitation levels and which are chemically bonded to each other to form a straight chain or branched structure for transferring an excited electron therethrough, wherein said straight chain or branched structure is, at one end thereof, secured to said n-type semiconductor and has, at least at one other end thereof, a free end, wherein, in said straight chain or branched structure, said plurality of component dyes are arranged in an order such that the excitation levels of said plurality of component dyes are decreased as viewed from said one end of said structure toward said at least one other end of said structure, wherein each component dye of said composite dye comprises a metal atom having a ligand coordinated thereto, so that said composite dye is comprised of a multinuclear complex comprising a plurality of metal atoms and a plurality of ligands including at least one bridging ligand, wherein the or each bridging ligand is positioned between mutually adjacent metal atoms in said multinuclear complex to thereby bridge the mutually adjacent metal atoms, wherein the or each bridging ligand in said multinuclear complex comprises a heterocyclic segment having a conjugated double bond and, bonded to said heterocyclic segment, a non-heterocyclic segment, to thereby form an asymmetric structure, wherein the heterocyclic segment is positioned in the or each bridging ligand on a side thereof remote from said n-type semiconductor as compared to the non-heterocyclic segment, wherein a heteroatom in the heterocyclic segment is positioned on a side thereof remote from said n-type semiconductor, wherein, when said multinuclear complex is irradiated with light rays, an electron-deficient state shifts from an electron orbital ascribed to a metal atom having a higher energy level to an electron orbital ascribed to another metal atom having a lower energy level, wherein said multinuclear complex has a structure represented by the following formula (1):

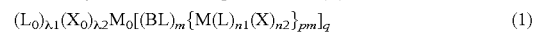

$(L_0)_{\lambda 1}(X_0)_{\lambda 2}M_0[(BL)_m\{M(L)_{n1}(X)_{n2}\}_{pm}]_q$     (1)

wherein each of $L_0$ and L independently represents a ligand having a heterocyclic segment which can be coordinated to a transition metal atom; each of $X_0$ and X independently represents a ligand which does not have a heterocyclic segment; each of $M_0$ and M independently represents a transition metal atom; BL represents a bridging ligand having a plurality of portions, each of which can be coordinated to a transition metal atom; $\lambda 1$ is an integer of from 1 to 7 and $\lambda 2$ is an integer of from 0 to 6, with the proviso that the sum of $\lambda 1$ and $\lambda 2$ is not more than 7; m is an integer of from 1 to 7, with the proviso that the sum of $\lambda 1$, $\lambda 2$ and m is not more than 8; n1 is an integer of from 0 to 6 and n2 is an integer of from 1 to 7, with the proviso that the sum of n1 and n2 is not more than 7; and each of p and q independently represents an integer of 1 or more, wherein when each of $\lambda 1$, $\lambda 2$, m, n1, n2, pm and q is an integer of 2 or more, the plurality of $L_0$ is the same or different, the plurality of $X_0$ is the same or different, the plurality of BL is the same or different, the plurality of M is the same or different, the plurality of L is the same or different, and the plurality of X is the same or different, wherein the heterocyclic segment of the or each bridging ligand BL is a multidentate segment having a dentate number of 2 or more, wherein the or each ligand $L_0$ is a bi- to quadridentate ligand.

* * * * *